(12) United States Patent
Synder et al.

(10) Patent No.: US 8,516,025 B2
(45) Date of Patent: Aug. 20, 2013

(54) CLOCK DRIVEN DYNAMIC DATAPATH CHAINING

(75) Inventors: Warren Synder, Snohomish, WA (US); Bert Sullam, Bellevue, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 1185 days.

(21) Appl. No.: 12/104,391

(22) Filed: Apr. 16, 2008

(65) Prior Publication Data

US 2008/0288755 A1    Nov. 20, 2008

Related U.S. Application Data

(60) Provisional application No. 60/912,399, filed on Apr. 17, 2007.

(51) Int. Cl.
*G06F 7/38* (2006.01)

(52) U.S. Cl.
USPC .......................................................... 708/233

(58) Field of Classification Search
None
See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedorn |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |
| 4,326,135 A | 4/1982 | Jarrett et al. |
| 4,344,067 A | 8/1982 | Lee |
| 4,380,083 A | 4/1983 | Andersson et al. |
| 4,438,404 A | 3/1984 | Philipp |
| 4,454,589 A * | 6/1984 | Miller ........................... 708/233 |
| 4,475,151 A | 10/1984 | Philipp |
| 4,497,575 A | 2/1985 | Philipp |
| 4,608,502 A | 8/1986 | Dijkmans et al. |
| 4,656,603 A | 4/1987 | Dunn |

(Continued)

FOREIGN PATENT DOCUMENTS

| | | |
|---|---|---|
| DE | 19710829 A1 | 9/1998 |
| EP | 0308583 A | 3/1989 |

(Continued)

OTHER PUBLICATIONS

USPTO Advisory Action for U.S. Appl. No. 11/968,145, dated Oct. 6, 2011; 3 pages.

(Continued)

*Primary Examiner* — David H Malzahn

(57) ABSTRACT

A system includes a plurality of datapaths, each having structural arithmetic elements to perform various arithmetic operations based, at least in part, on configuration data. The system also includes a configuration memory coupled to the datapaths, the configuration memory to provide the configuration data to the datapaths, which causes the datapaths to collaborate when performing the arithmetic operations.

17 Claims, 7 Drawing Sheets

(56) References Cited

U.S. PATENT DOCUMENTS

| | | |
|---|---|---|
| 4,670,838 A | 6/1987 | Kawata |
| 4,689,740 A | 8/1987 | Moelands et al. |
| 4,692,718 A | 9/1987 | Roza et al. |
| 4,701,907 A | 10/1987 | Collins |
| 4,727,541 A | 2/1988 | Mori et al. |
| 4,736,097 A | 4/1988 | Philipp |
| 4,740,966 A | 4/1988 | Goad |
| 4,755,766 A | 7/1988 | Metz |
| 4,773,024 A | 9/1988 | Faggin et al. |
| 4,794,558 A | 12/1988 | Thompson |
| 4,802,103 A | 1/1989 | Faggin et al. |
| 4,802,119 A | 1/1989 | Heene et al. |
| 4,809,345 A | 2/1989 | Tabata et al. |
| 4,812,684 A | 3/1989 | Yamagiwa et al. |
| 4,827,401 A | 5/1989 | Hrustich et al. |
| 4,833,418 A | 5/1989 | Quintus et al. |
| 4,868,525 A | 9/1989 | Dias |
| 4,876,534 A | 10/1989 | Mead et al. |
| 4,878,200 A | 10/1989 | Asghar et al. |
| 4,879,461 A | 11/1989 | Philipp |
| 4,885,484 A | 12/1989 | Gray |
| 4,907,121 A | 3/1990 | Hrassky |
| 4,926,355 A | 5/1990 | Boreland |
| 4,935,702 A | 6/1990 | Mead et al. |
| 4,939,637 A | 7/1990 | Pawloski |
| 4,942,540 A | 7/1990 | Black et al. |
| 4,947,169 A | 8/1990 | Smith et al. |
| 4,953,928 A | 9/1990 | Anderson et al. |
| 4,962,342 A | 10/1990 | Mead et al. |
| 4,964,074 A | 10/1990 | Suzuki et al. |
| 4,969,087 A | 11/1990 | Tanagawa et al. |
| 4,970,408 A | 11/1990 | Hanke et al. |
| 4,972,372 A | 11/1990 | Ueno |
| 4,977,381 A | 12/1990 | Main |
| 4,980,652 A | 12/1990 | Tarusawa et al. |
| 4,999,519 A | 3/1991 | Kitsukawa et al. |
| 5,043,674 A | 8/1991 | Bonaccio et al. |
| 5,049,758 A | 9/1991 | Mead et al. |
| 5,050,168 A | 9/1991 | Paterson |
| 5,053,949 A | 10/1991 | Allison et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,088,822 A | 2/1992 | Warren |
| 5,095,284 A | 3/1992 | Mead |
| 5,097,305 A | 3/1992 | Mead et al. |
| 5,107,146 A | 4/1992 | El-Ayat |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,127,103 A | 6/1992 | Hill et al. |
| 5,128,871 A | 7/1992 | Schmitz |
| 5,136,188 A | 8/1992 | Ha et al. |
| 5,140,197 A | 8/1992 | Grider |
| 5,142,247 A | 8/1992 | Lada, Jr. et al. |
| 5,144,582 A | 9/1992 | Steele |
| 5,146,106 A | 9/1992 | Anderson et al. |
| 5,150,079 A | 9/1992 | Williams et al. |
| 5,155,836 A | 10/1992 | Jordan et al. |
| 5,159,292 A | 10/1992 | Canfield et al. |
| 5,159,335 A | 10/1992 | Veneruso |
| 5,160,899 A | 11/1992 | Anderson et al. |
| 5,161,124 A | 11/1992 | Love |
| 5,165,054 A | 11/1992 | Platt et al. |
| 5,166,562 A | 11/1992 | Allen et al. |
| 5,175,884 A | 12/1992 | Suarez |
| 5,179,531 A | 1/1993 | Yamaki |
| 5,198,817 A | 3/1993 | Walden et al. |
| 5,200,751 A | 4/1993 | Smith |
| 5,202,687 A | 4/1993 | Distinti |
| 5,204,549 A | 4/1993 | Platt et al. |
| 5,206,582 A | 4/1993 | Ekstedt et al. |
| 5,220,512 A | 6/1993 | Watkins et al. |
| 5,230,000 A | 7/1993 | Mozingo et al. |
| 5,235,617 A | 8/1993 | Mallard, Jr. |
| 5,241,492 A | 8/1993 | Girardeau, Jr. |
| 5,243,554 A | 9/1993 | Allen et al. |
| 5,245,262 A | 9/1993 | Moody et al. |
| 5,248,843 A | 9/1993 | Billings |
| 5,248,873 A | 9/1993 | Allen et al. |
| 5,258,760 A | 11/1993 | Moody et al. |
| 5,260,592 A | 11/1993 | Mead et al. |
| 5,260,979 A | 11/1993 | Parker et al. |
| 5,270,963 A | 12/1993 | Allen et al. |
| 5,276,407 A | 1/1994 | Mead et al. |
| 5,276,890 A | 1/1994 | Arai |
| 5,280,199 A | 1/1994 | Itakura |
| 5,280,202 A | 1/1994 | Chan et al. |
| 5,289,023 A | 2/1994 | Mead |
| 5,303,329 A | 4/1994 | Mead et al. |
| 5,304,955 A | 4/1994 | Atriss et al. |
| 5,305,017 A | 4/1994 | Gerpheide |
| 5,305,312 A | 4/1994 | Fornek et al. |
| 5,307,381 A | 4/1994 | Ahuja |
| 5,313,618 A | 5/1994 | Pawloski |
| 5,317,202 A | 5/1994 | Waizman |
| 5,319,370 A | 6/1994 | Del Signore et al. |
| 5,319,771 A | 6/1994 | Takeda |
| 5,321,828 A | 6/1994 | Phillips et al. |
| 5,324,958 A | 6/1994 | Mead et al. |
| 5,325,512 A | 6/1994 | Takahashi |
| 5,329,471 A | 7/1994 | Swoboda et al. |
| 5,331,215 A | 7/1994 | Allen et al. |
| 5,331,315 A | 7/1994 | Crosette |
| 5,331,571 A | 7/1994 | Aronoff et al. |
| 5,334,952 A | 8/1994 | Maddy et al. |
| 5,336,936 A | 8/1994 | Allen et al. |
| 5,339,213 A | 8/1994 | O'Callaghan |
| 5,339,262 A | 8/1994 | Rostoker et al. |
| 5,341,267 A | 8/1994 | Whitten et al. |
| 5,345,195 A | 9/1994 | Cordoba et al. |
| 5,349,303 A | 9/1994 | Gerpheide |
| 5,355,097 A | 10/1994 | Scott et al. |
| 5,357,626 A | 10/1994 | Johnson et al. |
| 5,361,290 A | 11/1994 | Akiyama |
| 5,371,524 A | 12/1994 | Herczeg et al. |
| 5,371,860 A | 12/1994 | Mura et al. |
| 5,371,878 A | 12/1994 | Coker |
| 5,374,787 A | 12/1994 | Miller et al. |
| 5,378,935 A | 1/1995 | Korhonen et al. |
| 5,381,515 A | 1/1995 | Platt et al. |
| 5,384,467 A | 1/1995 | Plimon et al. |
| 5,384,745 A | 1/1995 | Konishi et al. |
| 5,384,910 A | 1/1995 | Torres |
| 5,392,784 A | 2/1995 | Gudaitis |
| 5,394,522 A | 2/1995 | Sanchez-Frank et al. |
| 5,396,245 A | 3/1995 | Rempfer |
| 5,398,261 A | 3/1995 | Marbot |
| 5,399,922 A | 3/1995 | Kiani et al. |
| 5,408,194 A | 4/1995 | Steinbach et al. |
| 5,414,308 A | 5/1995 | Lee et al. |
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong |
| 5,426,384 A | 6/1995 | May |
| 5,428,319 A | 6/1995 | Marvin et al. |
| 5,430,395 A | 7/1995 | Ichimaru |
| 5,430,687 A | 7/1995 | Hung et al. |
| 5,430,734 A | 7/1995 | Gilson |
| 5,432,476 A | 7/1995 | Tran |
| 5,438,672 A | 8/1995 | Dey |
| 5,440,305 A | 8/1995 | Signore et al. |
| 5,451,887 A | 9/1995 | El Ayat et al. |
| 5,455,525 A | 10/1995 | Ho et al. |
| 5,455,731 A | 10/1995 | Parkinson |
| 5,455,927 A | 10/1995 | Huang |
| 5,457,410 A | 10/1995 | Ting |

| Patent | Date | Inventor |
|---|---|---|
| 5,457,479 A | 10/1995 | Cheng |
| 5,463,591 A | 10/1995 | Aimoto et al. |
| 5,479,603 A | 12/1995 | Stone et al. |
| 5,479,643 A | 12/1995 | Bhaskar et al. |
| 5,479,652 A | 12/1995 | Dreyer et al. |
| 5,481,471 A | 1/1996 | Naglestad et al. |
| 5,488,204 A | 1/1996 | Mead et al. |
| 5,491,458 A | 2/1996 | Mccune, Jr. et al. |
| 5,493,246 A | 2/1996 | Anderson |
| 5,493,723 A | 2/1996 | Beck et al. |
| 5,495,077 A | 2/1996 | Miller et al. |
| 5,495,593 A | 2/1996 | Elmer et al. |
| 5,495,594 A | 2/1996 | Mackenna et al. |
| 5,497,498 A | 3/1996 | Taylor |
| 5,499,192 A | 3/1996 | Knapp et al. |
| 5,517,198 A | 5/1996 | Mcewan |
| 5,519,854 A | 5/1996 | Watt |
| 5,521,529 A | 5/1996 | Agrawal et al. |
| 5,530,444 A | 6/1996 | Tice et al. |
| 5,530,673 A | 6/1996 | Tobita et al. |
| 5,530,813 A | 6/1996 | Paulsen et al. |
| 5,537,057 A | 7/1996 | Leong et al. |
| 5,541,878 A | 7/1996 | Lemoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,544,067 A | 8/1996 | Rostoker et al. |
| 5,544,311 A | 8/1996 | Harenberg et al. |
| 5,546,433 A | 8/1996 | Tran et al. |
| 5,546,562 A | 8/1996 | Patel |
| 5,552,725 A | 9/1996 | Ray et al. |
| 5,552,748 A | 9/1996 | O'Shaughnessy |
| 5,554,951 A | 9/1996 | Gough |
| 5,555,452 A | 9/1996 | Callaway et al. |
| 5,555,907 A | 9/1996 | Philipp |
| 5,557,762 A | 9/1996 | Okuaki et al. |
| 5,559,502 A | 9/1996 | Schutte |
| 5,559,996 A | 9/1996 | Fujioka |
| 5,563,526 A | 10/1996 | Hastings et al. |
| 5,563,529 A | 10/1996 | Seltzer et al. |
| 5,564,010 A | 10/1996 | Henry et al. |
| 5,564,108 A | 10/1996 | Hunsaker et al. |
| 5,565,658 A | 10/1996 | Gerpheide et al. |
| 5,566,702 A | 10/1996 | Philipp |
| 5,572,665 A | 11/1996 | Nakabayashi |
| 5,572,719 A | 11/1996 | Biesterfeldt |
| 5,574,678 A | 11/1996 | Gorecki |
| 5,574,852 A | 11/1996 | Bakker et al. |
| 5,574,892 A | 11/1996 | Christensen |
| 5,579,353 A | 11/1996 | Parmenter et al. |
| 5,587,945 A | 12/1996 | Lin et al. |
| 5,587,957 A | 12/1996 | Kowalczyk et al. |
| 5,590,354 A | 12/1996 | Klapproth et al. |
| 5,594,388 A | 1/1997 | O'Shaughnessy et al. |
| 5,594,734 A | 1/1997 | Worsley et al. |
| 5,594,890 A | 1/1997 | Yamaura et al. |
| 5,600,262 A | 2/1997 | Kolze |
| 5,604,466 A | 2/1997 | Dreps et al. |
| 5,608,892 A | 3/1997 | Wakerly |
| 5,614,861 A | 3/1997 | Harada |
| 5,617,041 A | 4/1997 | Lee et al. |
| 5,625,316 A | 4/1997 | Chambers et al. |
| 5,629,857 A | 5/1997 | Brennan |
| 5,629,891 A | 5/1997 | Lemoncheck et al. |
| 5,630,052 A | 5/1997 | Shah |
| 5,630,057 A | 5/1997 | Hait |
| 5,630,102 A | 5/1997 | Johnson et al. |
| 5,631,577 A | 5/1997 | Freidin et al. |
| 5,633,766 A | 5/1997 | Hase et al. |
| 5,642,295 A | 6/1997 | Smayling |
| 5,646,544 A | 7/1997 | Iadanza |
| 5,646,901 A | 7/1997 | Sharpe-Geisler et al. |
| 5,648,642 A | 7/1997 | Miller et al. |
| 5,651,035 A | 7/1997 | Tozun et al. |
| 5,663,900 A | 9/1997 | Bhandari et al. |
| 5,663,965 A | 9/1997 | Seymour |
| 5,664,199 A | 9/1997 | Kuwahara |
| 5,670,915 A | 9/1997 | Cooper et al. |
| 5,673,198 A | 9/1997 | Lawman et al. |
| 5,675,825 A | 10/1997 | Dreyer et al. |
| 5,677,691 A | 10/1997 | Hosticka et al. |
| 5,680,070 A | 10/1997 | Anderson et al. |
| 5,682,032 A | 10/1997 | Philipp |
| 5,684,434 A | 11/1997 | Mann et al. |
| 5,684,952 A | 11/1997 | Stein |
| 5,686,844 A | 11/1997 | Hull et al. |
| 5,689,195 A | 11/1997 | Cliff et al. |
| 5,689,196 A | 11/1997 | Schutte |
| 5,691,664 A | 11/1997 | Anderson et al. |
| 5,691,898 A | 11/1997 | Rosenberg et al. |
| 5,694,063 A | 12/1997 | Burlison et al. |
| 5,696,952 A | 12/1997 | Pontarelli |
| 5,699,024 A | 12/1997 | Manlove et al. |
| 5,703,871 A | 12/1997 | Pope et al. |
| 5,706,453 A | 1/1998 | Cheng et al. |
| 5,708,798 A | 1/1998 | Lynch et al. |
| 5,710,906 A | 1/1998 | Ghosh et al. |
| 5,712,969 A | 1/1998 | Zimmermann et al. |
| 5,724,009 A | 3/1998 | Collins et al. |
| 5,727,170 A | 3/1998 | Mitchell et al. |
| 5,729,704 A | 3/1998 | Stone et al. |
| 5,730,165 A | 3/1998 | Philipp |
| 5,732,277 A | 3/1998 | Kodosky et al. |
| 5,734,272 A | 3/1998 | Belot et al. |
| 5,734,334 A | 3/1998 | Hsieh et al. |
| 5,737,557 A | 4/1998 | Sullivan |
| 5,737,760 A | 4/1998 | Grimmer et al. |
| 5,745,011 A | 4/1998 | Scott |
| 5,748,048 A | 5/1998 | Moyal |
| 5,748,875 A | 5/1998 | Tzori |
| 5,752,013 A | 5/1998 | Christensen et al. |
| 5,754,552 A | 5/1998 | Allmond et al. |
| 5,754,826 A | 5/1998 | Gamal et al. |
| 5,757,368 A | 5/1998 | Gerpheide et al. |
| 5,758,058 A | 5/1998 | Milburn |
| 5,760,612 A | 6/1998 | Ramirez |
| 5,761,128 A | 6/1998 | Watanabe |
| 5,763,909 A | 6/1998 | Mead et al. |
| 5,764,714 A | 6/1998 | Stansell et al. |
| 5,767,457 A | 6/1998 | Gerpheide et al. |
| 5,774,704 A | 6/1998 | Williams |
| 5,777,399 A | 7/1998 | Shibuya |
| 5,781,030 A | 7/1998 | Agrawal et al. |
| 5,781,747 A | 7/1998 | Smith et al. |
| 5,784,545 A | 7/1998 | Anderson et al. |
| 5,790,882 A | 8/1998 | Silver et al. |
| 5,790,957 A | 8/1998 | Heidari |
| 5,796,183 A | 8/1998 | Hourmand et al. |
| 5,799,176 A | 8/1998 | Kapusta et al. |
| 5,802,073 A | 9/1998 | Platt |
| 5,802,290 A | 9/1998 | Casselman |
| 5,805,792 A | 9/1998 | Swoboda et al. |
| 5,805,897 A | 9/1998 | Glowny |
| 5,808,883 A | 9/1998 | Hawkes |
| 5,811,987 A | 9/1998 | Ashmore, Jr. et al. |
| 5,812,698 A | 9/1998 | Platt et al. |
| 5,818,254 A | 10/1998 | Agrawal et al. |
| 5,818,444 A | 10/1998 | Alimpich et al. |
| 5,819,028 A | 10/1998 | Manghirmalani et al. |
| 5,822,387 A | 10/1998 | Mar |
| 5,822,531 A | 10/1998 | Gorczyca et al. |
| 5,828,693 A | 10/1998 | Mays et al. |
| 5,838,583 A | 11/1998 | Varadarajan et al. |
| 5,841,078 A | 11/1998 | Miller et al. |
| 5,841,996 A | 11/1998 | Nolan et al. |
| 5,844,256 A | 12/1998 | Mead et al. |
| 5,848,285 A | 12/1998 | Kapusta et al. |
| 5,850,156 A | 12/1998 | Wittman |
| 5,852,733 A | 12/1998 | Chien et al. |
| 5,854,625 A | 12/1998 | Frisch et al. |
| 5,857,109 A | 1/1999 | Taylor |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,867,046 A | 2/1999 | Sugasawa |
| 5,867,399 A | 2/1999 | Rostoker et al. |
| 5,869,979 A | 2/1999 | Bocchino |

| | | | | | | |
|---|---|---|---|---|---|---|
| 5,870,004 | A | 2/1999 | Lu | 6,005,904 A | 12/1999 | Knapp et al. |
| 5,870,309 | A | 2/1999 | Lawman | 6,006,321 A | 12/1999 | Abbott |
| 5,870,345 | A | 2/1999 | Stecker | 6,006,322 A | 12/1999 | Muramatsu |
| 5,872,464 | A | 2/1999 | Gradinariu | 6,008,685 A | 12/1999 | Kunst |
| 5,874,958 | A | 2/1999 | Ludolph | 6,008,703 A | 12/1999 | Perrott et al. |
| 5,875,293 | A | 2/1999 | Bell et al. | 6,009,270 A | 12/1999 | Mann |
| 5,877,656 | A | 3/1999 | Mann et al. | 6,009,496 A | 12/1999 | Tsai |
| 5,878,425 | A | 3/1999 | Redpath | 6,011,407 A | 1/2000 | New |
| 5,880,411 | A | 3/1999 | Gillespie et al. | 6,012,835 A | 1/2000 | Thompson et al. |
| 5,880,598 | A | 3/1999 | Duong | 6,014,135 A | 1/2000 | Fernandes |
| 5,883,623 | A | 3/1999 | Cseri | 6,014,509 A | 1/2000 | Furtek et al. |
| 5,886,582 | A | 3/1999 | Stansell | 6,014,723 A | 1/2000 | Tremblay et al. |
| 5,889,236 | A | 3/1999 | Gillespie et al. | 6,016,554 A | 1/2000 | Skrovan et al. |
| 5,889,723 | A | 3/1999 | Pascucci | 6,016,563 A | 1/2000 | Fleisher |
| 5,889,936 | A | 3/1999 | Chan | 6,018,559 A | 1/2000 | Azegami et al. |
| 5,889,988 | A | 3/1999 | Held | 6,023,422 A | 2/2000 | Allen et al. |
| 5,894,226 | A | 4/1999 | Koyama | 6,023,565 A | 2/2000 | Lawman et al. |
| 5,894,243 | A | 4/1999 | Hwang | 6,026,134 A | 2/2000 | Duffy et al. |
| 5,894,565 | A | 4/1999 | Furtek et al. | 6,026,501 A | 2/2000 | Hohl et al. |
| 5,895,494 | A | 4/1999 | Scalzi et al. | 6,028,271 A | 2/2000 | Gillespie et al. |
| 5,896,068 | A | 4/1999 | Moyal | 6,028,959 A | 2/2000 | Wang et al. |
| 5,896,330 | A | 4/1999 | Gibson | 6,031,365 A | 2/2000 | Sharpe-Geisler |
| 5,898,345 | A | 4/1999 | Namura et al. | 6,032,268 A | 2/2000 | Swoboda et al. |
| 5,900,780 | A | 5/1999 | Hirose et al. | 6,034,538 A | 3/2000 | Abramovici |
| 5,901,062 | A | 5/1999 | Burch et al. | 6,037,807 A | 3/2000 | Wu et al. |
| 5,903,718 | A | 5/1999 | Marik | 6,038,551 A | 3/2000 | Barlow et al. |
| 5,905,398 | A | 5/1999 | Todsen et al. | 6,041,406 A | 3/2000 | Mann |
| 5,911,059 | A | 6/1999 | Profit, Jr. | 6,043,695 A | 3/2000 | O'Sullivan |
| 5,914,465 | A | 6/1999 | Allen et al. | 6,043,719 A | 3/2000 | Lin et al. |
| 5,914,633 | A | 6/1999 | Comino et al. | 6,049,223 A | 4/2000 | Lytle et al. |
| 5,914,708 | A | 6/1999 | Lagrange et al. | 6,049,225 A | 4/2000 | Huang et al. |
| 5,917,356 | A | 6/1999 | Casal et al. | 6,051,772 A | 4/2000 | Cameron et al. |
| 5,920,310 | A | 7/1999 | Faggin et al. | 6,052,035 A | 4/2000 | Nolan et al. |
| 5,923,264 | A | 7/1999 | Lavelle et al. | 6,052,524 A | 4/2000 | Pauna |
| 5,926,566 | A | 7/1999 | Wang et al. | 6,057,705 A | 5/2000 | Wojewoda et al. |
| 5,929,710 | A | 7/1999 | Bien | 6,058,263 A | 5/2000 | Voth |
| 5,930,150 | A | 7/1999 | Cohen et al. | 6,058,452 A | 5/2000 | Rangasayee et al. |
| 5,933,023 | A | 8/1999 | Young | 6,061,511 A | 5/2000 | Marantz et al. |
| 5,933,356 | A | 8/1999 | Rostoker et al. | 6,066,961 A | 5/2000 | Lee et al. |
| 5,933,816 | A | 8/1999 | Zeanah et al. | 6,070,003 A | 5/2000 | Gove et al. |
| 5,935,266 | A | 8/1999 | Thurnhofer et al. | 6,072,803 A | 6/2000 | Allmond et al. |
| 5,939,904 | A | 8/1999 | Fetterman et al. | 6,075,941 A | 6/2000 | Itoh et al. |
| 5,939,949 | A | 8/1999 | Olgaard et al. | 6,079,985 A | 6/2000 | Wohl et al. |
| 5,941,991 | A | 8/1999 | Kageshima | 6,081,140 A | 6/2000 | King |
| 5,942,733 | A | 8/1999 | Allen et al. | 6,094,730 A | 7/2000 | Lopez et al. |
| 5,943,052 | A | 8/1999 | Allen et al. | 6,097,211 A | 8/2000 | Couts-Martin et al. |
| 5,945,878 | A | 8/1999 | Westwick et al. | 6,097,432 A | 8/2000 | Mead et al. |
| 5,949,632 | A | 9/1999 | Barreras, Sr. et al. | 6,101,457 A | 8/2000 | Barch et al. |
| 5,952,888 | A | 9/1999 | Scott | 6,101,617 A | 8/2000 | Burckhartt et al. |
| 5,959,871 | A | 9/1999 | Pierzchala et al. | 6,104,217 A | 8/2000 | Magana |
| 5,963,075 | A | 10/1999 | Hiiragizawa | 6,104,325 A | 8/2000 | Liaw et al. |
| 5,963,105 | A | 10/1999 | Nguyen | 6,107,769 A | 8/2000 | Saylor et al. |
| 5,963,503 | A | 10/1999 | Lee | 6,107,826 A | 8/2000 | Young et al. |
| 5,964,893 | A | 10/1999 | Circello et al. | 6,107,882 A | 8/2000 | Gabara et al. |
| 5,966,027 | A | 10/1999 | Kapusta et al. | 6,110,223 A | 8/2000 | Southgate et al. |
| 5,966,532 | A | 10/1999 | McDonald et al. | 6,111,431 A | 8/2000 | Estrada |
| 5,968,135 | A | 10/1999 | Teramoto et al. | 6,112,264 A | 8/2000 | Beasley et al. |
| 5,969,513 | A | 10/1999 | Clark | 6,121,791 A | 9/2000 | Abbott |
| 5,969,632 | A | 10/1999 | Diamant et al. | 6,121,805 A | 9/2000 | Thamsirianunt et al. |
| 5,973,368 | A | 10/1999 | Pearce et al. | 6,121,965 A | 9/2000 | Kenney et al. |
| 5,974,235 | A | 10/1999 | Nunally et al. | 6,125,416 A | 9/2000 | Warren |
| 5,977,791 | A | 11/1999 | Veenstra | 6,130,548 A | 10/2000 | Koifman |
| 5,978,584 | A | 11/1999 | Nishibata et al. | 6,130,551 A | 10/2000 | Agrawal et al. |
| 5,978,937 | A | 11/1999 | Miyamori et al. | 6,130,552 A | 10/2000 | Jefferson et al. |
| 5,982,105 | A | 11/1999 | Masters | 6,130,553 A | 10/2000 | Nakaya |
| 5,982,229 | A | 11/1999 | Wong et al. | 6,133,773 A | 10/2000 | Garlepp et al. |
| 5,982,241 | A | 11/1999 | Nguyen et al. | 6,134,181 A | 10/2000 | Landry |
| 5,983,277 | A | 11/1999 | Heile et al. | 6,134,516 A | 10/2000 | Wang et al. |
| 5,986,479 | A | 11/1999 | Mohan | 6,137,308 A | 10/2000 | Nayak |
| 5,987,246 | A | 11/1999 | Thomsen et al. | 6,140,853 A | 10/2000 | Lo |
| 5,988,902 | A | 11/1999 | Holehan | 6,141,376 A | 10/2000 | Shaw |
| 5,994,939 | A | 11/1999 | Johnson et al. | 6,141,764 A | 10/2000 | Ezell |
| 5,996,032 | A | 11/1999 | Baker | 6,144,327 A | 11/2000 | Distinti et al. |
| 5,999,725 | A | 12/1999 | Barbier et al. | 6,148,104 A | 11/2000 | Wang et al. |
| 6,002,268 | A | 12/1999 | Sasaki et al. | 6,148,441 A | 11/2000 | Woodward |
| 6,002,398 | A | 12/1999 | Wilson | 6,149,299 A | 11/2000 | Aslan et al. |
| 6,003,054 | A | 12/1999 | Oshima et al. | 6,150,866 A | 11/2000 | Eto et al. |
| 6,003,133 | A | 12/1999 | Moughanni et al. | 6,154,064 A | 11/2000 | Proebsting |
| 6,005,814 | A | 12/1999 | Mulholland et al. | 6,157,024 A | 12/2000 | Chapdelaine et al. |

| | | |
|---|---|---|
| 6,157,270 A | 12/2000 | Tso |
| 6,161,199 A | 12/2000 | Szeto et al. |
| 6,166,367 A | 12/2000 | Cho |
| 6,166,960 A | 12/2000 | Marneweck et al. |
| 6,167,077 A | 12/2000 | Ducaroir et al. |
| 6,167,559 A | 12/2000 | Furtek et al. |
| 6,169,383 B1 | 1/2001 | Johnson |
| 6,172,571 B1 | 1/2001 | Moyal et al. |
| 6,173,419 B1 | 1/2001 | Barnett |
| 6,175,914 B1 | 1/2001 | Mann |
| 6,175,949 B1 | 1/2001 | Gristede et al. |
| 6,181,163 B1 | 1/2001 | Agrawal et al. |
| 6,183,131 B1 | 2/2001 | Holloway et al. |
| 6,185,127 B1 | 2/2001 | Myers et al. |
| 6,185,522 B1 | 2/2001 | Bakker |
| 6,185,703 B1 | 2/2001 | Guddat et al. |
| 6,185,732 B1 | 2/2001 | Mann et al. |
| 6,188,228 B1 | 2/2001 | Philipp |
| 6,188,241 B1 | 2/2001 | Gauthier et al. |
| 6,188,381 B1 | 2/2001 | Van Der et al. |
| 6,188,391 B1 | 2/2001 | Seely et al. |
| 6,188,975 B1 | 2/2001 | Gay |
| 6,191,603 B1 | 2/2001 | Muradali et al. |
| 6,191,660 B1 | 2/2001 | Mar et al. |
| 6,191,998 B1 | 2/2001 | Reddy et al. |
| 6,192,431 B1 | 2/2001 | Dabral et al. |
| 6,198,303 B1 | 3/2001 | Rangasayee |
| 6,201,407 B1 | 3/2001 | Kapusta et al. |
| 6,201,829 B1 | 3/2001 | Schneider |
| 6,202,044 B1 | 3/2001 | Tzori |
| 6,204,687 B1 | 3/2001 | Schultz et al. |
| 6,205,574 B1 | 3/2001 | Dellinger et al. |
| 6,208,572 B1 | 3/2001 | Adams et al. |
| 6,211,708 B1 | 4/2001 | Klemmer |
| 6,211,715 B1 | 4/2001 | Terauchi |
| 6,211,741 B1 | 4/2001 | Dalmia |
| 6,215,326 B1 | 4/2001 | Jefferson et al. |
| 6,215,352 B1 | 4/2001 | Sudo |
| 6,218,859 B1 | 4/2001 | Pedersen |
| 6,219,729 B1 | 4/2001 | Keats et al. |
| 6,222,528 B1 | 4/2001 | Gerpheide et al. |
| 6,223,144 B1 | 4/2001 | Barnett et al. |
| 6,223,147 B1 | 4/2001 | Bowers |
| 6,223,272 B1 | 4/2001 | Coehlo et al. |
| RE37,195 E | 5/2001 | Kean |
| 6,225,866 B1 | 5/2001 | Kubota et al. |
| 6,236,242 B1 | 5/2001 | Hedberg |
| 6,236,275 B1 | 5/2001 | Dent |
| 6,236,278 B1 | 5/2001 | Olgaard |
| 6,236,593 B1 | 5/2001 | Hong et al. |
| 6,239,389 B1 | 5/2001 | Allen et al. |
| 6,239,798 B1 | 5/2001 | Ludolph et al. |
| 6,240,375 B1 | 5/2001 | Sonoda |
| 6,246,258 B1 | 6/2001 | Lesea |
| 6,246,410 B1 | 6/2001 | Bergeron et al. |
| 6,249,167 B1 | 6/2001 | Oguchi et al. |
| 6,249,447 B1 | 6/2001 | Boylan et al. |
| 6,253,754 B1 | 7/2001 | Roohparvar |
| 6,260,087 B1 | 7/2001 | Chang |
| 6,262,717 B1 | 7/2001 | Donohue et al. |
| 6,263,302 B1 | 7/2001 | Hellestrand et al. |
| 6,263,339 B1 | 7/2001 | Hirsch |
| 6,263,484 B1 | 7/2001 | Yang |
| 6,271,679 B1 | 8/2001 | McClintock et al. |
| 6,272,646 B1 | 8/2001 | Rangasayee et al. |
| 6,275,117 B1 | 8/2001 | Abugharbieh et al. |
| 6,278,568 B1 | 8/2001 | Cloke et al. |
| 6,280,391 B1 | 8/2001 | Olson et al. |
| 6,281,753 B1 | 8/2001 | Corsi et al. |
| 6,282,547 B1 | 8/2001 | Hirsch |
| 6,282,551 B1 | 8/2001 | Anderson et al. |
| 6,286,127 B1 | 9/2001 | King et al. |
| 6,288,707 B1 | 9/2001 | Philipp |
| 6,289,300 B1 | 9/2001 | Brannick et al. |
| 6,289,478 B1 | 9/2001 | Kitagaki |
| 6,289,489 B1 | 9/2001 | Bold et al. |
| 6,292,028 B1 | 9/2001 | Tomita |
| 6,294,932 B1 | 9/2001 | Watarai |
| 6,294,962 B1 | 9/2001 | Mar |
| 6,298,320 B1 | 10/2001 | Buckmaster et al. |
| 6,304,014 B1 | 10/2001 | England et al. |
| 6,304,101 B1 | 10/2001 | Nishihara |
| 6,304,790 B1 | 10/2001 | Nakamura et al. |
| 6,307,413 B1 | 10/2001 | Dalmia et al. |
| 6,310,521 B1 | 10/2001 | Dalmia |
| 6,310,611 B1 | 10/2001 | Caldwell |
| 6,311,149 B1 | 10/2001 | Ryan et al. |
| 6,314,530 B1 | 11/2001 | Mann |
| 6,320,184 B1 | 11/2001 | Winklhofer et al. |
| 6,320,282 B1 | 11/2001 | Caldwell |
| 6,321,369 B1 | 11/2001 | Heile et al. |
| 6,323,846 B1 | 11/2001 | Westerman et al. |
| 6,324,628 B1 | 11/2001 | Chan |
| 6,326,859 B1 | 12/2001 | Goldman et al. |
| 6,332,137 B1 | 12/2001 | Hori et al. |
| 6,332,201 B1 | 12/2001 | Chin et al. |
| 6,337,578 B2 | 1/2002 | Jefferson et al. |
| 6,337,579 B1 | 1/2002 | Mochida |
| 6,338,109 B1 | 1/2002 | Snyder et al. |
| 6,339,815 B1 | 1/2002 | Feng et al. |
| 6,342,907 B1 | 1/2002 | Petty et al. |
| 6,345,383 B1 | 2/2002 | Ueki |
| 6,347,395 B1 | 2/2002 | Payne et al. |
| 6,351,789 B1 | 2/2002 | Green |
| 6,353,452 B1 | 3/2002 | Hamada et al. |
| 6,355,980 B1 | 3/2002 | Callahan |
| 6,356,862 B2 | 3/2002 | Bailey |
| 6,356,958 B1 | 3/2002 | Lin |
| 6,356,960 B1 | 3/2002 | Jones et al. |
| 6,359,950 B2 | 3/2002 | Gossmann et al. |
| 6,362,697 B1 | 3/2002 | Pulvirenti |
| 6,366,174 B1 | 4/2002 | Berry et al. |
| 6,366,300 B1 | 4/2002 | Ohara et al. |
| 6,366,874 B1 | 4/2002 | Lee et al. |
| 6,366,878 B1 | 4/2002 | Grunert |
| 6,369,660 B1 | 4/2002 | Wei et al. |
| 6,371,878 B1 | 4/2002 | Bowen |
| 6,373,954 B1 | 4/2002 | Malcolm, Jr. et al. |
| 6,374,370 B1 | 4/2002 | Bockhaus et al. |
| 6,377,009 B1 | 4/2002 | Philipp |
| 6,377,575 B1 | 4/2002 | Mullaney et al. |
| 6,377,646 B1 | 4/2002 | Sha |
| 6,380,811 B1 | 4/2002 | Zarubinsky et al. |
| 6,380,929 B1 | 4/2002 | Platt |
| 6,380,931 B1 | 4/2002 | Gillespie et al. |
| 6,384,947 B1 | 5/2002 | Ackerman et al. |
| 6,385,742 B1 | 5/2002 | Kirsch et al. |
| 6,388,109 B1 | 5/2002 | Schwarz et al. |
| 6,388,464 B1 | 5/2002 | Lacey et al. |
| 6,396,302 B2 | 5/2002 | New et al. |
| 6,396,687 B1 | 5/2002 | Sun et al. |
| 6,397,232 B1 | 5/2002 | Cheng-Hung et al. |
| 6,404,204 B1 | 6/2002 | Farruggia et al. |
| 6,404,224 B1 | 6/2002 | Azegami et al. |
| 6,404,445 B1 | 6/2002 | Galea et al. |
| 6,407,953 B1 | 6/2002 | Cleeves |
| 6,408,432 B1 | 6/2002 | Herrmann et al. |
| 6,411,665 B1 | 6/2002 | Chan et al. |
| 6,411,974 B1 | 6/2002 | Graham et al. |
| 6,414,671 B1 | 7/2002 | Gillespie et al. |
| 6,421,698 B1 | 7/2002 | Hong |
| 6,425,109 B1 | 7/2002 | Choukalos et al. |
| 6,426,677 B1 | 7/2002 | Prentice |
| 6,429,882 B1 | 8/2002 | Abdelnur et al. |
| 6,430,305 B1 | 8/2002 | Decker |
| 6,433,645 B1 | 8/2002 | Mann et al. |
| 6,434,187 B1 | 8/2002 | Beard et al. |
| 6,437,805 B1 | 8/2002 | Sojoodi et al. |
| 6,438,565 B1 | 8/2002 | Ammirato et al. |
| 6,438,735 B1 | 8/2002 | McElvain et al. |
| 6,438,738 B1 | 8/2002 | Elayda |
| 6,441,073 B1 | 8/2002 | Tanaka et al. |
| 6,445,211 B1 | 9/2002 | Saripella |
| 6,449,628 B1 | 9/2002 | Wasson |
| 6,449,755 B1 | 9/2002 | Beausang et al. |
| 6,452,437 B1 | 9/2002 | Takeuchi et al. |
| 6,452,514 B1 | 9/2002 | Philipp |
| 6,453,175 B2 | 9/2002 | Mizell et al. |

| | | | | | | |
|---|---|---|---|---|---|---|
| 6,453,461 B1 | 9/2002 | Chaiken | | 6,604,179 B2 | 8/2003 | Volk et al. |
| 6,456,304 B1 | 9/2002 | Angiulo et al. | | 6,606,731 B1 | 8/2003 | Baum et al. |
| 6,457,355 B1 | 10/2002 | Philipp | | 6,608,472 B1 | 8/2003 | Kutz et al. |
| 6,457,479 B1 | 10/2002 | Zhuang et al. | | 6,610,936 B2 | 8/2003 | Gillespie et al. |
| 6,460,172 B1 | 10/2002 | Insenser Farre et al. | | 6,611,220 B1 | 8/2003 | Snyder |
| 6,463,488 B1 | 10/2002 | San Juan | | 6,611,276 B1 | 8/2003 | Muratori et al. |
| 6,466,036 B1 | 10/2002 | Philipp | | 6,611,856 B1 | 8/2003 | Liao et al. |
| 6,466,078 B1 | 10/2002 | Stiff | | 6,611,952 B1 | 8/2003 | Prakash et al. |
| 6,466,898 B1 | 10/2002 | Chan | | 6,613,098 B1 | 9/2003 | Sorge et al. |
| 6,473,069 B1 | 10/2002 | Gerpheide | | 6,614,260 B1 | 9/2003 | Welch et al. |
| 6,476,634 B1 | 11/2002 | Bilski | | 6,614,320 B1 | 9/2003 | Sullam et al. |
| 6,477,691 B1 | 11/2002 | Bergamaschi et al. | | 6,614,374 B1 | 9/2003 | Gustavsson et al. |
| 6,480,921 B1 | 11/2002 | Mansoorian et al. | | 6,614,458 B1 | 9/2003 | Lambert et al. |
| 6,483,343 B1 | 11/2002 | Faith et al. | | 6,617,888 B2 | 9/2003 | Volk |
| 6,487,700 B1 | 11/2002 | Fukushima | | 6,618,854 B1 | 9/2003 | Mann |
| 6,489,899 B1 | 12/2002 | Ely et al. | | 6,621,356 B2 | 9/2003 | Gotz et al. |
| 6,490,213 B1 | 12/2002 | Mu et al. | | 6,624,640 B2 | 9/2003 | Lund et al. |
| 6,492,834 B1 | 12/2002 | Lytle et al. | | 6,625,765 B1 | 9/2003 | Krishnan |
| 6,496,971 B1 | 12/2002 | Lesea et al. | | 6,628,163 B2 | 9/2003 | Dathe et al. |
| 6,498,720 B2 | 12/2002 | Glad | | 6,631,508 B1 | 10/2003 | Williams |
| 6,499,134 B1 | 12/2002 | Buffet et al. | | 6,634,008 B1 | 10/2003 | Dole |
| 6,499,359 B1 | 12/2002 | Washeleski et al. | | 6,636,096 B2 | 10/2003 | Schaffer et al. |
| 6,504,403 B2 | 1/2003 | Bangs et al. | | 6,637,015 B1 | 10/2003 | Ogami et al. |
| 6,507,214 B1 | 1/2003 | Snyder | | 6,639,586 B2 | 10/2003 | Gerpheide |
| 6,507,215 B1 | 1/2003 | Piasecki et al. | | 6,642,857 B1 | 11/2003 | Schediwy et al. |
| 6,507,857 B1 | 1/2003 | Yalcinalp | | 6,643,151 B1 | 11/2003 | Nebrigic et al. |
| 6,509,758 B2 | 1/2003 | Piasecki et al. | | 6,643,810 B2 | 11/2003 | Whetsel |
| 6,512,395 B1 | 1/2003 | Lacey et al. | | 6,649,924 B1 | 11/2003 | Philipp et al. |
| 6,516,428 B2 | 2/2003 | Wenzel et al. | | 6,650,581 B2 | 11/2003 | Hong et al. |
| 6,522,128 B1 | 2/2003 | Ely et al. | | 6,658,498 B1 | 12/2003 | Carney et al. |
| 6,523,416 B2 | 2/2003 | Takagi et al. | | 6,658,633 B2 | 12/2003 | Devins et al. |
| 6,525,593 B1 | 2/2003 | Mar | | 6,661,288 B2 | 12/2003 | Morgan et al. |
| 6,529,791 B1 | 3/2003 | Takagi | | 6,661,410 B2 | 12/2003 | Casebolt et al. |
| 6,530,065 B1 | 3/2003 | McDonald et al. | | 6,664,978 B1 | 12/2003 | Kekic et al. |
| 6,534,970 B1 | 3/2003 | Ely et al. | | 6,664,991 B1 | 12/2003 | Chew et al. |
| 6,535,200 B2 | 3/2003 | Philipp | | 6,667,642 B1 | 12/2003 | Moyal |
| 6,535,946 B1 | 3/2003 | Bryant et al. | | 6,667,740 B2 | 12/2003 | Ely et al. |
| 6,536,028 B1 | 3/2003 | Katsioulas et al. | | 6,670,852 B1 | 12/2003 | Hauck |
| 6,539,534 B1 | 3/2003 | Bennett | | 6,673,308 B2 | 1/2004 | Hino et al. |
| 6,542,025 B1 | 4/2003 | Kutz et al. | | 6,677,814 B2 | 1/2004 | Low et al. |
| 6,542,844 B1 | 4/2003 | Hanna | | 6,677,932 B1 | 1/2004 | Westerman |
| 6,553,057 B1 | 4/2003 | Sha et al. | | 6,678,645 B1 | 1/2004 | Rajsuman et al. |
| 6,554,469 B1 | 4/2003 | Thomson et al. | | 6,678,877 B1 | 1/2004 | Perry et al. |
| 6,557,164 B1 | 4/2003 | Faustini | | 6,680,632 B1 | 1/2004 | Meyers et al. |
| 6,559,685 B2 | 5/2003 | Green | | 6,680,731 B2 | 1/2004 | Gerpheide et al. |
| 6,560,306 B1 | 5/2003 | Duffy et al. | | 6,681,280 B1 | 1/2004 | Miyake et al. |
| 6,560,699 B1 | 5/2003 | Konkle | | 6,681,359 B1 | 1/2004 | Au et al. |
| 6,563,391 B1 | 5/2003 | Mar | | 6,683,462 B2 | 1/2004 | Shimizu |
| 6,564,179 B1 | 5/2003 | Belhaj | | 6,683,930 B1 | 1/2004 | Dalmia |
| 6,566,961 B2 | 5/2003 | Dasgupta et al. | | 6,686,787 B2 | 2/2004 | Ling |
| 6,567,426 B1 | 5/2003 | van Hook et al. | | 6,686,860 B2 | 2/2004 | Gulati et al. |
| 6,567,932 B2 | 5/2003 | Edwards et al. | | 6,690,224 B1 | 2/2004 | Moore |
| 6,570,557 B1 | 5/2003 | Westerman et al. | | 6,691,301 B2 | 2/2004 | Bowen |
| 6,571,331 B2 | 5/2003 | Henry et al. | | 6,697,754 B1 | 2/2004 | Alexander |
| 6,574,590 B1 | 6/2003 | Kershaw et al. | | 6,701,340 B1 | 3/2004 | Gorecki et al. |
| 6,574,739 B1 | 6/2003 | Kung et al. | | 6,701,487 B1 | 3/2004 | Ogami et al. |
| 6,575,373 B1 | 6/2003 | Nakano | | 6,701,508 B1 | 3/2004 | Bartz et al. |
| 6,577,258 B2 | 6/2003 | Ruha et al. | | 6,704,381 B1 | 3/2004 | Moyal et al. |
| 6,578,174 B2 | 6/2003 | Zizzo | | 6,704,879 B1 | 3/2004 | Parrish |
| 6,580,329 B2 | 6/2003 | Sander | | 6,704,889 B2 | 3/2004 | Veenstra et al. |
| 6,581,191 B1 | 6/2003 | Schubert et al. | | 6,704,893 B1 | 3/2004 | Bauwens et al. |
| 6,587,093 B1 | 7/2003 | Shaw et al. | | 6,705,511 B1 | 3/2004 | Dames et al. |
| 6,587,995 B1 | 7/2003 | Duboc et al. | | 6,711,226 B1 | 3/2004 | Williams et al. |
| 6,588,004 B1 | 7/2003 | Southgate et al. | | 6,711,731 B2 | 3/2004 | Weiss |
| 6,590,422 B1 | 7/2003 | Dillon | | 6,713,897 B2 | 3/2004 | Caldwell |
| 6,590,517 B1 | 7/2003 | Swanson | | 6,714,066 B2 | 3/2004 | Gorecki et al. |
| 6,591,369 B1 | 7/2003 | Edwards et al. | | 6,714,817 B2 | 3/2004 | Daynes et al. |
| 6,592,626 B1 | 7/2003 | Bauchot et al. | | 6,715,132 B1 | 3/2004 | Bartz et al. |
| 6,594,796 B1 | 7/2003 | Chiang | | 6,717,474 B2 | 4/2004 | Chen et al. |
| 6,597,212 B1 | 7/2003 | Wang et al. | | 6,718,294 B1 | 4/2004 | Bortfeld |
| 6,597,824 B2 | 7/2003 | Newberg et al. | | 6,718,520 B1 | 4/2004 | Merryman et al. |
| 6,598,178 B1 | 7/2003 | Yee et al. | | 6,718,533 B1 | 4/2004 | Schneider et al. |
| 6,600,346 B1 | 7/2003 | Macaluso | | 6,724,220 B1 | 4/2004 | Snyder et al. |
| 6,600,351 B2 | 7/2003 | Bisanti et al. | | 6,728,900 B1 | 4/2004 | Meli |
| 6,600,575 B1 | 7/2003 | Kohara | | 6,728,902 B2 | 4/2004 | Kaiser et al. |
| 6,601,189 B1 | 7/2003 | Edwards et al. | | 6,730,863 B1 | 5/2004 | Gerpheide et al. |
| 6,601,236 B1 | 7/2003 | Curtis | | 6,731,552 B2 | 5/2004 | Perner |
| 6,603,330 B1 | 8/2003 | Snyder | | 6,732,068 B2 | 5/2004 | Sample et al. |
| 6,603,348 B1 | 8/2003 | Preuss et al. | | 6,732,347 B1 | 5/2004 | Camilleri et al. |

| | | |
|---|---|---|
| 6,738,858 B1 | 5/2004 | Fernald et al. |
| 6,744,323 B1 | 6/2004 | Moyal et al. |
| 6,748,569 B1 | 6/2004 | Brooke et al. |
| 6,750,852 B2 | 6/2004 | Gillespie et al. |
| 6,750,889 B1 | 6/2004 | Livingston |
| 6,754,765 B1 | 6/2004 | Chang et al. |
| 6,754,849 B2 | 6/2004 | Tamura |
| 6,757,761 B1 | 6/2004 | Smith et al. |
| 6,757,882 B2 | 6/2004 | Chen et al. |
| 6,765,407 B1 | 7/2004 | Snyder |
| 6,765,408 B2 | 7/2004 | Cheng et al. |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,788,116 B1 | 9/2004 | Cook et al. |
| 6,788,221 B1 | 9/2004 | Ely et al. |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |
| 6,806,782 B2 | 10/2004 | Motoyoshi et al. |
| 6,809,275 B1 | 10/2004 | Cheng et al. |
| 6,809,566 B1 | 10/2004 | Xin-LeBlanc |
| 6,810,442 B1 | 10/2004 | Lin et al. |
| 6,815,979 B2 | 11/2004 | Ooshita |
| 6,816,544 B1 | 11/2004 | Bailey et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,850,554 B1 | 2/2005 | Sha et al. |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Latham, II et al. |
| 6,873,210 B2 | 3/2005 | Mulder et al. |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,563 B1 | 5/2005 | Ogami et al. |
| 6,903,613 B1 | 6/2005 | Mitchell et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Mueller et al. |
| 6,934,674 B1 | 8/2005 | Douezy et al. |
| 6,937,075 B2 | 8/2005 | Lim et al. |
| 6,940,356 B2 | 9/2005 | McDonald, II et al. |
| 6,941,336 B1 | 9/2005 | Mar |
| 6,944,018 B2 | 9/2005 | Caldwell |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,960,936 B2 | 11/2005 | Cambonie |
| 6,963,233 B2 | 11/2005 | Puccio et al. |
| 6,967,511 B1 | 11/2005 | Sullam |
| 6,967,960 B1 | 11/2005 | Bross et al. |
| 6,968,346 B2 | 11/2005 | Hekmatpour |
| 6,970,844 B1 | 11/2005 | Bierenbaum |
| 6,973,400 B2 | 12/2005 | Cahill-O'Brien et al. |
| 6,980,060 B2 | 12/2005 | Boerstler et al. |
| 6,981,090 B1 | 12/2005 | Kutz et al. |
| 6,988,192 B2 | 1/2006 | Snider |
| 6,996,799 B1 | 2/2006 | Cismas et al. |
| 7,005,933 B1 | 2/2006 | Shutt |
| 7,009,444 B1 | 3/2006 | Scott |
| 7,015,735 B2 | 3/2006 | Kimura et al. |
| 7,017,145 B2 | 3/2006 | Taylor |
| 7,020,854 B2 | 3/2006 | Killian et al. |
| 7,023,257 B1 | 4/2006 | Sullam |
| 7,024,636 B2 | 4/2006 | Weed |
| 7,024,654 B2 | 4/2006 | Bersch et al. |
| 7,030,656 B2 | 4/2006 | Lo et al. |
| 7,030,688 B2 | 4/2006 | Dosho et al. |
| 7,034,603 B2 | 4/2006 | Brady et al. |
| 7,042,301 B2 | 5/2006 | Sutardja |
| 7,043,710 B2 * | 5/2006 | Reese et al. .................. 716/111 |
| 7,047,166 B2 | 5/2006 | Dancea |
| 7,052,179 B2 | 5/2006 | Tesi |
| 7,055,035 B2 | 5/2006 | Allison et al. |
| 7,058,921 B1 | 6/2006 | Hwang et al. |
| 7,073,158 B2 | 7/2006 | McCubbrey |
| 7,076,420 B1 | 7/2006 | Snyder et al. |
| 7,086,014 B1 | 8/2006 | Bartz et al. |
| 7,088,166 B1 | 8/2006 | Reinschmidt et al. |
| 7,089,175 B1 | 8/2006 | Nemecek et al. |
| 7,091,713 B2 | 8/2006 | Erdelyi et al. |
| 7,092,980 B1 | 8/2006 | Mar et al. |
| 7,093,225 B2 | 8/2006 | Osann |
| 7,099,818 B1 | 8/2006 | Nemecek et al. |
| 7,103,108 B1 | 9/2006 | Beard |
| 7,117,485 B2 | 10/2006 | Wilkinson et al. |
| 7,119,550 B2 | 10/2006 | Kitano et al. |
| 7,119,602 B2 | 10/2006 | Davis |
| 7,124,376 B2 | 10/2006 | Zaidi et al. |
| 7,127,630 B1 | 10/2006 | Snyder |
| 7,129,793 B2 | 10/2006 | Gramegna |
| 7,129,873 B2 | 10/2006 | Kawamura |
| 7,132,835 B1 | 11/2006 | Arcus |
| 7,138,841 B1 | 11/2006 | Li et al. |
| 7,138,868 B2 | 11/2006 | Sanchez et al. |
| 7,139,530 B2 | 11/2006 | Kusbel |
| 7,149,316 B1 | 12/2006 | Kutz et al. |
| 7,150,002 B1 | 12/2006 | Anderson et al. |
| 7,152,027 B2 | 12/2006 | Andrade et al. |
| 7,154,294 B2 | 12/2006 | Liu et al. |
| 7,161,936 B1 | 1/2007 | Barrass et al. |
| 7,162,410 B1 | 1/2007 | Nemecek et al. |
| 7,164,288 B2 | 1/2007 | Leijten-Nowak |
| 7,171,455 B1 | 1/2007 | Gupta et al. |
| 7,176,701 B2 | 2/2007 | Wachi et al. |
| 7,180,342 B1 | 2/2007 | Shutt et al. |
| 7,185,162 B1 | 2/2007 | Snyder |
| 7,185,321 B1 | 2/2007 | Roe et al. |
| 7,188,063 B1 | 3/2007 | Snyder |
| 7,193,901 B2 | 3/2007 | Ruby et al. |
| 7,200,507 B2 | 4/2007 | Chen et al. |
| 7,206,733 B1 | 4/2007 | Nemecek |
| 7,221,187 B1 | 5/2007 | Snyder et al. |
| 7,227,389 B2 | 6/2007 | Gong et al. |
| 7,236,921 B1 | 6/2007 | Nemecek et al. |

| | | |
|---|---|---|
| 7,250,825 B2 | 7/2007 | Wilson et al. |
| 7,256,588 B2 | 8/2007 | Howard et al. |
| 7,265,633 B1 | 9/2007 | Stiff |
| 7,266,768 B2 | 9/2007 | Ferlitsch et al. |
| 7,274,212 B1 | 9/2007 | Burney et al. |
| 7,281,846 B2 | 10/2007 | McLeod |
| 7,282,905 B2 | 10/2007 | Chen et al. |
| 7,283,151 B2 | 10/2007 | Nihei et al. |
| 7,295,049 B1 | 11/2007 | Moyal et al. |
| 7,301,835 B2 | 11/2007 | Joshi et al. |
| 7,307,485 B1 | 12/2007 | Snyder et al. |
| 7,312,616 B2 | 12/2007 | Snyder |
| 7,323,879 B2 | 1/2008 | Kuo et al. |
| 7,342,405 B2 | 3/2008 | Eldridge et al. |
| 7,358,714 B2 | 4/2008 | Watanabe et al. |
| 7,367,017 B2 | 4/2008 | Maddocks et al. |
| 7,376,001 B2 | 5/2008 | Joshi et al. |
| 7,376,904 B2 | 5/2008 | Cifra et al. |
| 7,386,740 B2 | 6/2008 | Kutz et al. |
| 7,389,487 B1 | 6/2008 | Chan et al. |
| 7,400,183 B1 | 7/2008 | Sivadasan et al. |
| 7,406,674 B1 | 7/2008 | Ogami et al. |
| 7,421,251 B2 | 9/2008 | Westwick et al. |
| 7,472,155 B2 * | 12/2008 | Simkins et al. ............... 708/523 |
| 7,542,533 B2 | 6/2009 | Jasa et al. |
| 7,554,847 B2 | 6/2009 | Lee |
| 7,637,658 B2 | 12/2009 | Gardner et al. |
| 7,648,271 B2 | 1/2010 | Doorenbos et al. |
| 7,679,398 B2 | 3/2010 | Osann, Jr. |
| 7,737,724 B2 | 6/2010 | Snyder et al. |
| 7,741,865 B1 | 6/2010 | Sharpe-Geisler et al. |
| 7,880,459 B2 | 2/2011 | Harvey |
| 7,882,165 B2 * | 2/2011 | Simkins et al. ............... 708/490 |
| 7,948,989 B2 | 5/2011 | Kapoor |
| 8,024,678 B1 * | 9/2011 | Taylor et al. .................. 716/100 |
| 8,026,739 B2 | 9/2011 | Sullam et al. |
| 2001/0000634 A1 | 5/2001 | Keehn et al. |
| 2001/0002129 A1 | 5/2001 | Zimmerman et al. |
| 2001/0006347 A1 | 7/2001 | Jefferson et al. |
| 2001/0010083 A1 | 7/2001 | Satoh |
| 2001/0038392 A1 | 11/2001 | Humpleman et al. |
| 2001/0043081 A1 | 11/2001 | Rees |
| 2001/0044927 A1 | 11/2001 | Karniewicz |
| 2001/0045861 A1 | 11/2001 | Bloodworth et al. |
| 2001/0047509 A1 | 11/2001 | Mason et al. |
| 2002/0010716 A1 | 1/2002 | McCartney et al. |
| 2002/0016706 A1 | 2/2002 | Cooke et al. |
| 2002/0023110 A1 | 2/2002 | Fortin et al. |
| 2002/0042696 A1 | 4/2002 | Garcia et al. |
| 2002/0052729 A1 | 5/2002 | Kyung et al. |
| 2002/0059543 A1 | 5/2002 | Cheng et al. |
| 2002/0065646 A1 | 5/2002 | Waldie et al. |
| 2002/0068989 A1 | 6/2002 | Ebisawa et al. |
| 2002/0073119 A1 | 6/2002 | Richard |
| 2002/0073380 A1 | 6/2002 | Cooke |
| 2002/0080186 A1 | 6/2002 | Frederiksen |
| 2002/0085020 A1 | 7/2002 | Carroll |
| 2002/0109722 A1 | 8/2002 | Rogers et al. |
| 2002/0116168 A1 | 8/2002 | Kim |
| 2002/0121679 A1 | 9/2002 | Bazarjani et al. |
| 2002/0122060 A1 | 9/2002 | Markel |
| 2002/0129334 A1 | 9/2002 | Dane et al. |
| 2002/0133771 A1 | 9/2002 | Barnett |
| 2002/0133794 A1 | 9/2002 | Kanapathippillai et al. |
| 2002/0138516 A1 | 9/2002 | Igra |
| 2002/0145433 A1 | 10/2002 | Morrise et al. |
| 2002/0152234 A1 | 10/2002 | Estrada et al. |
| 2002/0152449 A1 | 10/2002 | Lin |
| 2002/0156885 A1 | 10/2002 | Thakkar |
| 2002/0156998 A1 | 10/2002 | Casselman |
| 2002/0161802 A1 | 10/2002 | Gabrick et al. |
| 2002/0166100 A1 | 11/2002 | Meding |
| 2002/0174134 A1 | 11/2002 | Goykhman |
| 2002/0174411 A1 | 11/2002 | Feng et al. |
| 2003/0011639 A1 | 1/2003 | Webb |
| 2003/0014447 A1 | 1/2003 | White |
| 2003/0025734 A1 | 2/2003 | Boose et al. |
| 2003/0041235 A1 | 2/2003 | Meyer |
| 2003/0055852 A1 | 3/2003 | Wojko |
| 2003/0056071 A1 | 3/2003 | Triece et al. |
| 2003/0058469 A1 | 3/2003 | Buis et al. |
| 2003/0061572 A1 | 3/2003 | McClannahan et al. |
| 2003/0097640 A1 | 5/2003 | Abrams et al. |
| 2003/0105620 A1 | 6/2003 | Bowen |
| 2003/0126947 A1 | 7/2003 | Margaria |
| 2003/0135842 A1 | 7/2003 | Frey et al. |
| 2003/0149961 A1 | 8/2003 | Kawai et al. |
| 2003/0229482 A1 | 12/2003 | Cook et al. |
| 2004/0000928 A1 | 1/2004 | Cheng et al. |
| 2004/0017222 A1 | 1/2004 | Betz et al. |
| 2004/0034843 A1 | 2/2004 | Osann |
| 2004/0054821 A1 | 3/2004 | Warren et al. |
| 2004/0153802 A1 | 8/2004 | Kudo et al. |
| 2004/0205553 A1 | 10/2004 | Hall et al. |
| 2004/0205617 A1 | 10/2004 | Light |
| 2004/0205695 A1 | 10/2004 | Fletcher |
| 2005/0066152 A1 | 3/2005 | Garey |
| 2005/0091472 A1 | 4/2005 | Master et al. |
| 2005/0134308 A1 | 6/2005 | Okada et al. |
| 2005/0143968 A9 | 6/2005 | Odom et al. |
| 2005/0240917 A1 | 10/2005 | Wu |
| 2005/0248534 A1 | 11/2005 | Kehlstadt |
| 2005/0280453 A1 | 12/2005 | Hsieh |
| 2006/0066345 A1 | 3/2006 | Leijten-Nowak |
| 2007/0139074 A1 | 6/2007 | Reblewski |
| 2007/0258458 A1 | 11/2007 | Kapoor |
| 2008/0042687 A1 | 2/2008 | Mori et al. |
| 2008/0094102 A1 | 4/2008 | Osann |
| 2008/0095213 A1 | 4/2008 | Lin et al. |
| 2008/0186052 A1 | 8/2008 | Needham et al. |
| 2008/0258804 A1 | 10/2008 | Kutz |
| 2008/0259998 A1 | 10/2008 | Venkataraman et al. |
| 2008/0263319 A1 | 10/2008 | Snyder et al. |
| 2008/0263334 A1 | 10/2008 | Synder et al. |
| 2008/0288755 A1 | 11/2008 | Synder et al. |
| 2008/0294806 A1 | 11/2008 | Swindle et al. |

FOREIGN PATENT DOCUMENTS

| | | | |
|---|---|---|---|
| EP | 368398 | A1 | 5/1990 |
| EP | 0450863 | A | 10/1991 |
| EP | 0499383 | A | 8/1992 |
| EP | 0639816 | A1 | 2/1995 |
| EP | 0639816 | A2 | 2/1995 |
| EP | 1170671 | A | 1/2002 |
| EP | 1191423 | A | 3/2002 |
| EP | 1205848 | A1 | 5/2002 |
| JP | 4083405 | A | 3/1992 |
| JP | 4095408 | A | 3/1992 |
| JP | 5055842 | A | 3/1993 |
| JP | 6021732 | A | 1/1994 |
| WO | 9532478 | A1 | 11/1995 |
| WO | PCTUS9617305 | A1 | 6/1996 |
| WO | PCTUS9834376 | A1 | 8/1998 |
| WO | PCTUS9909712 | A1 | 2/1999 |

OTHER PUBLICATIONS

USPTO Final Rejection for U.S. Appl. No. 11/968,145, dated Jul. 29, 2011; 5 pages.
USPTO Non-Final Rejection for U.S. Appl. No. 11/963,661, dated Dec. 29, 2011; 16 pages.
USPTO Advisory Action for U.S. Appl. No. 11/963,661, dated Jun. 30, 2011; 3 pages.
USPTO Non-Final Rejection for U.S. Appl. No. 11/963,661, dated Dec. 3, 2010; 18 pages.
USPTO Advisory Action for U.S. Appl. No. 11/963,661, dated Aug. 27, 2010; 3 pages.
USPTO Final Rejection for U.S. Appl. No. 11/963,661, dated Jun. 22, 2010; 11 pages.
USPTO Non-Final Rejection for U.S. Appl. No. 11/963,661, dated Feb. 4, 2010; 11 pages.
International Written Opinion of the International Searching Authority for International Application No. PCT/US08/60698 dated Sep. 5, 2008; 2 pages.
Ito et al., "A Comparison of Microcontrollers Targeted to FPGA-Based Embedded Applications", Sep. 2000, Proceedings of 13th Symposium on Integrated Circuits and Systems Design, Sep. 18-24, 2000, pp. 397-402; 6 pages.

Jonathan B. Rosenburg, "How Debuggers Work" John Wiley & Sons, Inc. 1996; 259 pages.
Julio Faura et al.; "A Novel Mixed Signal Programmable Device With On-Chip Microprocessor", 1997, IEEE 1997 Custom Integrated Circuits Conference, pp. 103-106; 4 pages.
Jung et al., "A Register File with Transposed Access Mode," 2000, IEEE; 2 pages.
Khan et al.; "FPGA Architectures for Asic Hardware Emulators"; IEEE 1993, pp. 336-340; 5 pages.
Kory Hopkins, "Definition," Jan. 16, 1997; <http://www.cs.sfu.ca/cs/people/GradStudent.html>; 1 page.
Larsson, "A 2-1600-MHz CMOS Clock Recovery PLL with Low-V dd Capability," IEEE Journal of Solid-State Circuits, vol. 34, No. 12, Dec. 1999; 10 pages.
Lee, Mark; "EMC Design Considerations for PSoC CapSense Applications," Cypress Semiconductor Corporation, Application Note AN2318; Sep. 16, 2005; 6 pages.
Lutovac et al. "Symbolic Computation of Digital Filter Transfer Function Using MATLAB," Proceedings of 23rd International Conference on Microelectronics, vol. 2 NIS, Yugoslavia, May 2002, pp. 651-654; 4 pages.
Maneatis, "Low-Jitter Process-Independent DLL and PLL Based on Self-Biased Techniques," IEEE Journal of Solid-State Circuits, vol. 31, No. 11, Nov. 1996, pp. 1723-1732; 10 pages.
Maroufi et al., "Solving the I/O Bandwidth Problem in System on a Chip Testing," IEEE, 2000; 6 pages.
Marsh, "Smart Tools Illuminate Deeply Embedded Systems," EDN, vol. 45 No. 3, Feb. 3, 2000, pp. 129-138; 7 pages.
Microsoft Computer Dictionary "ActiveX" 2002; Microsoft Press; 5th Edition; 3 pages.
Microsoft Press Computer User's Dictionary; 1998; 3 pages (including p. 18).
Monte Mar et al., "An architecture for a configurable Mixed-signal device", 2003, IEEE Journal of Solid-State Circuits, vol. 3, pp. 565-568; 4 pages.
Morrison, Gale, "IBM Eyes Merchant Packaging Services," Jul. 13, 2998, Electronic News, available at http://www.findarticles.com; 4 pages.
Nam et al., "Fast Development of Source-Level Debugging System Using Hardware Emulation," IEEE, 2000, pp. 400-404; 4 pages.
Nouta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Oh et al., "Emulator Environment Based on an FPGA Prototyping Board," IEEE, Jun. 21-23, 2000, pp. 72-77; 6 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Papachristou et al., "Microprocessor Based Testing for Core-Based System on a Chip," IEEE, 1999; 6 pages.
Pasternak, "In-Circuit-Emulation in ASIC Architecture Core Designs," IEEE, 1989, pp. P6-4.1-P6-4.4; 4 pages.
PCT International Search Report for PCT/US05/28791, filed Aug. 12, 2005, mailed Mar. 31, 2008; 4 pages.
PCT International Written Opinion for PCT/US05/28791, filed Aug. 12, 2005, mailed Mar. 31, 2008; 8 pages.
PCT Written Opinion of the International Searching Authority for PCT/US2005/028793, filed Aug. 12, 2005, mailed Nov. 19, 2007; 7 pages.
Robert A. Blauschild, "WP 3.5: An Integrated Time Reference," ISSCC94/Session 3, Analog Techniques/Paper WP 3.5, Feb. 1994, pp. 56-58; 4 pages.
Robinson, Gordon D., "Why 1149.1 (JTAG) Really Works", May 1994, Conference Proceedings Electro/94 International, May 10-12, 1994, Combined Volumes, pp. 749-754; 6 pages.
Sedra, Adel S. et al., "Microelectronic Circuits," 3rd Edition, Oxford University Press, pp. xiii-xx and 861-883, 1991; 20 pages.
Seguine, Ryan; "Layout Guidelines for PSoC CapSense," Cypress Semiconductor Corporation, Application Note AN2292; Jul. 22, 2005; 13 pages.
Shahbahrami et al., "Matrix Register File and Extended Subwords: Two Techniques for Embedded Media Processors," ACM, May 2005; 9 pages.
Snyder et al., "Xilinx's A-to-Z Systems Platform" Cahners Microprocessor, The Insider's Guide to Microprocessor Hardware, Feb. 6, 2001; 9 pages.
Song et al., "A 50% Power Reduction Scheme for CMOS Relaxation Oscillator," IEEE, 1999, pp. 154-157; 4 pages.
Specks et al., "A Mixed Digital-Analog 16B Microcontroller with 0.5MB Flash Memory, On-Chip Power Supply, Physical Nework Interface, and 40V I/O for Automotive Single-Chip Mechatronics," IEEE, Feb. 9, 2000; 1 page.
Stallman et al.; "Debugging with the GNU Source-Level Debugger"; Jan. 1994; retrieved on May 2, 2005 from http://www.cs.utah.edu; 4 pages.
Stan Augarten; "The Chip Collection—Introduction—Smithsonian Institute"; "State of the Art"; "The First 256-Bit Static RAM"; retrieved on Nov. 14, 2005 from http://smithsonianchips.si.edu/augarren/p24.htm; 2 pages.
Stephen Walters, "Computer-Aided Prototyping for ASIC-Based Systems," 1991, IEEE Design & Test of Computers, vol. 8, Issue 2, pp. 4-10; 8 pages.
The U.S. Appl. No. 60/243,708: "Advanced Programmable Microcontroller Device," Snyder et al., filed Oct. 26, 2000; 277 pages.
Tran et al., "Fine Pitch and Wirebonding and Reliability of Aluminum Capped Copper Bond Pads," May 2000, IEEE Electronic Components and Technology Conference, pp. 1674-1680; 7 pages.
UPSTO Advisory Action for U.S. Appl. No. 09/989,778, dated May 15, 2006; 4 pages.
USPTO Advisory Action for U.S. Appl. No. 09/998,848, dated Sep. 7, 2005; 3 pages.
USPTO Advisory Action for U.S. Appl. No. 10/001,477, dated Oct. 10, 2008; 3 pages.
USPTO Advisory Action for U.S. Appl. No. 09/475,879, dated Mar. 4, 2002; 3 pages.
USPTO Advisory Action for U.S. Appl. No. 09/475,879, dated Dec. 31, 2001; 3 pages.
USPTO Advisory Action for U.S. Appl. No. 09/875,599, dated Jun. 8, 2005; 3 pages.
USPTO Advisory Action for U.S. Appl. No. 09/943,062, dated Mar. 27, 2008; 3 pages.
USPTO Advisory Action for Application No. 09/943,062, dated Sep. 25, 2003; 3 pages.
USPTO Advisory Action for U.S. Appl. No. 09/969,311, dated Jul. 21, 2003; 2 pages.
USPTO Advisory Action for U.S. Appl. No. 09/972,133, dated Aug. 31, 2005; 3 pages.
USPTO Advisory Action for U.S. Appl. No. 09/975,338, dated May 15, 2006; 4 pages.
USPTO Advisory Action for U.S. Appl. No. 09/994,601, dated Mar. 23, 2010; 2 pages.
USPTO Advisory Action for U.S. Appl. No. 11/200,619, dated May 11, 2009; 3 pages.
USPTO Advisory Action for U.S. Appl. No. 11/322,044, dated Nov. 30, 2007; 2 pages.
USPTO Advisory Action for U.S. Appl. No. 11/337,272, dated Apr. 3, 2007; 3 pages.
USPTO Advisory Action for U.S. Appl. No. 11/415,588, dated Jan. 14, 2008; 3 pages.
USPTO Advisory Action for U.S. Appl. No. 11/644,100, dated Feb. 9, 2009; 3 pages.
USPTO Advisory Action for U.S. Appl. No. 12/060,176, dated Sep. 7, 2012; 3 pages.
USPTO Advisory Action for U.S. Appl. No. 12/239,450, dated Aug. 14, 2012.
USPTO U.S. Appl. No. 08/865,342, "Programmable Clock Generator," Mann et al., filed May 29, 1997; 41 pages.
USPTO U.S. Appl. No. 09/047,595, "Roving Range Control to Limit Receive Pll Frequency of Operation," Paul H. Scott, filed Mar. 29, 1998; 35 pages.
USPTO U.S. Appl. No. 09/048,905, "Programmable Clock Generator," Mann et al., filed Mar. 26, 1998; 42 pages.

USPTO U.S. Appl. No. 09/216,460, "Circuit and Method for Controlling an Output of a Ring Oscillator," Abugharbieh et al., filed Dec. 18, 1998; 21 pages.
USPTO U.S. Appl. No. 09/275,336, "Programmable Oscillator Scheme," Mar et al., filed Mar. 24, 1999; 25 pages.
USPTO U.S. Appl. No. 09/398,956, "Frequency Acquisition Rate Control in Phase Lock Loop Circuits," Moyal et al., filed Sep. 17, 1999; 35 pages.
USPTO U.S. Appl. No. 09/404,891, "Method, Architecture and Circuitry for Controlling Pulse Width in a Phase and/or Frequency Detector," Scott et al., filed Sep. 24, 1999; 17 pages.
USPTO U.S. Appl. No. 09/470,665, "Digital Phase/Frequency Detector, and Clock Generator and Data Recovery PLL Containing the Same," Kamal Dalmia, filed Dec. 23, 1999; 26 pages.
USPTO U.S. Appl. No. 09/471,576, "Reference-Free Clock Generation and Data Recovery PLL," Kamal Dalmia, filed Dec. 23, 1999; 30 pages.
USPTO U.S. Appl. No. 09/471,914, "Reference-Free Clock Generator and Data Recovery PLL," Dalmia et al., filed Dec. 23, 1999; 32 pages.
USPTO U.S. Appl. No. 09/475,808, "Configurable Memory for Programmable Logic Circuits," Lacey et al., filed Dec. 30, 1999; 24 pages.
USPTO U.S. Appl. No. 09/475,879, "Programmable Logic Device," Lacey et al.; filed Dec. 30, 1999; 50 pages.
USPTO U.S. Appl. No. 09/538,989, "Memory Based Phase Locked Loop," Rengarajan S. Krishnan, filed Mar. 30, 2000; 27 pages.
USPTO U.S. Appl. No. 09/608,753, "PLL Lockout Watchdog," Wilson et al., filed Aug. 24, 2004; 24 pages.
USPTO U.S. Appl. No. 09/721,316, "Programmable Oscillator Scheme," Mar et al., filed Nov. 22, 2000; 26 pages.
USPTO U.S. Appl. No. 09/826,397, "Method and Circuit for Allowing a Microprocessor to Change its Operating Frequency on-the-Fly," Bert Sullam, filed Apr. 2, 2001; 24 pages.
USPTO U.S. Appl. No. 09/849,164, "Reduced Static Phase Error CMOS PLL Charge Pump," Jonathon Stiff, filed May 4, 2001; 30 pages.
USPTO U.S. Appl. No. 09/855,868, "Protecting Access to Microcontroller Memory Blocks," Warren Snyder, filed May 14, 2001; 28 pages.
USPTO U.S. Appl. No. 09/875,599, "Method and Apparatus for Programming a Flash Memory," Warren Snyder, filed Jun. 5, 2001; 23 pages.
USPTO U.S. Appl. No. 09/887,923, "Novel Method and System for Interacting between a Processor and a Power on Reset to Dynamically Control Power States in a Microcontroller," Kutz et al., filed Jun. 22, 2001; 44 pages.
USPTO U.S. Appl. No. 09/887,955, "Novel Power on Reset Circuit for Microcontroller," Kutz et al., filed Jun. 22, 2001; 42 pages.
USPTO U.S. Appl. No. 09/893,048, "A Microcontroller having an On-Chip High Gain Amplifier," Kutz et al., filed Jun. 26, 2001; 22 pages.
USPTO U.S. Appl. No. 09/893,050, "Multiple Use of Microcontroller Pad," Kutz et al., filed Jun. 26, 2001; 21 pages.
USPTO U.S. Appl. No. 09/893,161, "Architecture of a PLL with Dynamic Frequency Control on a PLD," Michael T. Moore, filed Jun. 27, 2001; 32 pages.
USPTO U.S. Appl. No. 09/909,045, "Digital Configurable Macro Architecture," Warren Snyder, filed Jul. 18, 2001; 37 pages.
USPTO U.S. Appl. No. 09/909,047, "A Programmable Analog System Architecture," Monte Mar, filed Jul. 18, 2001; 60 pages.
USPTO U.S. Appl. No. 09/909,109, "Configuring Digital Functions in a Digital Configurable Macro Architecture," Warren Snyder, filed Jul. 18, 2001; 38 pages.
USPTO U.S. Appl. No. 09/912,768, "A Microcontroller having a Dual Mode Relax Oscillator that is Trimmable," James Shutt; filed Jul. 24, 2001; 33 pages.
USPTO U.S. Appl. No. 09/922,419, "A Power Supply Pump Circuit for a Microcontroller," Kutz et al., filed Aug. 3, 2001; 38 pages.
USPTO U.S. Appl. No. 09/922,579, "A Method for a Efficient Supply to a Microcontroller," Kutz et al., filed Aug. 3, 2001; 37 pages.

USPTO U.S. Appl. No. 09/923,461, "Non-Interfering Multiply-Mac (Multiply Accumulate) Circuit," Warren Snyder, filed Aug. 6, 2001; 25 pages.
USPTO U.S. Appl. No. 09/924,734, "Programmable Microcontroller (PSoC) Architecture (Mixed Analog/Digital)"; Snyder et al., filed Aug. 7, 2001; 28 pages.
USPTO U.S. Appl. No. 09/929,891, "Programming Architecture for a Programmable Analog System," Mar et al., filed Aug. 14, 2001; 82 pages.
USPTO U.S. Appl. No. 09/930,021, "Programmable Methodology and Architecture for a Programmable Analog System"; Mar et al., filed Aug. 14, 2001; 87 pages.
USPTO U.S. Appl. No. 09/935,454, "Method and Apparatus for Local and Global Power Management in a Programmable Analog Circuit," Monte Mar, filed Aug. 22, 2001; 56 pages.
USPTO U.S. Appl. No. 09/943,149, "Method for Phase Locking in a Phase Lock Loop," Moyal et al., filed Aug. 30, 2001; 25 pages.
USPTO U.S. Appl. No. 09/953,423, "A Configurable Input/Output Interface for a Microcontroller," Warren Snyder, filed Sep. 14, 2001; 28 pages.
USPTO U.S. Appl. No. 09/957,084, "A Crystal-Less Oscillator with Trimmable Analog Current Control for Increased Stability," Mar et al., filed Sep. 19, 2001; 28 pages.
USPTO U.S. Appl. No. 09/969,311, "Method for Synchronizing and Resetting Clock Signals Supplied to Multiple Programmable Analog Blocks," Bert Sullam, filed Oct. 1, 2001; 57 pages.
USPTO U.S. Appl. No. 09/969,313, "Architecture for Synchronizing and Resetting Clock Signals Supplied to Multiple Analog Programmable Analog Blocks," Bert Sullam, filed Oct. 1, 2001; 50 pages.
USPTO U.S. Appl. No. 09/972,003, "Test Architecture for Microcontroller Providing for a Serial Communication Interface," Warren Snyder, filed Oct. 5, 2001; 32 pages.
USPTO U.S. Appl. No. 09/972,133, "Method for Entering Circuit Test Mode," Warren Snyder, filed Oct. 5, 2001; 30 pages.
USPTO U.S. Appl. No. 09/972,319 "Method for Applying Instructions to Microprocessor in Test Mode," Warren Snyder, filed Oct. 5, 2001; 31 pages.
USPTO U.S. Appl. No. 09/973,535, "Architecture for Decimation Algorithm," Warren Snyder, filed Oct. 9, 2001; 26 pages.
USPTO U.S. Appl. No. 09/975,030 "Emulator Chip-Board Architecture for Interface," Snyder et al., filed Oct. 10, 2001; 37 pages.
USPTO U.S. Appl. No. 09/975,104, "Capturing Test/Emulation and Enabling Real-Time Debugging Using FPGA for In-Circuit Emulation," Warren Snyder, filed Oct. 10, 2001; 35 pages.
USPTO U.S. Appl. No. 09/975,105, "Host to FPGA Interface in an In-Circuit Emulation System," Craig Nemecek, filed Oct. 10, 2001; 44 pages.
USPTO U.S. Appl. No. 09/975,115 "In-System Chip Emulator Architecture," Snyder et al., filed Oct. 10, 2001; 38 pages.
USPTO U.S. Appl. No. 09/975,338 "Method for Breaking Execution of a Test Code in DUT and Emulator Chip Essentially Simultaneously and Handling Complex Breakpoint Events," Nemecek et al., filed Oct. 10, 2001; 34 pages.
USPTO U.S. Appl. No. 09/977,111, "A Frequency Doubler Circuit with Trimmable Current Control," Shutt et al., filed Oct. 11, 2001; 35 pages.
USPTO U.S. Appl. No. 09/981,448, "Oscillator Tuning Method," Lane T. Hauck, filed Oct. 17, 2001; 28 pages.
USPTO U.S. Appl. No. 09/989,574 "Method and System for using a Graphics user Interface for Programming an Electronic Device," Bartz et al., filed Nov. 19, 2001; 43 pages.
USPTO U.S. Appl. No. 09/989,761, "Storing of global parameter defaults and using them over two or more design projects," Ogami et al., filed on Nov. 19, 2001; 37 pages.
USPTO U.S. Appl. No. 09/989,781, "System and method for decoupling and iterating resources associated with a module," Ogami et al., filed Nov. 19, 2001; 40 pages.
USPTO U.S. Appl. No. 09/989,808, "Automatic generation of application program interfaces, source code, interrupts, and data sheets for microcontroller programming," Bartz et al., filed Nov. 19, 2001; 67 pages.

USPTO U.S. Appl. No. 09/989,815, "A Data Driven Method and System for Monitoring Hardware Resource Usage for Programming an Electric Device," Bartz et al., filed Nov. 19, 2001; 36 pages.
USPTO U.S. Appl. No. 09/989,816, "Datasheet Browsing and Creation with Data-Driven Datasheet Tabs within a Microcontroller Design Tool," Bartz et al., filed Nov. 19, 2001; 55 pages.
USPTO U.S. Appl. No. 09/989,819, "System and method for creating a boot file utilizing a boot template," Ogami et al., filed Nov. 19, 2001; 43 pages.
USPTO U.S. Appl. No. 09/998,834, "A System and a Method for Communication between and Ice and a Production Microcontroller while in a Halt State," Craig Nemecek, filed Nov. 15, 2001; 33 pages.
USPTO U.S. Appl. No. 09/998,859, "A System and a Method for Checking Lock Step Consistency between in Circuit Emulation and a Microcontroller while Debugging Process is in Progress," Craig Nemecek, filed Nov. 15, 2001; 33 pages.
USPTO U.S. Appl. No. 10/000,383, "System and Method of Providing a Programmable Clock Architecture for an Advanced Microcontroller," Sullam et al., filed Oct. 24, 2001; 34 pages.
USPTO U.S. Appl. No. 10/001,477, "Breakpoint Control in an In-Circuit Emulation System," Roe et al., filed Nov. 1, 2001; 43 pages.
USPTO U.S. Appl. No. 10/001,478, "In-Circuit Emulator and POD Synchronized Boot," Nemecek et al., filed Nov. 1, 2001; 44 pages.
USPTO U.S. Appl. No. 10/001,568, "Combined In-Circuit Emulator and Programmer," Nemecek et al., filed Nov. 1, 2001; 47 pages.
USPTO U.S. Appl. No. 10/002,217, "Conditional Branching in an In-Circuit Emulation System," Craig Nemecek, filed Nov. 1, 2001; 43 pages.
USPTO U.S. Appl. No. 10/004,039, "In-Circuit Emulator with Gatekeeper for Watchdog Timer," Nemecek et al., filed Nov. 14, 2001; 46 pages.
USPTO U.S. Appl. No. 10/004,197, "In-Circuit Emulator with Gatekeeper Based Halt Control," Nemecek et al., filed Nov. 14, 2001; 47 pages.
USPTO U.S. Appl. No. 10/011,214, "Method and Circuit for Synchronizing a Write Operation between an On-Chip Microprocessor and an On-Chip Programmable Analog Device Operating at Different Frequencies," Sullam et al., filed Oct. 25, 2001; 49 pages.
USPTO U.S. Appl. No. 10/033,027, "Microcontrollable Programmable System on a Chip," Warren Snyder; filed Oct. 22, 2001; 117 pages.
USPTO U.S. Appl. No. 10/083,442, "Method/Architecture for a Low Gain PLL with Wide Frequency Range," Meyers et al., filed Feb. 26, 2002; 28 pages.
USPTO U.S. Appl. No. 10/109,979, "Graphical user interface with logic unifying functions," Anderson et al., filed Mar. 29, 2001; 100 pages.
USPTO U.S. Appl. No. 10/113,064, "Method and System for Debugging through Supervisory Operating Codes and Self Modifying Codes," Roe et al., filed Mar. 29, 2002; 36 pages.
USPTO U.S. Appl. No. 10/113,065, "System and Method for Automatically Matching Components in a Debugging System," Nemecek et al., filed Mar. 29, 2002; 32 pages.
USPTO U.S. Appl. No. 10/226,911, "Calibration of Integrated Circuit Time Constants," Gehring et al.; filed Aug. 22, 2002; 32 pages.
USPTO U.S. Appl. No. 10/272,231, "Digital Configurable Macro Architecture," Warren Snyder, filed Oct. 15, 2002; 36 pages.
USPTO U.S. Appl. No. 10/288,003, "Low Voltage Differential Signal Driver Circuit and Method," Roper et al., filed Nov. 4, 2002; 30 pages.
USPTO U.S. Appl. No. 10/293,392, "Low Voltage Receiver Circuit and Method for Shifting the Differential Input Signals of the Receiver Depending on a Common Mode Voltage of the Input Signals," Maher et al., filed Nov. 13, 2002; 23 pages.
USPTO U.S. Appl. No. 10/305,589, "Current Controlled Delay Circuit," Jonathon Stiff, filed Nov. 26, 2002; 24 pages.
USPTO U.S. Appl. No. 10/324,455, "Programmable Oscillator Scheme," Mar et al., filed Dec. 20, 2002; 23 pages.
USPTO U.S. Appl. No. 10/327,217, "Single Ended Clock Signal Generator Having a Differential Output," Richmond et al., filed Dec. 20, 2002; 27 pages.
USPTO U.S. Appl. No. 10/803,030, "Programmable Microcontrollable Architecture (Mixed Analog/ Digital)," Snyder et al., filed Mar. 16, 2004; 40 pages.
USPTO U.S. Appl. No. 10/871,582, "LVDS Input Circuit with Extended Common Mode Range," Reinschmidt et al., filed Jun. 17, 2004; 25 pages.
USPTO U.S. Appl. No. 11/125,554, "A Method for a Efficient Supply to a Microcontroller," Kutz et al., filed May 9, 2005; 41 pages.
USPTO U.S. Appl. No. 11/132,894, "Open Loop Bandwidth Test Architecture and Method for Phase Locked Loop (PLL)," Jonathon Stiff, filed May 19, 2005; 38 pages.
USPTO U.S. Appl. No. 11/201,922, "Design model for a hardware device-independent method of defining embedded firmware for programmable systems," McDonald et al., filed Aug. 10, 2005; 31 pages.
USPTO U.S. Appl. No. 11/273,708, "Capacitance Sensor Using Relaxation Oscillators," Snyder et al., filed Nov. 14, 2005; 33 pages.
USPTO U.S. Appl. No. 11/322,044, "Split charge pump PLL architecture," Jonathon Stiff, filed Dec. 28, 2005; 19 pages.
USPTO U.S. Appl. No. 11/337,272, "Successive Approximate Capacitance Measurement Circuit;" Warren Snyder, filed Jan. 20, 2006 29 pages.
USPTO U.S. Appl. No. 11/415,588, "Voltage Controlled Oscillator Delay Cell and Method," Sivadasan et al., filed May 1, 2006; 24 pages.
USPTO U.S. Appl. No. 11/644,100, "Differential-to-single ended signal converter circuit and method," Jonathon Stiff, filed Dec. 21, 2006; 33 pages.
USPTO U.S. Appl. No. 11/698,660, "Configurable Bus," Kutz et al., filed Jan. 25, 2007; 35 pages.
USPTO U.S. Appl. No. 11/709,866, "Input/Output Multiplexer Bus," Dennis Sequine, filed Feb. 21, 2007; 33 pages.
USPTO U.S. Appl. No. 11/850,260, "Circuit and Method for Improving the Accuracy of a Crystal-less Oscillator Having Dual-Frequency Modes," Wright et al, filed Sep. 5, 2007; 33 pages.
USPTO U.S. Appl. No. 11/983,291, "Successive Approximate Capacitance Measurement Cimuit " Warren Snyder, filed Nov. 7, 2007, 26 pages.
USPTO U.S. Appl. No. 12/132,527, "System and Method for Performing Next Placements and Pruning of Disallowed Placements for Programming an Integrated Circuit;" Ogami et al., filed Jun. 3, 2008; 44 pages.
USPTO U.S. Appl. No. 12/218,404, "Voltage Controlled Oscillator Delay Cell Method " Sivadasan of al., filed Jul. 14; 23 pages.
USPTO Ex Parte Qualyle Action for U.S. Appl. No. 09/992,076 dated Jun. 18, 2007, 6 pages.
USPTO Final Rejection for U.S. Appl. No. 09/975,105 dated Jul. 13, 2006; 7 pages.
USPTO Final Rejection for U.S. Appl. No. 09/975,115 dated Feb. 21, 2007; 25 pages.
USPTO Final Rejection for U.S. Appl. No. 09/975,115, dated May 12, 2008; 33 pages.
USPTO Final Rejection for U.S. Appl. No. 09/975,115, dated Jun. 23, 2006; 20 pages.
USPTO Final Rejection for U.S. Appl. No. 09/989,198, dated Mar. 31, 2009; 18 pages.
USPTO Final Rejection for U.S. Appl. No. 09/989,765, dated Apr. 3, 2007; 12 pages.
USPTO Final Rejection for U.S. Appl. No. 09/989,765, dated Apr. 4, 2008; 16 pages.
USPTO Final Rejection for U.S. Appl. No. 09/989,765, dated Apr. 17, 2006; 12 pages.
USPTO Final Rejection for U.S. Appl. No. 09/989,767, dated Jan. 11, 2007; 12 pages.
USPTO Final Rejection for U.S. Appl. No. 09/989,767, dated Jan. 15, 2009; 21 pages.
USPTO Final Rejection for U.S. Appl. No. 09/989,767, dated Mar. 6, 2006; 15 pages.
USPTO Final Rejection for U.S. Appl. No. 09/989,767, dated Apr. 6, 2005; 13 pages.
USPTO Final Rejection for U.S. Appl. No. 09/989,767, dated Dec. 27, 2007; 21 pages.
USPTO Final Rejection for U.S. Appl. No. 09/989,771, dated Feb. 27, 2007; 8 pages.

USPTO Final Rejection for U.S. Appl. No. 09/989,771, dated Mar. 28, 2006; 9 pages.
USPTO Final Rejection for U.S. Appl. No. 09/989,771, dated Apr. 6, 2005; 7 pages.
USPTO Final Rejection for U.S. Appl. No. 09/939,771, dated Dec. 10, 2008; 12 pages.
USPTO Final Rejection for U.S. Appl. No. 09/989,771, dated Dec. 27, 2007; 15 pages.
USPTO Final Rejection for U.S. Appl. No. 09/989,777, dated Jan. 30, 2008; 14 pages.
USPTO Final Rejection for U.S. Appl. No. 09/989,777, dated Mar. 13, 2007; 24 pages.
USPTO Final Rejection for U.S. Appl. No. 09/989,777, dated Dec. 21, 2005; 29 pages.
USPTO Final Rejection for U.S. Appl. No. 09/989,778, dated Mar. 16, 2009; 26 pages.
USPTO Final Rejection for U.S. Appl. No. 09/989,778, dated Jan. 8, 2009; 25 pages.
USPTO Final Rejection for U.S. Appl. No. 09/989,778, dated Feb. 5, 2007; 17 pages.
USPTO Final Rejection for U.S. Appl. No. 09/989,778, dated Feb. 15, 2006; 9 pages.
USPTO Final Rejection for U.S. Appl. No. 09/989,778, dated Dec. 20, 2007; 14 pages.
USPTO Final Rejection for U.S. Appl. No. 09/989,782, dated Jul. 9, 2008; 10 pages.
USPTO Final Rejection for U.S. Appl. No. 09/989,982, dated Jul. 24, 2007; 9 pages.
USPTO Final Rejection for U.S. Appl. No. 09/989,778 dated Sep. 21, 2006; 10 pages.
USPTO Final Rejection for U.S. Appl. No. 09/989,782, dated Nov. 3, 2005, 11 pages.
USPTO Final Rejection for U.S. Appl. No. 09/992,076, dated Jan. 30, 2007; 32 pages.
USPTO Final Rejection for U.S. Appl. No. 09/992,076, dated Mar. 17, 2006; 16 pages.
USPTO Final Rejection for U.S. Appl. No. 09/994,600, dated Feb. 13, 2006; 13 pages.
USPTO Final Rejection for U.S. Appl. No. 09/994,600, dated May 4, 2005; 16 pages.
USPTO Final Rejection for U.S. Appl. No. 09/994,600, dated Oct. 17, 2007; 13 pages.
USPTO Final Rejection for U.S. Appl. No. 09/994,600, dated Dec. 8, 2006; 14 pages.
USPTO Final Rejection for U.S. Appl. No. 09/994,601, dated Apr. 17, 2008; 24 pages.
USPTO Final Rejection for U.S. Appl. No. 09/994,601, dated May 18, 2007; 17 pages.
USPTO Final Rejection for U.S. Appl. No. 09/994,601 dated Mar. 8, 2006; 11 pages.
USPTO Final Rejection for U.S. Appl. No. 09/994,601, dated Mar. 24, 2005; 10 pages.
USPTO Final Rejection for U.S. Appl. No. 09/998,848, dated Jun. 14, 2005; 17 pages.
USPTO Final Rejection for U.S. Appl. No. 09/998,848, dated Jul. 25, 2006; 16 pages.
USPTO Final Rejection for U.S. Appl. No. 09/998,848, dated Aug. 10, 2007; 14 pages.
USPTO Final Rejection for U.S. Appl. No. 09/998,848, dated Nov. 24, 2008; 15 pages.
USPTO Final Rejection for U.S. Appl. No. 09/998,859, dated Nov. 19, 2003; 5 pages.
USPTO Final Rejection for U.S. Appl. No. 10/001,477, dated Jun. 30, 2008; 15 pages.
USPTO Final Rejection for U.S. Appl. No. 10/001,477, dated Jul. 23, 2007; 16 pages.
USPTO Final Rejection for U.S. Appl. No. 10/001,477, dated Aug. 24, 2006; 13 pages.
USPTO Final Rejection for U.S. Appl. No. 10/001,477, dated Oct. 24, 2005; 13 pages.
USPTO Final Rejection for U.S. Appl. No. 10/002,217, dated Feb. 6, 2008; 10 pages.
USPTO Final Rejection for U.S. Appl. No. 10/002,217, dated Mar. 7, 2007; 12 pages.
USPTO Final Rejection for U.S. Appl. No. 10/002,217, dated Nov. 17, 2005; 17 pages.
USPTO Final Rejection for U.S. Appl. No. 10/008,098, dated Feb. 10, 2005; 15 pages.
USPTO Final Rejection for U.S. Appl. No. 10/008,096, dated Jun. 16, 2008; 23 pages.
USPTO Final Rejection for U.S. Appl. No. 10/008,096, dated Sep. 4, 2007; 19 pages.
USPTO Final Rejection for U.S. Appl. No. 10/008,096, dated Oct. 13, 2006; 17 pages.
USPTO Final Rejection for U.S. Appl. No. 10/008,096, dated Nov. 25, 2005; 17 pages.
USPTO Final Rejection for U.S. Appl. No. 10/033,027, dated Jun. 8, 2007; 8 pages.
USPTO Final Rejection for U.S. Appl. No. 10/033,027, dated Aug. 9, 2006; 6 pages.
USPTO Final Rejection for U.S. Appl. No. 10/033,027, dated Oct. 31, 2005; 24 pages.
USPTO Final Rejection for U.S. Appl. No. 10/113,065, dated Oct. 26, 2005; 17 pages.
USPTO Final Rejection for U.S. Appl. No. 10/238,966, dated Sep. 27, 2007; 9 pages.
USPTO Final Rejection for U.S. Appl. No. 11/968,145, dated Aug. 2, 2010; 6 pages.
USPTO Final Rejection for U.S. Appl. No. 09/404,891, dated Dec. 8, 2004; 7 pages.
USPTO Final Rejection for U.S. Appl. No. 09/475,879, dated Oct. 11, 2001; 10 pages.
USPTO Final Rejection for U.S. Appl. No. 09/875,599, dated Feb. 15, 2006; 18 pages.
USPTO Final Rejection for U.S. Appl. No. 09/875,599, dated Mar. 29, 2005; 20 pages.
USPTO Final Rejection for U.S. Appl. No. 09/875,599, dated Apr. 26, 2004; 15 pages.
USPTO Final Rejection for U.S. Appl. No. 09/875,599, dated Aug. 25, 2004; 17 pages.
USPTO Final Rejection for U.S. Appl. No. 09/875,599, dated Nov. 21, 2005; 16 pages.
USPTO Final Rejection for U.S. Appl. No. 09/893,050, dated Aug. 30, 2004; 13 pages.
USPTO Final Rejection for U.S. Appl. No. 09/912,768, dated Nov. 17, 2004; 13 pages.
USPTO Final Rejection for U.S. Appl. No. 09/930,021, dated Aug. 31, 2004; 8 pages.
USPTO Final Rejection for U.S. Appl. No. 09/943,062, dated Jan. 18, 2008; 8 pages.
USPTO Final Rejection for U.S. Appl. No. 09/943,062, dated Apr. 30, 2004; 9 pages.
USPTO Final Rejection for U.S. Appl. No. 09/943,062, dated Jun. 27, 2003; 8 pages.
USPTO Final Rejection for U.S. Appl. No. 09/943,149, dated May 7, 2003; 10 pages.
USPTO Final Rejection for U.S. Appl. No. 09/957,084, dated Jan. 29, 2004; 8 pages.
USPTO Final Rejection for U.S. Appl. No. 09/957,084, dated Apr. 23, 2003; 8 pages.
USPTO Final Rejection for U.S. Appl. No. 09/969,311, dated Apr. 7, 2003; 7 pages.
USPTO Final Rejection for U.S. Appl. No. 09/972,133, dated Mar. 30, 2006; 8 pages.
USPTO Final Rejection for U.S. Appl. No. 09/972,133, dated Jun. 29, 2005; 10 pages.
USPTO Final Rejection for U.S. Appl. No. 09/975,104, dated Feb. 15, 2006; 7 pages.
USPTO Final Rejection for U.S. Appl. No. 09/975,338, dated Jan. 18, 2006; 12 pages.
USPTO Final Rejection for U.S. Appl. No. 09/975,338, dated Jan. 31, 2008; 21 pages.
USPTO Final Rejection for U.S. Appl. No. 09/975,338, dated Feb. 27, 2007; 23 pages.

USPTO Final Rejection for U.S. Appl. No. 09/989,761, dated Aug. 26, 2004; 7 pages.
USPTO Final Rejection for U.S. Appl. No. 09/989,761, dated Oct. 3, 2003; 7 pages.
USPTO Final Rejection for U.S. Appl. No. 09/989,762, dated Jan. 26, 2007; 13 pages.
USPTO Final Rejection for U.S. Appl. No. 09/989,762, dated Mar. 14, 2006; 19 pages.
USPTO Final Rejection for U.S. Appl. No. 10/001,478, dated Apr. 20, 2009; 16 pages.
USPTO Final Rejection for U.S. Appl. No. 10/001,478, dated Jun. 4, 2008; 18 pages.
USPTO Final Rejection for U.S. Appl. No. 10/001,478, dated Sep. 5, 2006; 19 pages.
USPTO Final Rejection for U.S. Appl. No. 10/001,478, dated Sep. 17, 2007; 15 pages.
USPTO Final Rejection for U.S. Appl. No. 10/001,568, dated Oct. 26, 2005; 16 pages.
USPTO Final Rejection for U.S. Appl. No. 10/002,726, dated Mar. 27, 2006; 8 pages.
USPTO Final Rejection for U.S. Appl. No. 10/002,726, dated Nov. 30, 2005; 10 pages.
USPTO Final Rejection for U.S. Appl. No. 10/004,039, dated Nov. 22, 2005; 19 pages.
USPTO Final Rejection for U.S. Appl. No. 10/004,197, dated Nov. 23, 2005; 17 pages.
USPTO Final Rejection for U.S. Appl. No. 10/011,214, dated Jan. 21, 2005; 8 pages.
USPTO Final Rejection for U.S. Appl. No. 10/113,064, dated Oct. 18, 2005; 22 pages.
USPTO Final Rejection for U.S. Appl. No. 10/137,497, dated Mar. 13, 2006; 15 pages.
USPTO Final Rejection for U.S. Appl. No. 10/137,497, dated May 5, 2005; 13 pages.
USPTO Final Rejection for U.S. Appl. No. 10/272,231, dated Nov. 5, 2003; 5 pages.
USPTO Final Rejection for U.S. Appl. No. 10/288,003, dated Oct. 6, 2004; 6 pages.
USPTO Final Rejection for U.S. Appl. No. 10/305,583, dated Oct. 21, 2004; 7 pages.
USPTO Final Rejection for U.S. Appl. No. 10/871,582, dated Feb. 1, 2006; 5 pages.
USPTO Final Rejection for U.S. Appl. No. 11/200,619, dated Mar. 3, 2009; 14 pages.
USPTO Final Rejection for U.S. Appl. No. 11/201,627, dated Apr. 29, 2008; 21 pages.
USPTO Final Rejection for U.S. Appl. No. 11/201,922, dated Apr. 30, 2008; 10 pages.
USPTO Final Rejection for U.S. Appl. No. 11/273,708, dated Jul. 5, 2007; 8 pages.
USPTO Final Rejection for U.S. Appl. No. 11/322,044, dated Sep. 21, 2007; 14 pages.
USPTO Final Rejection for U.S. Appl. No. 11/337,272, dated Feb. 2, 2007; 11 pages.
USPTO Final Rejection for U.S. Appl. No. 11/415,588, dated Oct. 19, 2007; 8 pages.
USPTO Final Rejection for U.S. Appl. No. 11/644,100, dated Nov. 18, 2008; 12 pages.
USPTO Final Rejection for U.S. Appl. No. 11/898,660, dated May 28, 2009; 12 pages.
USPTO Final Rejection for U.S. Appl. No. 11/857,947, dated Oct. 14, 2009; 22 pages.
USPTO Final Rejection for U.S. Appl. No. 11/963,661, dated Sep. 4, 2012; 26 pages.
USPTO Final Rejection for U.S. Appl. No. 12/060,176, dated Jan. 24, 2012; 25 pages.
USPTO Final Rejection for U.S. Appl. No. 13/099,334, dated Oct. 17, 2012; 5 pages.
USPTO Miscellaneous Action for U.S. Appl. No. 09/943,062, dated Jan. 30, 2006; 2 pages.
USPTO Miscellaneous Action for U.S. Appl. No. 09/989,819, dated Dec. 14, 2001; 1 page.
USPTO Miscellaneous Action for U.S. Appl. No. 10/327,217, dated Feb. 10, 2004; 1 page.
USPTO Misscelianeous Action with SSP for U.S. Appl. No. 09/930,021, dated Oct. 1, 2001; 1 page.
USPTO Non-Final Rejection for U.S. Appl. No. 10/001,477 dated May 11, 2005; 10 pages.
USPTO Non-Final Office Rejection for U.S. Appl. No. 10/002,217, dated Oct. 2, 2006; 21 pages.
USPTO Non-Final Office Rejection for U.S. Appl. No. 10/002,217, dated May 19, 2005; 15 pages.
USPTO Non-Final Rejection for U.S. Appl. No. 09/975,105, dated Jan. 19, 2006; 5 pages.
USPTO Non-Final Rejection for U.S. Appl. No. 09/975,105, dated Apr. 19, 2005; 9 pages.
USPTO Non-Final Rejection for U.S. Appl. No. 09/975,115, dated Jan. 7, 2008; 30 pages.
USPTO Non-Final Rejection for U.S. Appl. No. 09/975,115, dated Jan. 11, 2006; 15 pages.
USPTO Non-Final Rejection for U.S. Appl. No. 09/975,115, dated Feb. 11, 2005; 86 pages.
USPTO Non-Final Rejection for U.S. Appl. No. 09/975,115, dated Jul. 27, 2005; 11 pages.
USPTO Non-Final Rejection for U.S. Appl. No. 09/975,115, dated Jul. 31, 2007; 28 pages.
USPTO Non-final Rejection for U.S. Appl. No. 09/975,115, dated Oct. 9, 2008; 34 pages.
USPTO Non-Final Rejection for U.S. Appl. No. 09/975,115, dated Oct. 31, 2006; 19 pages.
USPTO Non-Final Rejection for U.S. Appl. No. 09/989,765, dated Sep. 19, 2007; 14 pages.
USPTO Non-Final Rejection for U.S. Appl. No. 09/989,765, dated Sep. 26, 2008; 17 pages.
USPTO Non-Final Rejection for U.S. Appl. No. 09/989,765, dated Oct. 2, 2006; 13 pages.
USPTO Non-Final Rejection for U.S. Appl. No. 09/989,765, dated Oct. 5, 2005; 9 pages.
USPTO Non-Final Rejection for U.S. Appl. No. 09/989,767, dated Jul. 2, 2007; 22 pages.
USPTO Non-Final Rejection for U.S. Appl. No. 09/989,767, dated Jul. 17, 2006; 12 pages
USPTO Non-Final Rejection for U.S. Appl. No. 09/989,767, dated Jul. 24, 2008; 21 pages.
USPTO Non-Final Rejection for U.S. Appl. No. 09/989,771, dated May 28, 2008: 14 pages.
USPTO Non-Final Rejection for U.S. Appl. No. 09/989,771, dated Jul. 16, 2007; 14 pages.
USPTO Non-Final Rejection for U.S. Appl. No. 09/989,771, dated Aug. 23, 2006; 7 pages.
USPTO Non-final Rejection for U.S. Appl. No. 09/989,771, dated Sep. 12, 2005; 7 pages.
USPTO Non-Final Rejection for U.S. Appl. No. 09/989,771, dated Sep. 22, 2004; 7 pages.
USPTO Non-Final Rejection for U.S. Appl. No. 09/989,777, dated Apr. 11, 2006; 21 pages.
USPTO Non-Final Rejection for U.S. Appl. No. 09/989,777, dated Jul. 5, 2005; 36 pages.
USPTO Non-Final Rejection for U.S. Appl. No. 09/989,777, dated Sep. 11, 2007; 18 pages.
USPTO Non-Final Rejection for U.S. Appl. No. 09/989,777, dated Sep. 13, 2006; 18 pages.
USPTO Non-Final Rejection for U.S. Appl. No. 09/989,778, dated Mar. 29, 2005; 14 pages.
USPTO Non-Final Rejection for U.S. Appl. No. 09/989,778, dated Jul. 14, 2008; 24 pages.
USPTO Non-Final Rejection for U.S. Appl. No. 09/989,778, dated Jul. 19, 2007; 18 pages.
USPTO Non-Final Rejection for U.S. Appl. No. 09/989,778, dated Sep. 1, 2005; 10 pages.
USPTO Non-Final Rejection for U.S. Appl. No. 09/989,778, dated Sep. 18, 2006; 11 pages.
USPTO Non-final Rejection for U.S. Appl. No. 09/989,782, dated Jan. 29, 2007; 9 pages.

USPTO Non-Final Rejection for U.S. Appl. No. 09/989,782, dated Mar. 28, 2006; 8 pages.
USPTO Non-Final Rejection for U.S. Appl. No. 09/989,782, dated Apr. 29, 2005; 11 pages.
USPTO Non-Final Rejection for U.S. Appl. No. 09/989,782, dated Oct. 6, 2004; 11 pages.
USPTO Non-Final Rejection for U.S. Appl. No. 09/989,782, dated Nov. 26, 2008; 10 pages.
USPTO Non-Final Rejection for U.S. Appl. No. 09/989,782, dated Dec. 14, 2007; 8 pages.
USPTO Non-Final Rejection for U.S. Appl. No. 09/992,076, dated Jun. 1, 2005; 20 pages.
USPTO Non-Final Rejection for U.S. Appl. No. 09/992,076, dated Aug. 10, 2006; 19 pages.
USPTO Non-Final Rejection for U.S. Appl. No. 09/992,076, dated Nov. 21, 2005; 29 pages.
USPTO Non-Final Rejection for U.S. Appl. No. 09/994,600, dated May 15, 2007; 14 pages.
USPTO Non-Final Rejection for U.S. Appl. No. 09/994,600, dated Jul. 17, 2006; 14 pages.
USPTO Non-Final Rejection for U.S. Appl. No. 09/994,600, dated Aug. 23, 2005; 13 pages.
USPTO Non-Final Rejection for U.S. Appl. No. 09/994,600, dated Oct. 21, 2004; 37 pages.
USPTO Non-Final Rejection for U.S. Appl. No. 09/994,601, dated Oct. 4, 2007; 20 pages.
USPTO Non-Final Rejection for U.S. Appl. No. 09/994,601, dated Sep. 21, 2005; 12 pages.
USPTO Non-Final Rejection for U.S. Appl. No. 09/994,601, dated Nov. 14, 2006; 15 pages.
USPTO Non-Final Rejection for U.S. Appl. No. 09/994,601, dated Jul. 29, 2004; 10 pages.
USPTO Non-Final Rejection for U.S. Appl. No. 09/998,834, dated Sep. 20, 2004; 11 pages.
USPTO Non-Final Rejection for U.S. Appl. No. 09/998,848, dated Jan. 26, 2006; 17 pages.
USPTO Non-Final Rejection for U.S. Appl. No. 09/998,848, dated Jan. 29, 2007; 13 pages.
USPTO Non-Final Rejection for U.S. Appl. No. 09/998,848, dated Feb. 22, 2008; 15 pages.
USPTO Non-Final Rejection for U.S. Appl. No. 09/998,848, dated Dec. 21, 2004; 14 pages.
USPTO Non-Final Rejection for U.S. Appl. No. 09/998,859, dated May 15, 2003; 6 pages.
USPTO Non-Final Rejection for U.S. Appl. No. 09/998,859, dated May 28, 2003; 6 pages.
USPTO Non-Final Rejection for U.S. Appl. No. 09/998,859, dated Nov. 4, 2004; 6 pages.
USPTO Non-Final Rejection for U.S. Appl. No. 10/001,477, dated Jan. 22, 2007; 15 pages.
USPTO Non-Final Rejection for U.S. Appl. No. 10/001,477, dated Mar. 2, 2006; 14 pages.
USPTO Non-Final Rejection for U.S. Appl. No. 10/001,477, dated Dec. 6, 2007, 13 pages.
USPTO Non-Final Rejection for U.S. Appl. No. 10/002,217, dated Apr. 3, 2006; 12 pages.
USPTO Non-Final Rejection for U.S. Appl. No. 10/008,096, dated Mar. 7, 2007; 19 pages.
USPTO Non-Final Rejection for U.S. Appl. No. 10/008,096, dated Apr. 17, 2006; 18 pages.
USPTO Non-Final Rejection for U.S. Appl. No. 10/008,096, dated Jun. 14, 2004; 24 pages.
USPTO Non-Final Rejection for U.S. Appl. No. 10/008,096, dated Jun. 24, 2005; 15 pages.
USPTO Non-Final Rejection for U.S. Appl. No. 10/008,096, dated Dec. 12, 2007; 14 pages.
USPTO Non-Final Rejection for U.S. Appl. No. 10/033,027, dated Apr. 20, 2005; 20 pages.
USPTO Non-Final Rejection for U.S. Appl. No. 10/033,027, dated Apr. 26, 2006; 26 pages.
USPTO Non-Final Rejection for U.S. Appl. No. 10/033,027, dated Oct. 18, 2004; 17 pages.
USPTO Non-Final Rejection for U.S. Appl. No. 10/033,027, dated Dec. 18, 2008; 5 pages.
USPTO Non-Final Rejection for U.S. Appl. No. 10/033,027, dated Dec. 21, 2006; 31 pages.
USPTO Non-Final Rejection for U.S. Appl. No. 10/113,065, dated May 20, 2005; 14 pages.
USPTO Non-Final Rejection for U.S. Appl. No. 10/238,966, dated Apr. 6, 2006; 8 pages.
USPTO Non-Final Rejection for U.S. Appl. No. 10/238,966, dated Apr. 19, 2007; 7 pages.
USPTO Non-Final Rejection for U.S. Appl. No. 10/238,966, dated Jun. 30, 2008; 12 pages.
USPTO Non-Final Rejection for U.S. Appl. No. 10/238,966, dated Oct. 20, 2006; 8 pages.
USPTO Non-Final Rejection for U.S. Appl. No. 10/238,966, dated Dec. 26, 2007; 12 pages.
USPTO Non-Final Rejection for U.S. Appl. No. 12/060,176, dated May 1, 2012; 25 pages.
USPTO Non-Final Rejection for U.S. Appl. No. 09/404,891, dated Jan. 5, 2004; 5 pages.
USPTO Non-Final Rejection for U.S. Appl. No. 09/404,891, dated Mar. 5, 2003; 6 pages.
USPTO Non-Final Rejection for U.S. Appl. No. 09/404,891, dated Jun. 25, 2004; 6 pages.
USPTO Non-Final Rejection for U.S. Appl. No. 09/404,891, dated Jul. 10, 2003; 6 pages.
USPTO Non-Final Rejection for U.S. Appl. No. 09/404,891, dated Oct. 11, 2002; 5 pages.
USPTO Non-Final Rejection for U.S. Appl. No. 09/475,808, dated Jun. 6, 2001; 6 pages
USPTO Non-Final Rejection for U.S. Appl. No. 09/475,879, dated Mar. 8, 2001; 6 pages.
USPTO Non-Final Rejection for U.S. Appl. No. 09/826,397, dated Apr. 21, 2004; 6 pages.
USPTO Non-Final Rejection for U.S. Appl. No. 09/855,868, dated Aug. 26, 2004; 7 pages.
USPTO Non-Final Rejection for U.S. Appl. No. 09/875,599, dated May 31, 2006; 18 pages.
USPTO Non Final Rejection for U.S. Appl. No. 09/875,599, dated Oct. 27, 2003; 13 pages.
USPTO Non-Final Rejection for U.S. Appl. No. 09/875,599, dated Dec. 3, 2004, 16 pages.
USPTO Non-Final Rejection for U.S. Appl. No. 09/887,923, dated May 25, 2004; 7 pages.
USPTO Non-Final Rejection for U.S. Appl. No. 09/887,955, dated May 26, 2004; 5 pages.
USPTO Non-Final Rejection for U.S. Appl. No. 09/893,048, dated Jan. 12, 2006; 6 pages.
USPTO Non-Final Rejection for U.S. Appl. No. 09/893,048, dated Jul. 27, 2005, 6 pages.
USPTO Non-Final Rejection for U.S. Appl. No. 09/893,048, dated Oct. 6, 2004; 5 pages.
USPTO Non-Final Rejection for U.S. Appl. No. 09/893,050 dated Jan. 5, 2005; 13 pages.
USPTO Non-Final Rejection for U.S. Appl. No. 09/893,050, dated Jan. 15, 2004; 9 pages.
USPTO Non-Final Rejection for U.S. Appl. No. 09/909,047, dated Jul. 6, 2004; 9 pages.
USPTO Non-Final Rejection for U.S. Appl. No. 09/912,768, dated Apr. 11, 2005; 14 pages.
USPTO Non-Final Rejection for U.S. Appl. No. 09/912,768, dated Jun. 22, 2004; 11 pages.
USPTO Non-Final Rejection for U.S. Appl. No. 09/922,579, dated Aug. 18, 2004, 6 pages.
USPTO Non-Final Rejection for U.S. Appl. No. 09/923,461, dated Jul. 16, 2004; 6 pages.
USPTO Non-Final Rejection for U.S. Appl. No. 09/929,891, dated Sep. 13, 2004; 6 pages.
USPTO Non-Final Rejection for U.S. Appl. No. 09/930,021, dated Apr. 26, 2004; 6 pages.
USPTO Non-Final Rejection for U.S. Appl. No. 09/943,062, dated Jan. 27, 2003; 7 pages.

USPTO Non-Final Rejection for U.S. Appl. No. 09/943,062, dated Jun. 22, 2007; 12 pages.
USPTO Non-Final Rejection for U.S. Appl. No. 09/943,062, dated Sep. 11, 2002; 9 pages.
USPTO Non-Final Rejection for U.S. Appl. No. 09/943,062, dated Dec. 8, 2003; 9 pages.
USPTO Non-Final Rejection for U.S. Appl. No. 09/943,149, dated Aug. 28, 2003; 9 pages.
USPTO Non-Final Rejection for U.S. Appl. No. 09/943,149, dated Nov. 20, 2002; 7 pages.
USPTO Non-Final Rejection for U.S. Appl. No. 09/953,423, dated Feb. 6, 2004; 5 pages.
USPTO Non-Final Rejection for U.S. Appl. No. 09/957,084, dated Aug. 23, 2002, 6 pages.
USPTO Non-Final Rejection for U.S. Appl. No. 09/957,084, dated Aug. 27, 2003; 8 pages.
USPTO Non-Final Rejection for U.S. Appl. No. 09/969,311, dated Sep. 21, 2004; 4 pages.
USPTO Non-Final Rejection for U.S. Appl. No. 09/969,311, dated Nov. 6, 2002; 8 pages.
USPTO Non-Final Rejection for U.S. Appl. No. 09/969,313, dated May 6, 2005; 9 pages.
USPTO Non-Final Rejection for U.S. Appl. No. 09/972,003, dated Feb. 2, 2004; 10 pages.
USPTO Non-Final Rejection for U.S. Appl. No. 09/972,003, dated Aug. 19, 2003; 11 pages.
USPTO Non-Final Rejection for U.S. Appl. No. 09/972,133, dated Mar. 8, 2005; 9 pages.
USPTO Non-Final Rejection for U.S. Appl. No. 09/972,133, dated Nov. 25, 2005; 9 pages.
USPTO Non-Final Refection for U.S. Appl. No. 09/972,319, dated Sep. 16, 2004; 9 pages.
USPTO Non-Final Rejection for U.S. Appl. No. 09/975,030, dated Mar. 29, 2005; 13 pages.
USPTO Non-Final Rejection for U.S. Appl. No. 09/975,030, dated Oct. 20, 2005; 7 pages.
USPTO Non-Final Rejection for U.S. Appl. No. 09/975,104, dated Mar. 21, 2005; 7 pages.
USPTO Non-Final Rejection for U.S. Appl. No. 09/975,104, dated Jun. 16, 2006; 8 pages.
USPTO Non-Final Rejection for U.S. Appl. No. 09/975,104, dated Aug. 16, 2005; 6 pages.
USPTO Non-Final Rejection for U.S. Appl. No. 09/975,338, dated Aug. 14, 2007; 19 pages.
USPTO Non-Final Rejection for U.S. Appl. No. 09/975,338, dated Sep. 6, 2006; 11 pages.
USPTO Non-Final Rejection for U.S. Appl. No. 09/989,761, dated Mar. 10, 2004; 6 pages.
USPTO Non-Final Rejection for U.S. Appl. No. 09/989,761, dated Apr. 18, 2003; 5 pages.
USPTO Non-Final Rejection for U.S. Appl. No. 09/989,762, dated Jul. 23, 2007; 15 pages.
USPTO Non-Final Rejection for U.S. Appl. No. 09/989,762, dated Jul. 27, 2005; 15 pages.
USPTO Non-Final Rejection for U.S. Appl. No. 09/989,762, dated Aug. 10, 2006; 18 pages.
USPTO Non-Final Rejection for U.S. Appl. No. 09/989,767, dated Oct. 6, 2004; 15 pages.
USPTO Non-Final Rejection for U.S. Appl. No. 09/989,771, dated Apr. 30, 2009; 11 pages.
USPTO Non-Final Rejection for U.S. Appl. No. 09/989,808, dated Apr. 14, 2005; 8 pages.
USPTO Non-Final Rejection for U.S. Appl. No. 09/989,808, dated Oct. 19, 2005; 8 pages.
USPTO Non-Final Rejection for U.S. Appl. No. 09/989,819, dated Jul. 13, 2004; 4 pages.
USPTO Non-Final Rejection for U.S. Appl. No. 10/001,478, dated Jan. 30, 2008; 19 pages.
USPTO Non-Final Rejection for U.S. Appl. No. 10/001,478, dated Mar. 15, 2006; 19 pages.
USPTO Non-Final Rejection for U.S. Appl. No. 10/001,478, dated Apr. 2, 2007; 17 pages.
USPTO Non-Final Rejection for U.S. Appl. No. 10/001,478, dated May 16, 2005; 13 pages.
USPTO Non-Final Rejection for U.S. Appl. No. 10/001,478, dated Oct. 20, 2008; 18 pages.
USPTO Non-Final Rejection for U.S. Appl. No. 10/001,568, dated May 19, 2005; 16 pages.
USPTO Non-Final Rejection for U.S. Appl. No. 10/002,217, dated Aug. 3, 2007; 10 pages.
USPTO Non-Final Rejection for U.S. Appl. No. 10/002,726, dated Jun. 10, 2005; 10 pages.
USPTO Non-Final Rejection for U.S. Appl. No. 10/002,726, dated Aug. 28, 2006; 10 pages.
USPTO Non-Final Rejection for U.S. Appl. No. 10/002,726, dated Dec. 13, 2004; 7 pages.
USPTO Non-Final Rejection for U.S. Appl. No. 10/004,039, dated Apr. 11, 2006, 14 pages.
USPTO Non-Final Rejection for U.S. Appl. No. 10/004,039, dated Jun. 6, 2005; 17 pages.
USPTO Non-Final Rejection for U.S. Appl. No. 10/004,197, dated Apr. 3, 2006; 13 pages.
USPTO Non-Final Rejection for U.S. Appl. No. 10/004,197, dated Jun. 6, 2005; 21 pages.
USPTO Non-Final Rejection for U.S. Appl. No. 10/011,214, dated Aug. 13, 2004; 10 pages.
USPTO Non-Final Rejection for U.S. Appl. No. 10/109,979, dated Jun. 30, 2005; 6 pages.
USPTO Non-Final Rejection for U.S. Appl. No. 10/113,064, dated Apr. 6, 2006; 19 pages.
USPTO Non-Final Rejection for U.S. Appl. No. 10/113,064, dated Apr. 25, 2005; 15 pages.
USPTO Non-Final Rejection for U.S. Appl. No. 10/137,497, dated, Aug. 2, 2006; 21 pages.
USPTO Non-Final Rejection for U.S. Appl. No. 10/137,497, dated Sep. 22, 2005; 21 pages.
USPTO Non-Final Rejection for U.S. Appl. No. 10/137,497, dated Nov. 5, 2004; 17 pages.
USPTO Non-Final Rejection for U.S. Appl. No. 10/226,911, dated Mar. 19, 2004; 6 pages.
USPTO Non-Final Rejection for U.S. Appl. No. 10/272,231, dated Jul. 14, 2003; 6 pages.
USPTO Non-Final Rejection for U.S. Appl. No. 10/293,392, dated Oct. 16, 2003; 6 pages.
USPTO Non-Final Rejection for U.S. Appl. No. 10/305,589, dated Oct. 7, 2003; 6 pages
USPTO Non-Final Rejection for U.S. Appl. No. 10/324,455, dated Aug. 21, 2013; 4 pages.
USPTO Non-Final Rejection for U.S. Appl. No. 10/324,455, dated Nov. 6, 2003; 4 pages.
USPTO Non-Final Rejection for U.S. Appl. No. 10/327,217, dated Apr. 30, 2004; 5 pages.
USPTO Non-Final Rejection for U.S. Appl. No. 10/653,050, dated Apr. 6, 2004; 7 pages.
USPTO Non-Final Rejection for U.S. Appl. No. 10/803,030, dated Jun. 8, 2005; 4 pages.
USPTO Non-Final Rejection for U.S. Appl. No. 10/871,582, dated Sep. 7, 2005; 7 pages.
USPTO Non-Final Rejection for U.S. Appl. No. 11/088,028, dated Jun. 16, 2006; 8 pages.
USPTO Non-Final Rejection for U.S. Appl. No. 11/125,554, dated Dec. 11, 2006, 9 pages.
USPTO Non-Final Rejection for U.S. Appl. No. 11/132,894, dated Dec. 19, 2006; 12 pages.
USPTO Non-Final Rejection for U.S. Appl. No. 11/200,619, Aug. 27, 2000; 13 pages.
USPTO Non-Final Rejection for U.S. Appl. No. 11/201,627, dated Nov. 16, 2007; 16 pages.
USPTO Non-Final Rejection for U.S. Appl. No. 11/201,627, dated Dec. 12, 2008; 17 pages.
USPTO Non-Final Rejection for U.S. Appl. No. 11/201,922, dated Oct. 15, 2007; 10 pages.
USPTO Non-Final Rejection for U.S. Appl. No. 11/201,922, dated Oct. 21, 2008; 12 pages.

USPTO Non Final Rejection for U.S. Appl. No. 11/273,708, dated Mar. 19, 2007; 16 pages.
USPTO Non-Final Rejection for U.S. Appl. No. 11/322,044, dated Apr. 11, 2008, 11 pages.
USPTO Non-Final Rejection for U.S. Appl. No. 11/322,044, dated Apr. 24, 2007; 13 pages.
USPTO Non-Final Rejection for U.S. Appl. No. 11/322,044, dated May 4, 2009: 18 pages.
USPTO Non-Final Rejection for U.S. Appl. No. 11/322,044, dated Nov. 25, 2008; 15 pages.
USPTO Non-Final Rejection for U.S. Appl. No. 11/337,272, dated May 17, 2007, 11 pages.
USPTO Non-Final Rejection for U.S. Appl. No. 11/337,272, dated Oct. 24, 2006; 9 pages.
USPTO Non-Final Rejection for U.S. Appl. No. 11/415,588, dated Jun. 13, 2007; 8 pages.
USPTO Non-Final Rejection for U.S. Appl. No. 11/644,100, dated Mar. 9, 2009; 11 pages.
USPTO Non-Final Rejection for U.S. Appl. No. 11/644,101, dated Apr. 14, 2008; 10 pages.
USPTO Non-Final Rejection for U.S. Appl. No. 11/698,660, dated Dec. 2, 2008; 12 pages.
USPTO Non-Final Rejection for U.S. Appl. No. 11/709,868, dated Nov. 7, 2008; 14 pages.
USPTO Non-Final Rejection for U.S. Appl. No. 11/850,260, dated Mar. 6, 2009; 7 pages.
USPTO Non-final Rejection for U.S. Appl. No. 11/857,947, dated Feb. 3, 2010; 23 pages.
USPTO Non-Final Rejection for U.S. Appl. No. 11/857,947, dated Mar. 30, 2009; 18 pages.
USPTO Non-Final Rejection for U.S. Appl. No. 11/857,947, dated Jul. 21, 2010; 15 pages.
USPTO Non-Final Rejection for U.S. Appl. No. 11/859,547, dated Oct. 1, 2009; 9 pages.
USPTO Non-Final Rejection for U.S. Appl. No. 11/865,672, dated Jul. 17, 2009; 6 pages.
USPTO Non-Final Rejection for U.S. Appl. No. 11/963,661, dated May 15, 2012; 19 pages.
USPTO Non-Final Rejection for U.S. Appl. No. 11/965,291, dated Dec. 17, 2008; 8 pages.
USPTO Non-Final Rejection for U.S. Appl. No. 11/965,677, dated Mar. 10, 2009; 10 pages.
USPTO Non-Final Rejection for U.S. Appl. No. 11/967,240, dated Jun. 10, 2009; 7 pages.
USPTO Non-Final Rejection for U.S. Appl. No. 11/967,243, dated Sep. 17, 2009; 9 pages.
USPTO Non-Final Rejection for U.S. Appl. No. 11/968,145, dated Jan. 5, 2011; 8 pages.
USPTO Non-Final Rejection for U.S. Appl. No. 11/968,145, dated Mar. 4, 2010; 11 pages.
USPTO Non-Final Rejection for U.S. Appl. No. 11/983,291, dated Mar. 9, 2009; 9 pages.
USPTO Non-Final Rejection for U.S. Appl. No. 12/060,128, dated Apr. 29, 2009; 11 pages.
USPTO Non-Final Rejection for U.S. Appl. No. 12/060,176, dated Nov. 20, 2012; 26 pages.
USPTO Non-Final Rejection for U.S. Appl. No. 12/104,672, dated Aug. 26, 2009; 11 pages.
USPTO Non-Final Rejection for U.S. Appl. No. 12/218,404, dated Sep. 30, 2008; 8 pages.
USPTO Non-Final Rejection for U.S. Appl. No. 13/099,334, dated May 25, 2012; 12 pages.
USPTO Non-Final Rejection for U.S. Appl. No. 13/303,112, dated Oct. 11, 2012; 20 pages.
USPTO Non-Final Rejection for U.S. Appl. No. 09/975,338, dated Apr. 5, 2005; 13 pages.
USPTO Non-Final Rejection for U.S. Appl. No. 10/288,003, dated Apr. 7, 2004; 9 pages.
USPTO Notice of Allowance for U.S. Appl. No. 09/975,105, dated Dec. 4, 2006; 4 pages.
USPTO Notice of Allowance for U.S. Appl. No. 09/989,777, dated Jul. 7, 2008; 23 pages.
USPTO Notice of Allowance for U.S. Appl. No. 09/989,777, dated Sep. 15, 2008; 28 pages.
USPTO Notice of Allowance for U.S. Appl. No. 09/989,777, dated Nov. 4, 2008; 3 pages.
USPTO Notice of Allowance for U.S. Appl. No. 09/992,076, dated Nov. 13, 2008; 15 pages.
USPTO Notice of Allowance for U.S. Appl. No. 09/992,076, dated Nov. 29, 2007; 8 pages.
USPTO Notice of Allowance for U.S. Appl. No. 09/992,076, dated Mar. 26, 2008; 23 pages.
USPTO Notice of Allowance for U.S. Appl. No. 09/992,076, dated Jul. 29, 2008; 6 pages.
USPTO Notice of Allowance for U.S. Appl. No. 09/994,600, dated May 14, 2008; 22 pages.
USPTO Notice of Allowance for U.S. Appl. No. 09/994,600, dated Nov. 12, 2008; 35 pages.
USPTO Notice of Allowance for U.S. Appl. No. 09/994,601, dated Dec. 22, 2008; 15 pages.
USPTO Notice of Allowance for U.S. Appl. No. 09/998,834, dated May 19, 2005; 7 pages.
USPTO Notice of Allowance for U.S. Appl. No. 09/998,859, dated Mar. 14, 2005; 6 pages.
USPTO Notice of Allowance for U.S. Appl. No. 10/001,477, dated Nov. 10, 2008; 7 pages.
USPTO Notice of Allowance for U.S. Appl. No. 10/002,217, dated Jan. 28, 2009; 4 pages.
USPTO Notice of Allowance for U.S. Appl. No. 10/002,217, dated Jun. 6, 2008; 7 pages.
USPTO Notice of Allowance for U.S. Appl. No. 10/008,096, dated Dec. 22, 2008; 24 pages.
USPTO Notice of Allowance for U.S. Appl. No. 10/033,027, dated Mar. 31, 2009; 7 pages.
USPTO Notice of Allowance for U.S. Appl. No. 10/113,065, dated Apr. 6, 2006; 8 pages.
USPTO Notice of Allowance for U.S. Appl. No. 10/238,966, dated Jan. 27, 2009; 4 pages.
USPTO Notice of Allowance for U.S. Appl. No. 09/404,891, dated Mar. 4, 2005; 6 pages.
USPTO Notice of Allowance for U.S. Appl. No. 09/475,808, dated Nov. 6, 2001; 8 pages.
USPTO Notice of Allowance for U.S. Appl. No. 09/475,879, dated Oct. 22, 2004; 7 pages.
USPTO Notice of Allowance for U.S. Appl. No. 09/826,397, dated Oct. 7, 2004; 8 pages.
USPTO Notice of Allowance for U.S. Appl. No. 09/855,868, dated Apr. 25, 2005; 6 pages.
USPTO Notice of Allowance for U.S. Appl. No. 09/875,599, dated Oct. 17, 2006; 4 pages.
USPTO Notice of Allowance for U.S. Appl. No.09/887,923, dated Sep. 27, 2004; 5 pages.
USPTO Notice of Allowance for U.S. Appl. No. 09/887,955, dated Oct. 12, 2004; 5 pages.
USPTO Notice of Allowance for U.S. Appl. No. 09/893,048, dated Jul. 25, 2006; 4 pages.
USPTO Notice of Allowance for U.S. Appl. No. 09/893,050, dated Jul. 5, 2005; 6 pages.
USPTO Notice of Allowance for U.S. Appl. No. 09/909,047, dated Feb. 15, 2005; 6 pages.
USPTO Notice of Allowance for U.S. Appl. No. 09/909,047, dated May 11, 2005; 25 pages.
USPTO Notice of Allowance for U.S. Appl. No. 09/912,768, dated Sep. 13, 2005; 5 pages.
USPTO Notice of Allowance for U.S. Appl. No. 09/922,579, dated Dec. 28, 2004; 6 pages.
USPTO Notice of Allowance for U.S. Appl. No. 09/923,461, dated May 12, 2005; 6 pages.
USPTO Notice of Allowance for U.S. Appl. No. 09/929,891, dated Jun. 15, 2005; 6 pages.
USPTO Notice of Allowance for U.S. Appl. No. 09/929,891, dated Dec. 23, 2005; 4 pages.
USPTO Notice of Allowance for U.S. Appl. No. 09/930,021, dated Nov. 26, 2004; 4 pages.

USPTO Notice of Allowance for U.S. Appl. No. 09/943,149, dated Jan. 12, 2004; 7 pages.
USPTO Notice of Allowance for U.S. Appl. No. 09/953,423, dated Jul. 12, 2004; 6 pages.
USPTO Notice of Allowance for U.S. Appl. No. 09/957,084, dated May 18, 2004; 5 pages.
USPTO Notice of Allowance for U.S. Appl. No. 09/969,311, dated Mar. 1, 2005; 4 pages.
USPTO Notice of Allowance for U.S. Appl. No. 09/969,313, dated Oct. 4, 2005; 6 pages.
USPTO Notice of Allowance for U.S. Appl. No. 09/972,003, dated Jul. 14, 2004; 4 pages.
USPTO Notice of Allowance for U.S. Appl. No. 09/972,133, dated Jun. 9, 2006; 6 pages.
USPTO Notice of Allowance for U.S. Appl. No. 09/972,319, dated Dec. 30, 2004; 4 pages.
USPTO Notice of Allowance for U.S. Appl. No. 09/975,030, dated Feb. 6, 2006; 7 pages.
USPTO Notice of Allowance for U.S. Appl. No. 09/975,104; dated Oct. 19, 2006; 6 pages.
USPTO Notice of Allowance for U.S. Appl. No. 09/977,111, dated Sep. 28, 2006; 6 pages.
USPTO Notice of Allowance for U.S. Appl. No. 09/989,761, dated Jan. 14, 2005; 6 pages.
USPTO Notice of Allowance for U.S. Appl. No. 09/989,762, dated Jan. 2, 2008; 6 pages.
USPTO Notice of Allowance for U.S. Appl. No. 09/989,762, dated Mar. 25, 2009; 7 pages.
USPTO Notice of Allowance for U.S. Appl. No. 09/969,762, dated Jun. 2, 2008; 6 pages.
USPTO Notice of Allowance for U.S. Appl. No. 09/989,962, dated Oct. 24, 2008; 7 pages.
USPTO Notice of Allowance for U.S. Appl. No. 09/989,777, dated Mar. 9, 2009; 7 pages.
USPTO Notice of Allowance for U.S. Appl. No. 09/989,808, dated Feb. 13, 2006; 4 pages.
USPTO Notice of Allowance for U.S. Appl. No. 09/989,819, dated Jan. 11, 2005; 7 pages.
USPTO Notice of Allowance for U.S. Appl. No. 09/992,076, dated Feb. 27, 2009; 6 pages.
USPTO Notice of Allowance for U.S. Appl. No. 09/994,600, dated Apr. 3, 2009; 5 pages.
USPTO Notice of Allowance for U.S. Appl. No. 10/001,477, dated May 8, 2009; 6 pages.
USPTO Notice of Allowance for U.S. Appl. No. 10/001,568, dated Mar. 17, 2006; 9 pages.
USPTO Notice of Allowance for U.S. Appl. No. 10/002,217, dated Oct. 14, 2008.
USPTO Notice of Allowance for U.S. Appl. No. 10/002,726, dated Feb. 6, 2007; 7 pages.
USPTO Notice of Allowance for U.S. Appl. No. 10/004,039, dated Aug. 15, 2006; 7 pages.
USPTO Notice of Allowance for U.S. Appl. No. 10/004,197, dated Feb. 9, 2007; 7 pages.
USPTO Notice of Allowance for U.S. Appl. No. 10/004,197, dated Oct. 6, 2006; 7 pages.
USPTO Notice of Allowance for U.S. Appl. No. 10/011,214, dated Apr. 11, 2005; 4 pages.
USPTO Notice of Allowance for U.S. Appl. No. 10/024,093, dated Sep. 10, 2002; 3 pages.
USPTO Notice of Allowance for U.S. Appl. No. 10/109,979, dated Mar. 14, 2006; 6 pages.
USPTO Notice of Allowance for U.S. Appl. No. 10/113,064, dated Sep. 21, 2006; 7 pages.
USPTO Notice of Allowance for U.S. Appl. No. 10/137,497, dated Jan. 24, 2007; 12 pages.
USPTO Notice of Allowance for U.S. Appl. No. 10/137,497, dated Jul. 20, 2007; 4 pages.
USPTO Notice of Allowance for U.S. Appl. No. 10/226,911, dated Aug. 20, 2004; 4 pages.
USPTO Notice of Allowance for U.S. Appl. No. 10/272,231, dated Mar. 8, 2004; 6 pages.
USPTO Notice of Allowance for U.S. Appl. No. 10/288,003, dated Jan. 14, 2005; 6 pages.
USPTO Notice of Allowance for U.S. Appl. No. 10/293,392, dated Mar. 10, 2004; 6 pages.
USPTO Notice of Allowance for U.S. Appl. No. 10/305,589, dated Feb. 4, 2005; 5 pages.
USPTO Notice of Allowance for U.S. Appl. No. 10/324,455, dated Feb. 12, 2004; 4 pages.
USPTO Notice of Allowance for U.S. Appl. No. 10/327,217, dated Aug. 12, 2004; 6 pages.
USPTO Notice of Allowance for U.S. Appl. No. 10/653,050, dated Jul. 29, 2004; 3 pages.
USPTO Notice of Allowance for U.S. Appl. No. 10/803,030, dated Jan. 8, 2007; 6 pages.
USPTO Notice of Allowance for U.S. Appl. No. 10/871,582, dated Mar. 30, 2006, 6 pages.
USPTO Notice of Allowance for U.S. Appl. No. 11/088,028, dated Jan. 26, 2007; 6 pages.
USPTO Notice of Allowance for U.S. Appl. No. 11/088,028, dated Jul. 2, 2007; 6 pages.
USPTO Notice of Allowance for U.S. Appl. No. 11/125,554, dated Feb. 7, 2008; 4 pages.
USPTO Notice of Allowance for U.S. Appl. No. 11/125,554, dated Apr. 24, 2007; 7 pages.
USPTO Notice of Allowance for U.S. Appl. No. 11/132,894, dated Apr. 26, 2007; 4 pages.
USPTO Notice of Allowance for U.S. Appl. No. 11/201,922, dated Apr. 9, 2009; 4 pages.
USPTO Notice of Allowance for U.S. Appl. No. 11/273,708, dated Mar. 9, 2007; 4 pages.
USPTO Notice of Allowance for U.S. Appl. No. 11/337,272, dated Aug. 15, 2007; 9 pages.
USPTO Notice of Allowance for U.S. Appl. No. 11/415,588, dated Mar. 11, 2008; 6 pages.
USPTO Notice of Allowance for U.S. Appl. No. 11/709,866, dated Apr. 7, 2009; 8 pages.
USPTO Notice of Allowance for U.S. Appl. No. 11/857,947, dated Jul. 8, 2011; 7 pages.
USPTO Notice of Allowance for U.S. Appl. No. 11/857,947, dated Dec. 23, 2011; 7 pages.
USPTO Notice of Allowance for U.S. Appl. No. 11/965,291, dated May 5, 2009, 7 pages.
USPTO Notice of Allowance for U.S. Appl. No. 11/965,677, dated Sep. 10, 2009; 6 pages.
USPTO Notice of Allowance for U.S. Appl. No. 11/985,340, dated Jun. 2, 2009; 7 pages.
USPTO Notice of Allowance for U.S. Appl. No. 11/986,338, dated May 7, 2009; 1 page.
USPTO Notice of Allowance for U.S. Appl. No. 12/218,404, dated Mar. 19, 2009; 7 pages.
USPTO Notice of Allowance for U.S. Appl. No. 13/099,334, dated Nov. 23, 2012; 7 pages.
USPTO Notice of Allowance for U.S. Appl. No. 13/197,624, dated Nov. 30, 2012; 7 pages.
USPTO Requirement for Restriction for U.S. Appl. No. 11/985,340, dated Mar. 16, 2009; 7 pages.
USPTO Requirement for Restriction/Election for U.S. Appl. No. 09/969,313, dated Mar. 18, 2005; 6 pages.
USPTO Requirement for Restriction/Election for U.S. Appl. No. 09/927,003, dated May 6, 2004; 4 pages.
USPTO Requirement for Restriction/Election for U.S. Appl. No. 11/337,272, dated Sep. 11, 2006; 5 pages.
USPTO Requirement for Restrictiont/Election for U.S. Appl. No. 11/818,005, dated Jul. 14, 2009; 5 pages.
Van Ess, David; "Simulating a 555 Timer with PSoC," Cypress Semiconductor Corporation, Application Note AN2286, May 19, 2005; 10 pages.
Varma at al., "A Structured Test Re-Use Methodology for Core-Based System Chips," IEEE, 1998; 9 pages.
Wang, et al. "Synthesizing Operating System Based Device Drivers in Embedded Systems," Oct. 1-3, 2003; ACM pp. 37-44; 8 pages.

Wikipedia—Main Page, retrieved on. Mar. 8, 2006 from http://en.wikipedia.org/wiki/Main_Page and http://en.wikipedia.org/wiki/Wikipedia:Introduction; 5 pages.
Wikipedia—Processor register, retrieved on March 7, 2006 from http://en.wikipedia.org/wiki/Processor_register; 4 pages.
Wikipedia "XML" retrieved on Jan. 29, 2007 from http://en.wikipedia.org/wiki/XML; 16 pages.
Wikipedia.org; "Von Neumann architecture"; retrieved from http://en.wikipedia.org/wiki/Von_Neumann_architecture on Jan. 22, 2007; 4 pages.
Written Opinion of the international Search Authority for International Application No. PCT/US08/60680, dated Aug. 15, 2008; 4 pages.
Written Opinion of the International Searching Authority for International Application No. PCT/US08/60681 dated Sep. 12, 2008; 4 pages.
Written Opinion of the International Searching Authority for International Application No. PCT/US08/60695 dated Jul. 22, 2009; 6 pages.
Written Opinion of the International Searching Authority for International Application No. PCT/US08/60696, dated Sep. 22, 2008; 4 pages.
Xerox, "Mesa Debugger Documentation," Apr. 1979; Xerox Systems Development Department Version 5.0, pp. 1-30, 33 pages.
Xilinx, Virtex-II Pro Platform FPGA Developer's Kit, "How Data2BRAM Fits in with Hardware and Software Flows," Chapter 2: Using Data2BRAM, Jan. 2003 Release; 2 pages.
Yoo et al.: "Fast Hardware-Software Converification by Optimistic Execution of Real Processor, Proceedings of Design, Autimation and Test in Europe Conference and Exhibition," Mar. 2000, pp. 663-668; 6 pages.
York et al., "On-chip Support Needed for SOC Debug," Electronic Engineering Times, Jun. 1999. pp. 104, 110; 2 pages.
Zorian et al.: "Testing Embedded-Core Based System Chips," IEEE, 1998; 14 pages.
Zorian. "Test Requirerrtents for Embedded Core-based Systems and IEEE P1500," IEEE, 1997; 9 pages.
U.S. Appl. No. 11/963,661,"Universal Digital Block With Integrated Arithmetic Logic Unit," Warren Snyder et al., filed Dec. 21, 2007; 30 pages.
U.S. Appl. No. 11/965,677, "System Level Interconnect With Programmable Switching," Bert Sullam et al., filed Dec. 27, 2007; 47 pages.
U.S. Appl. No. 12/060,176, "Programmable System-On-Chip Hub," Scott Allen Swindle et al., filed Mar. 31, 2008; 39 pages.
U.S. Appl. No. 12/786,412, "Universal Digital Block Interconnection and Channel Routing," Warren Snyder et al., filed May 24, 2010; 31 pages.
Application No. PCT/US08/60873 "Clock Driven Dynamic Datapath Chaining," filed Apr. 17, 2008; 24 pages.
Application No. PCT/US08/60880 "Universal Digital Block Interconnection and Channel Routing," filed Apr. 17, 2008; 25 pages.
Application No. PCT/US08/60685 "Universal Digital Block With Integrated Arithmetic Logic Unit," filed Apr. 17, 2008; 24 pages.
Application No. PCT/08/60686 "Programmable System-On-Chip Hub," filed Apr. 17, 2008; 22 pages.
Application No. PCT/US08/60695 "System Level Interconnect With Programmable Switching," filed Apr. 17, 2008; 41pages.
Application No. PCT/US08/60696 "Dynamically Configurable and Re-Configurable Data Path,"filed Apr. 17, 2008; 29 pages.
International Search Report for International Application No. PCT/US08/60680 dated Aug. 15, 2008; 2 pages.
International Search Report for International Application No. PCT/US08/60685 dated Sep. 17, 2008; 2 pages.
International Search Report for International Application No. PCT/US08/60695 dated Jul. 22, 2009; 3 pages.
International Search Report for International Application No. PCT/US08/60696 dated Sep. 22, 2008; 2 pages.
SIPO 4 month Office Action for Application No. 200880012232.1 dated May 6, 2011; 3 pages.
USPTO Final Rejection for U.S. Appl. No. 11/963,661, dated May 6, 2011; 7 pages.
USPTO Final Rejection for U.S. Appl. No. 12/060 176, dated Mar. 30, 2010; 22 pages.
USPTO Final Rejection for U.S. Appl. No. 12/060,176, dated Oct. 12, 2010; 22 pages.
USPTO Final Rejection for U.S. Appl. No. 12/060,176, dated Nov. 8, 2011; 24 page.
USPTO Non-Final Rejection for U.S. Appl. No. 12/060,176, dated Mar. 30, 2010; 22 pages.
USPTO Non-Final Rejection for U.S. Appl. No. 12/060,176, dated Apr. 6, 2011; 23 pages.
USPTO Non-Final Rejection for U.S. Appl. No. 12/786,412, dated Jan. 31, 2011; 1 page.
USPTO Notice of Allowance for U.S. Appl. No. 11/965,291, dated Apr. 15, 2010; 4 pages.
USPTO Notice of Allowance for U.S. Appl. No. 11/965,291, dated Sep. 21, 2009; 7 pages.
USPTO Notice of Allowance for U.S. Appl. No. 11/965,291, dated Oct. 5, 2009; 2 pages.
USPTO Notice of Allowance for U.S. Appl. No. 11/965,291, dated Jan. 13, 2010; 4 pages.
USPTO Notice of Allowance for U.S. Appl. No. 11/965,677, dated Feb. 12, 2010; 4 pages
USPTO Notice of Allowance for U.S. Appl. No. 11/965,677, dated May 12, 2011; 5 pages.
USPTO Notice of Allowance for U.S. Appl. No. 11/965,677, dated May 19, 2010; 4 pages.
USPTO Notice of Allowance for U.S. Appl. No. 11/965,677, dated Sep. 15, 2010; 4 pages.
USPTO Notice of Allowance for U.S. Appl. No. 11/965,677, dated Nov. 2, 2009; 4 pages.
Written Opinion of the International Searching Authority for International Application No. PCT/US08/60680 mailed Aug. 15, 2008; 4 pages.
Written Opinion of the International Searching Authority for International Application No. PCT/US08/60685 mailed Sep. 17, 2008; 4 pages.
Written Opinion of the International Searching Authority for International Application No. PCT/US08/60695 mailed Jul. 22, 2009; 6 pages.
Written Opinion of the International Searching Authority for International Application No. PCT/US08/60696 mailed Sep. 22, 2008; 4 pages.
"An Analog PPL-Based Clock and Data Recovery Circuit with High Input Jitter Tolerance;" Sun, Reprinted from IEEE Journal of Solid-State Circuits, 1989; 4 pages.
"Electronic Circuit Protector-Circuit Breaker:" IBM Technical Disclosure Bulletin: vol. 36, Issue 8, Aug. 1, 1993; 1 page.
"In-Circuit Emulators—descriptions of the major ICEs around,"retrieved on Nov. 14, 2005 from http://www.algonet.se/~taffann/developer/emulator.htm; 6 pages.
"Microsoft Files Summary Judgement Motions"; Feb. 1999; Microsoft PressPass. retrieved on May 20, 2005 from http://www.microsoft.com/presspass/press/1999/feb99/Feb99/Calderapr.asp; 3 pages.
"New Object Domain R3 Beta Now Available (Build 134)!" Mar. 13, 2001; http://web.archive.org/web/200100331202605/www.objectdomain.com/domain30/index.html; 2 pages.
"OMG XML Metadata Interchange (XMI) Specifications" 2000; 17 pages.
"POD—Piece of Data, Plain Old Documentation, Plain Old Dos . . .";  retrieved on Nov. 14, 2005 from http://www.auditmypc.com/acronym/POD.asp; 2 pages.
"PSoC Designer: Integrated Development Environment User Guide", Jul. 17, 2001; Cypress MicroSystems, Revision 1.11; all pages.
"PSoC designer: Integrated development environment, getting stetted 25-minute tutorial, version 1.0," Cypress , Microsystems., Cypress Microsystems, Inc. CMS10006A, Jul. 3, 2001; 25 pages.
"PSoC technology complete changes 8-bit MCU system design", Cypress Microsystems, Inc. retrieved from <http>://www.archive.org/web/20010219005250/http://cypressmicro.com-/t . . .>, Feb. 19, 2001, 21 pages.

"The Gemini Netlist Comparison Project;" <http://www.cs.washington.edu/research/projects/lis/www/gemini/gemini.html> larry@cs.washington.edu; Mar. 19, 2002; 2 pages.

"VHDL Samples" retrieved on Jan. 29, 2007 from http://www.csee.umbc.edu/help/VHDL/samples/sample.shtml; 10 pages.

"Webster's Third New International Dictionary," 1996, G. & C. Merriam Company; 3 pages (including pp. 1328-1329).

Adham et al., "Preliminary Outline of the IEEE P1500 Scalable Architecture for Testing Embedded Cores," 1999, IEEE; 6 pages.

Andrew S. Tanenbaum with contributions from James R. Goodman, "Structured Computer Organization," 1999, Prentice Hall, Fourth Edition; 32 pages.

Andrews, "Roadmap for Extending IEEE 1149.1 for Hierarchical Control of Locally Stored, Standardized command Set, Test Programs," IEEE, 1994; 7 pages.

Anonymous, "F/Port;Fast Parallel Port for the PC" Installation Manual Release 7.1, circa 1997, available for download from http://www.fapo.com/fport.htm; 25 pages.

Anonymous. "JEEN JTAG Embedded Ice Ethernet Interface," Aug. 1999, Ernbedded Performance, Inc.; 3 pages.

Anonymous, "Lotus Notes FAQ—How do you generate unique document numbers?" Sep. 19, 1999; retrieved from www.keysolutions.com on Jul. 9, 2008; 1 page.

Anonymous, "Warp Nine Engineering—The IEEE 1284 Experts-F/Port Product Sheet" undated web page found at http://www.fapo.com/fport.htm; printed on Apr. 12, 2005; 2 pages.

Anonymous; "Using Debug"; 1999; Prentice-Hall Publishing; 20 pages.

U.S. Appl. No. 09/207,912, "Circuit(s), Architecture and Method(s) for Operating and/or Tuning a Ring; Oscillator,"Monte Mar, filed Dec. 9, 1998; 23 pages.

U.S. Appl. No. 09/747,281, "Linearized Digital Phase-Locked Loop Method," Williams et al.; filed Dec. 21, 2000; 29 pages.

U.S. Appl. No. 09/842,966, "Precision Crystal Oscillator Circuit Used in Microcontroller," Monte Mar, filed Apr. 25, 2001; 28 pages.

U.S. Appl. No. 09/943,062, "Apparatus and Method for Programmable Power Management in a Programmable Analog Circuit Block," Monte Mar, filed Aug. 29, 2001; 46 pages.

U.S. Appl. No. 09/964,991, "A Novel Band-Gap Circuit for Providing an Accurate Reference Voltage Compensated for Process State, Process Variations and Temperature," Kutz et al., filed Sep. 26, 2001; 26 pages.

U.S. Appl. No. 09/989,775, "User defined names for registers in memory banks derived from configurations," Ogami et al., filed Nov. 19, 2001; 29 pages.

U.S. Appl. No. 10/002,726, "Method and Apparatus for Generating Microcontroller Configuration Information," Ogami et al., filed Oct. 24, 2001; 54 pages.

U.S. Appl. No. 10/024,093, "Configurable Memory for Programmable Logic Circuits" Lacey et al., filed Dec. 18, 2001; 25 pages.

U.S. Appl. No. 10/137,497, "Reconfigurable Testing System and Method" Pleis et al.; filed May 1, 2002; 40 pages.

U.S. Appl. No. 10/172,670, "Method and System for Programming a Memory Device," Snyder et al.; filed Jun. 13, 2002; 66 pages.

U.S. Appl. No. 10/238,966, "Method for Parameterizing a User Module," Perrin et al., filed Sep. 9, 2002; 41 pages.

U.S. Appl. No. 10/653,050, "Method and System for Programming a Memory Device," Snyder et al.; filed Aug. 29, 2003; 69 pages.

U.S. Appl. No. 11/088,028, "Method and Circuit for Rapid Alignment of Signals;" Moyal et al., filed Nov. 13, 2007; 34 pages.

U.S. Appl. No. 11/166,622, "Touch Wake for Electronic Devices" Beard et al., filed Jun. 23, 2005; 22 pages.

U.S. Appl. No. 11/200,619, "Providing hardware independence to automate code generation of processing device firmware," Snyder et al.; filed Aug. 10, 2005; 41 pages.

U.S. Appl. No. 11/201,627, "Method and an apparatus to design a processing system using a graphical user interface,"Ogami et al.; filed Aug. 10, 2005; 37 pages.

U.S. Appl. No. 11/816,005, "Techniques for Generating Microcontroller Configuration Information," Ogami et al., filed Jun. 12, 2007; 61 pages.

U.S. Appl. No. 11/965,291, "Universal Digital Block Interconnection and Channel Routing," Snyder et al., filed Dec. 27, 2007; 31 pages.

U.S. Appl. No. 11/968,145, "Dynamically Configurable and Re-Configurable Data Path," Warren Synder et al., Filed Dec. 31, 2007; 36 pages.

U.S. Appl. No. 11/985,340 "Method and Circuit for Rapid Alignment of Signals," Moyal et al., filed Nov. 13, 2007; 34 pages.

U.S. Appl. No. 11/986,338, Reconfigurable Testing System and Method, Pleis et al., filed Nov. 11, 2007; 41 pages.

U.S. Appl. No. 12/358,488, "System and Method for Dynamically Generating a Configuration Datasheet" Anderson et al.; filed Jan. 20, 2009; 27 pages.

U.S. Appl. No. 13/099,334, "Universal Digital Block Interconnection and Channel Routing," Warren Snyder et al., filed May 2, 2011; 32 pages.

Ashok Bindra, "Programmable SoC Delivers a New Level of System Flexibility"; Electronic Design; Nov. 6, 2000; 11 pages.

Atmel Corporation: AT9OSC Summary: "Secure Microcontrollers to Smart Cards," Oct. 1999; 7 pages.

Azim et al, "A Custom DSP Chip to Implement a Robot Motion Controller Proceedings of the IEEE Custom Integrated Circuits Conference,"May 1988, pp. 8.4.1-8.7.5; 6 pages.

Bakker et al., "Micropower CMOS Temperature Sensor with Digital Output," IEEE Journal of Solid-State Ciruits, Jul. 1996; 3 pages.

Bauer et al.; "A Reconfigurable Logic Machine for East Event-Driven Simulation"; Jun. 1998; Design Automation Conference Proceedings; 8 pages.

Burogs et al. "Power Converter Analysis and Design using Matlab: A Transfer Function Approach," Proceedings of IEEE International Symposium on Industrial Electronics 1998: vol. 2, pp. 552-557; 6 pages.

Bursky, "FPGA Combines Multiple Interfaces and Logic," Electronic Design, Vol. 48 No. 20, Oct. 2, 2000, pp. 74-78; 5 pages.

Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.

Chapweske, Adam; "The PS/2 Mouse Interface," PS/2 Mouse Interfacing, 2001, retrieved on May 18, 2006; 11 pages.

Charles Melear, "Using Background Modes for Testing, Debugging and Emulation of Microcontrollers," IEEE, 1997, pp. 90-97; 8 pages.

Charles, Jr. et al., "Wirebonding: Reinventing the Process for MCMs," Apr. 1998, IEEE 7th International Conference on Multichip Modules and High Density Packaging, pp. 300-302; 3 pages.

Ching et al., "An In-Curcuit-Emulator for TMS320C25," IEEE, 1994, pp. 51-56; 6 pages.

Cover Pages Technology Reports; XML and Electronic Design Automation (EDA); Aug. 2000; retrieved from http://xml.coverpages.org on Mar. 23, 2005; 5 pages.

Cypress MicroSystem, Inc. "Cypress Customer Forums" retrieved from <http://www.cypress.com/forums/messageview>; Nov. 30, 2004; 1 page.

Cypress MicroSystem, Inc. "PsoC Designer: Integrated Development Environment User Guide"; Rev. 1.18; Sep. 8, 2003; 193 pages.

Cypress MicroSystems, Inc. "Cypress MicroSystems Unveils Programmable System-On-A-Chip For Embedded Internet, Communications, and Consumer Systems" Nov. 13, 2000; 3 pages.

Cypress Semiconductor Corporation, "CY8C21x34 Data Sheet," CSR User Module, CSR V.1.0; Oct. 6, 2005; 36 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Cypress Semiconductor Corporation, "FAN Controller CG6457AM and CG6462AM," PSoC Mixed Signal Array Preliminary Data Sheet; May 24, 2005; 25 pages.

Cypress Semiconductor Corporation, "PSoC CY8C20x34 Technical Reference Manual (TRM)," PSoC CY8C20x34 TRM, Version 1.0, 2006; 218 pages.

Cypress Semiconductor Corporation, "PSoC Mixed-Signal Controllers," Production Description; <http://www.cypress.com/portal/server>; retrieved on Sep. 27, 2005; 2 pages.

Cypress Semiconductor Corporation, "Release Notes sm017," Jan. 24, 2007; 3 pages.
Dahl et al., "Emulation of the Sparcle Microprocessor with the MIT Virtual Wires Emulation System," 1994, IEEE, pp. 14-22; 9 pages.
Daniel B. Sedory, "A Guide to DEBUG," 2004, retrieved on May 20, 2005 from http://www.geocites.com/thestarman3/asm/debug/debug2.htm, pp. 1-11; 7 pages.
Durham et al., "Circuit Architectures for High Linearity Monolithic Continuous-Time Filtering," IEEE, 1992; 7 pages.
Durham et al., "High-Linearity Conitnuous-Time Filter in 5-V VLSI CMOS," IEEE, 1992; 8 pages.
Durham et al., "Integrated Continuous-Time Balanced Filters for 16-bit DSP Interfaces," IEEE, 1993; 6 pages.
Duvvuru et al., "Evaluation of a Branch Target Address Cache," 1995, IEEE, pp. 173-180; 8 pages.
Ebeling et al., "Validating VLSI Circuit Layout by Wirelist Comparison," Sep. 1983, In the Proceedings of the IEEE International Conference on Computer Aided Design (ICCAD-83), pp. 172-173; 2 pages.
Ebling, "Gemini II: A Second Generation Layout Validation Program;" 1988; in proceedings of the IEEE International Conference on Computer Aided Design (ICCAD-88); 4 pages.
Efstathiou, "Analog Electronics: Basic Circuits of Operational Amplifiers," <http://web.archive.org/web/20021231045232> Dec. 31, 2002, version, retrieved from the Internet Archives; 10 pages.
Electronic Tools Company; E-Studio User Manuel; 2000; retrieved from http://web.archive.org for site http://e-tools.com on Mar. 23, 2005; 77 pages.
Frank Goodenough, "Analog Counterparts of FPGAS Ease System Design," Electronic Design, Penton Publishing, Cleveland, OH, Oct. 14, 1994, vol. 42, No. 21, pp. 63-66, 68; 10 pages.
Ganapathy et al., "Hardware Emulation for Functional Verification of K5", Jun. 1996, 33rd Design Automation Conference Proceedings, Jun. 3-7, 1996, pp. 315-318; 4 pages.
Ghosh et al., "A Low Overhead Design for Testability and Test Generation Technique for Core-based Systems," IEEE, 1997; 10 pages.
Haberl et al., "Self Testable Boards with Standard IEEE 1149.5 Module Test and Maintenance (MTM) Bus Interface," IEEE, 1994; 6 pages.
Hamblen, "Rapid Prototyping Using Field-Programmable Logic Devices" Jun. 2000, IEEE; 9 pages.
Harbaum et al. "Design of a Flexible Coprocessor Unit" Proceedings of the Euromicro Conference, XX XX, Sep. 1999, pp. 335-342; 10 pages.
Harrison et al.; "Xilinx FPGA Design in a Group Environment Using VHDS and Synthesis Tools"; Colloquium on Digital System Design Using Synthesis Techniques; Feb. 15, 1996; 4 pages.
Hintz et al., "Microcontrollers," 1992, McGraw-Hill, pp. 29-37; 11 pages.
Hong et al., "An FPGA-Based Hardware Emulator for Fast Fault Emulation," IEEE, 1997, pp. 345-348; 4 pages.
Hong et al., "Hierarchial System Test by an IEEE 1149.5 MTM-Bus Slave-Module Interface Core," IEEE, 2000; 14 pages.
Hsieh et al., "Modeling Micro-Controller Peripherals for High-Level Co-Simulation and Synthesis," IEEE, 1997, pp. 127-130; 4 pages.
Huang et al., "Iceberg: An Embedded In-Circuit Emulator Synthesizer for Microcontrollers", Proceedings of the 36th Design Automation Conference, Jun. 1999, pp. 580-585; 6 pages.
Hwang et al., "Integrated circuit for automatically varying resistance in computer system, has pair of transistors connected in parallel with respective resistors such that resistors are bypassed when corresponding transistors are enabled," Derwent information LTD; 2002; 2 pages.
International Search Report and Written Opinion of the International Searching Authority for PCT/US05/28898, filed Aug. 12, 2005, mailed Mar. 6, 2007; 6 pages.
International Search Report for International Application No. PCT/US2006109572 dated Jan. 10, 2008; 2 pages.
International Search Report for International Application No. PCT/US05/28793 mailed Dec. 6, 2007; 8 pages.
International Search Report for International Application No. PCT/US08/60685 dated Sep. 17, 2008; 5 pages.
International Search Report for International Application No. PCT/US08/60696 dated Sep. 22, 2008; 5 pages.
International Search Report of the International Searching Authority for International Application No. PCT/US08/60681 dated Sep. 12, 2008; 2 pages.
International Search Report of the International Searching Authority for International Application No. PCT/US08/60695 dated Jul. 22, 2009; 3 pages.
International Search Report of the International Searching Authority for International Application No. PCT/ US08/60698 dated Sep. 5, 2008; 2 pages.
International Written Opinion for International Application No. PCT/US08/60685 dated Sep. 17, 2008; 4 pages.
International Written Opinion for International Application No. PCT/US08/60696 dated Sep. 22, 2008; 4 pages.
International Written Opinion of the International Searching Authority for International Application No. PCT/US2006/09572 dated Jan. 10, 2008; 7 pages.

* cited by examiner

CLOCK DRIVEN DYNAMIC DATAPATH CHAINING

RELATED APPLICATIONS

The present application claims priority to U.S. Provisional Application No. 60/912,399, filed Apr. 17, 2007 and is herein incorporated by reference in its entirety.

TECHNICAL FIELD

The present disclosure relates generally to programmable devices, and more particularly to dynamically chaining Universal Digital Blocks (UDB).

BACKGROUND

Field-programmable gate arrays (FPGAs) and programmable logic devices (PLDs) have been used in data communication and telecommunication systems. Conventional PLDs and FPGAs consist of an array of programmable elements, with the elements programmed to implement a fixed function or equation. Some currently-available Complex PLD (CPLD) products comprise arrays of logic cells. Conventional PLD devices have several drawbacks, such as high power consumption and large silicon area.

In developing complex electronic systems, there is often a need for additional peripheral units, such as operational and instrument amplifiers, filters, timers, digital logic circuits, analog to digital and digital to analog converters, etc. As a general rule, implementation of these extra peripherals creates additional difficulties: extra space for new components, additional attention during production of a printed circuit board, and increased power consumption. All of these factors can significantly affect the price and development cycle of the project.

The introduction of Programmable System on Chip (PSoC) chips feature digital and analog programmable blocks, which allow the implementation of a large number of peripherals. A programmable interconnect allows analog and digital blocks to be combined to form a wide variety of functional modules. The digital blocks consist of smaller programmable blocks and are configured to provide different digital functions. The analog blocks are used for development of analog elements, such as analog filters, comparators, inverting amplifiers, as well as analog to digital and digital to analog converters. Current PSoC architectures provide only a coarse grained digital programmability in which a few fixed functions with a small number of options are available.

SUMMARY

A system includes a plurality of datapaths, each having structural arithmetic elements to perform various arithmetic operations based, at least in part, on configuration data. The system also includes a configuration memory coupled to the datapaths, the configuration memory to provide the configuration data to the datapaths, which causes the datapaths to collaborate when performing the arithmetic operations.

The system includes a first datapath that receives a chained carry-in value from a second datapath for utilization in the arithmetic operations. The first datapath includes a multiplexor to at least receive a chained carry-in value from the second datapath, the multiplexor to provide the first datapath the chained carry-in value according to the configuration data from the configuration memory.

The datapaths receive the configuration data based on a clock cycle, and the datapaths are dynamically chained to collaborate on the arithmetic operations according to configuration data and the clock cycle. The datapaths are operable to perform time-division multiplexed arithmetic operations according to the configuration data, where the datapaths are dynamically chained to collaborate on the arithmetic operations during a first clock cycle and unchained to perform independent arithmetic operations during a second clock cycle.

A method includes receiving a chained carry-in value from a datapath and configuration data from a configuration memory, selecting the chained carry-in value according to the configuration data from the configuration memory, and collaborating with the datapath in the performance of arithmetic operations by utilizing the chained carry-in selected according to the configuration data when performing arithmetic operations.

The method includes multiplexing multiple input values according to the configuration data, where at least one of the input values is the chained carry-in value received from datapath. The method includes receiving the configuration data based on a clock cycle, and dynamically chaining to the datapath for collaboration on the arithmetic operations according to configuration data and the clock cycle. The method includes dynamically chaining to the datapath for collaborate on the arithmetic operations during a first clock cycle, and dynamically unchaining to perform independent arithmetic operations during a second clock cycle.

A device includes a structural arithmetic circuit to perform various arithmetic operations based, at least in part, on dynamic configuration data. The device also includes a selection circuit to receive a chained carry-in value from a datapath, to select the chained carry-in value according to the dynamic configuration data, where the structural arithmetic circuit performs arithmetic operations by utilizing the chained carry-in selected.

The selection circuit is operable to multiplex multiple input values according to the configuration data, where at least one of the input values is the chained carry-in value received from the datapath. The selection circuit is operable to receive the configuration data based on a clock cycle, and the structural arithmetic circuit to dynamically chain to the datapath for collaboration on the arithmetic operations according to configuration data and the clock cycle.

The structural arithmetic circuit is operable to dynamically chain to the datapath for collaborate on the arithmetic operations during a first clock cycle, and then dynamically unchaining to perform independent arithmetic operations during a second clock cycle. The structural arithmetic circuit is operable to dynamically chain and unchain to the datapath on alternate clock cycles to time-division multiplex performance of arithmetic operations.

DETAILED DESCRIPTION

A new Universal Digital Block (UDB) architecture combines PLDs and a datapath module in the same digital logic block to allow for the implementation of universal embedded digital functions. The new UDB architecture includes an integrated ALU that removes limitations associated with fixed functionality and provides users with the ability to customize digital operations to match system requirements.

Figure 1:
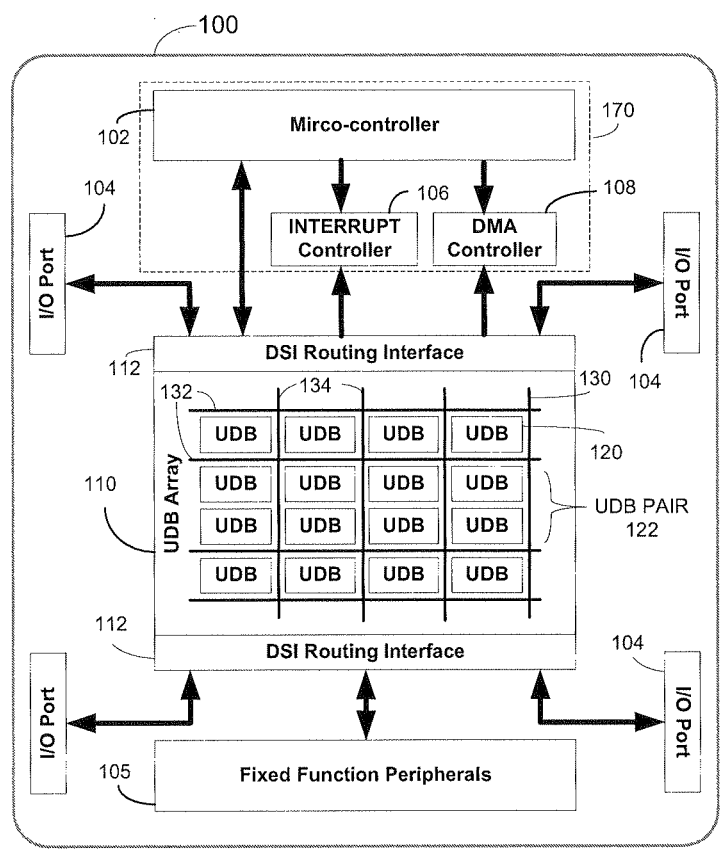
FIG. 1 is a schematic block diagram illustrating an example Programmable System on a Chip (PSoC) architecture that includes a Universal Digital Block (UDB) array.

FIG. 1 is a high level view of a Universal Digital Block (UDB) array 110 contained within a Programmable System on a Chip (PSoC) Integrated Circuit (IC) 100. The UDB array 110 includes a programmable interconnect matrix 130 that connects together different UDBs 120. The individual UDBs 120 each include a collection of uncommitted logic in the form of Programmable Logic Devices (PLDs) and structural dedicated logic elements that form a datapath 210 shown in more detail in below.

UDB Array

The UDB array 110 is arranged into UDB pairs 122 that may or may not be connected together through the interconnect matrix 130. The UDB pairs 122 each include two UDBs 120 that can be tightly coupled to a shared horizontal routing channel 132. The UDB pairs 122 can also be programmably connected to the horizontal routing channels 132 of other UDB pairs 122 either in the same horizontal row or in different rows through vertical routing channels 134. The horizontal and vertical routing channels and other switching elements are all collectively referred to as the interconnect matrix 130.

A Digital System Interconnect (DSI) routing interface 112 connects a micro-controller system 170 and other fixed function peripherals 105 to the UDB array 110. The micro-controller system 170 includes a micro-controller 102, an interrupt controller 106, and a Direct Memory Access (DMA) controller 108. The other peripherals 105 can be any digital or analog functional element that is preconfigured in PSoC 100. The DSI 112 is an extension of the interconnect matrix 130 at the top and bottom of the UDB array 110.

UDB

Figure 2:
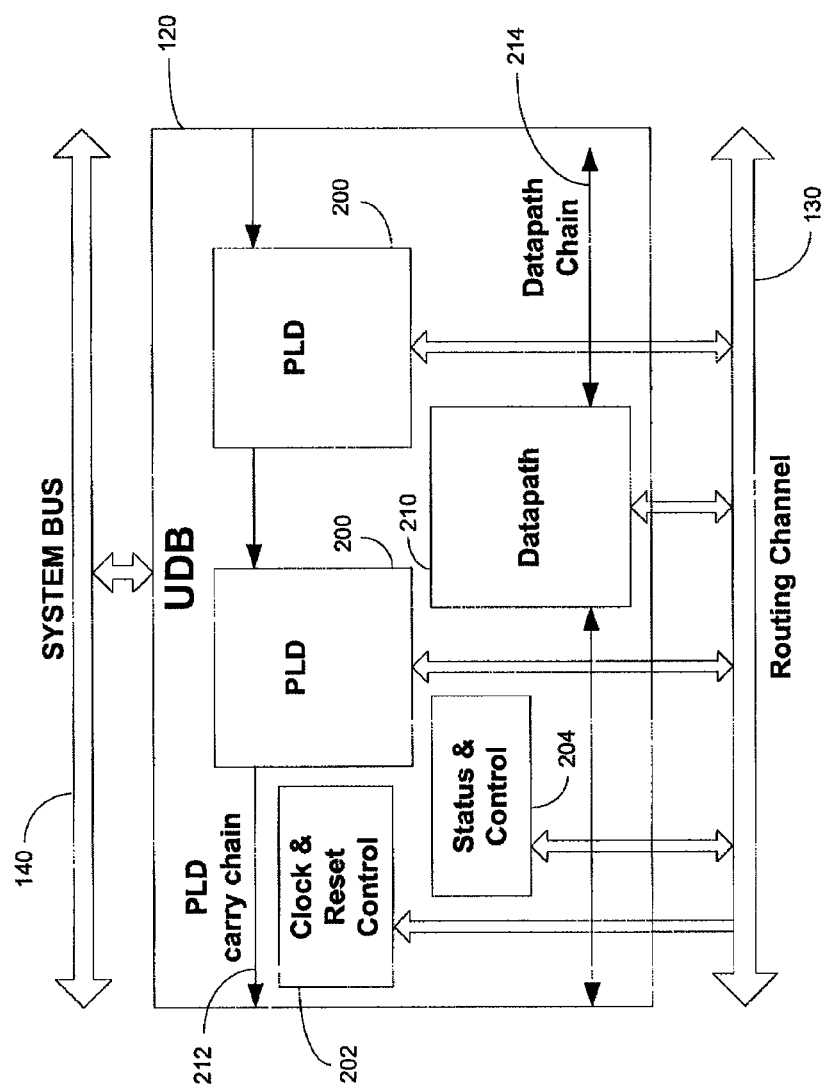
FIG. 2 is a schematic block diagram illustrating one of the UDBs in FIG. 1 that includes both uncommitted PLD blocks and a structural dedicated datapath block.

FIG. 2 is a top-level block diagram for one of the UDBs 120. The major blocks include a pair of Programmable Logic Devices (PLDs) 200. The PLDs 200 take inputs from the routing channel 130 and form registered or combinational sum-of-products logic to implement state machines, control for datapath operations, conditioning inputs and driving outputs.

The PLD blocks 200 implement state machines, perform input or output data conditioning, and create look-up tables. The PLDs 200 can also be configured to perform arithmetic functions, sequence datapath 210, and generate status. PLDs are generally known to those skilled in the art and are therefore not described in further detail.

The datapath block 210 contains highly structured dedicated logic that implements a dynamically programmable ALU, comparators, and condition generation. A status and control block 204 allows micro-controller firmware to interact and synchronize with the UDB 120 by writing to control inputs and reading status outputs.

A clock and reset control block 202 provides global clock selection, enabling, and reset selection. The clock and reset block 202 selects a clock for each of the PLD blocks 200, the datapath block 210, and status and control block 204 from available global system clocks or a bus clock. The clock and reset block 202 also supplies dynamic and firmware resets to the UDBs 120.

Routing channel 130 connects to UDB I/O through a programmable switch matrix and provides connections between the different elements of the UDBs in FIG. 2. A system bus interface 140 maps all registers and RAMs in the UDBs 120 into a system address space and are accessible by the micro-controller 102 shown in FIG. 1.

The PLDs 200 and the datapath 210 have chaining signals 212 and 214, respectively, that enable neighboring UDBs 120 to be linked to create higher precision functions. The PLD carry chain signals 212 are routed from the previous adjacent UDB 120 in the chain, and routed through each macrocell in both of the PLDs 200. The carry out is then routed to the next UDB 120 in the chain. A similar connectivity is provided for the set of conditional signals generated by the datapath chain 214 between datapath blocks 210 in adjacent UDBs 120. Embodiments of clock driven chaining of multiple datapaths 210 will be described below in greater detail corresponding to FIG. 5-FIG. 8.

Figure 3:
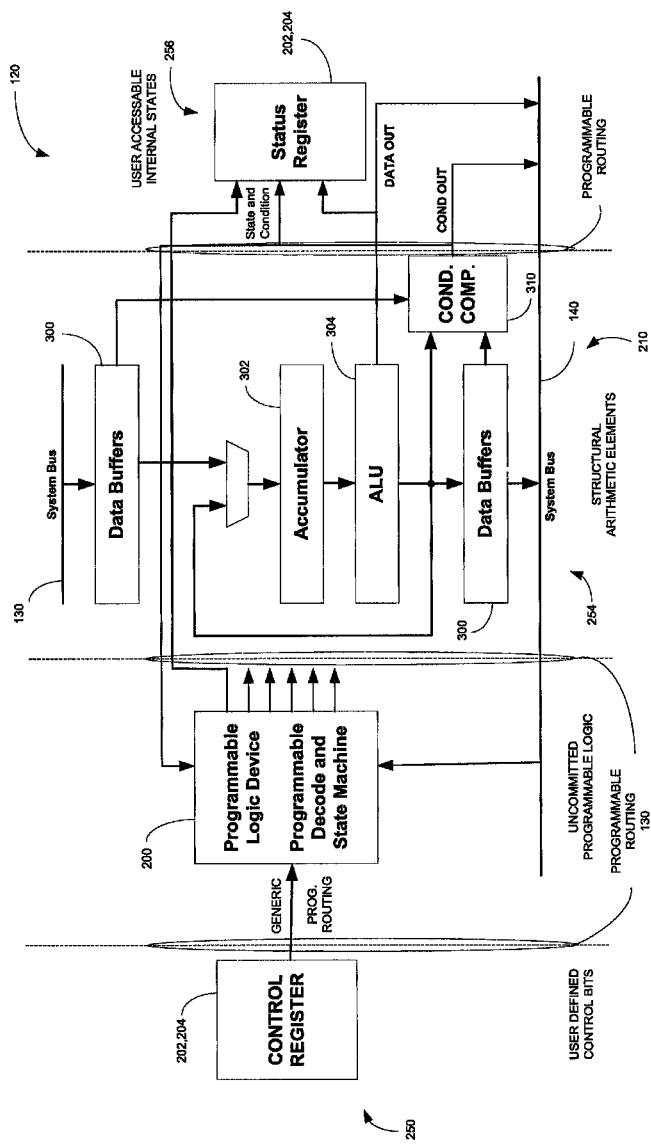
FIG. 3 is a schematic block diagram illustrating the UDB in FIG. 2 in more detail.

Referring to FIG. 3, each UDB 120 comprises a combination of user defined control bits that are loaded by the micro-controller 102 into control register 250. The control register 250 is part of the control blocks 202 and 204 described above in FIG. 2. The control register 250 feeds uncommitted programmable logic 200 and control for datapath inputs. The same control blocks 202 and 204 described above in FIG. 2 also include associated status registers 256 that allow the micro-controller 102 to selectably read different internal states for both the uncommitted logic elements and structural arithmetic elements 254 within the datapath 210.

The datapath 210 comprises highly structured logic elements 254 that include a dynamically programmable ALU 304, conditional comparators 310, accumulators 302, and data buffers 300. The ALU 304 is configured to perform instructions on accumulators 302, and to perform arithmetic sequences as controlled by a sequence memory. The conditional comparators 310 can operate in parallel with the ALU 304. The datapath 210 is further optimized to implement typical embedded functions, such as timers, counters, pseudo random sequence generators, Cyclic Redundancy Checkers (CRC), Pulse Width Modulators (PWM), etc.

The combination of uncommitted PLDs 200 with a dedicated datapath module 210 allows the UDBs 120 to provide embedded digital functions with more silicon efficient processing. The dedicated committed structural arithmetic elements 254 more efficiently implement arithmetic sequencer operations, as well as other datapath functions. Since the datapath 210 is structural, fewer gates are needed to implement these structural elements 254 and fewer interconnections are needed to connect the structural elements 254 together into an arithmetic sequencer. Implementing the same datapath 210 with PLDs could require a much greater quantity of additional combinational logic and additional interconnections.

The structured logic in the datapath 210 is also highly programmable to provide a wide variety of different dynamically selectable arithmetic functions. Thus, the datapath 210 not only conserves space on the integrated circuit 100 (FIG. 1)

but also is highly configurable similar to PLDs. It has an additional advantage of being dynamically configurable and reconfigurable.

The functionality of the datapath 210 may be controlled through writes to the control registers 250 allowing the micro-controller 102 to arbitrarily set the system state and selectively control different arithmetic functions. The status registers 256 allow the micro-controller 102 to also identify different states associated with different configured arithmetic operations. The flexible connectivity scheme provided by the routing channel 130 selectively interconnects the different functional element 250, 200, 254, and 256 together as well as programmably connecting these functional elements to other UDBs, I/O connections, and peripherals.

Thus, the combination of uncommitted logic 252, structural logic 254, and programmable routing channel 130 provide as much functionality and uses less integrated circuit space, while at the same time providing the potential for increased performance and substantially the same functional configurability.

Datapath

Figure 4:
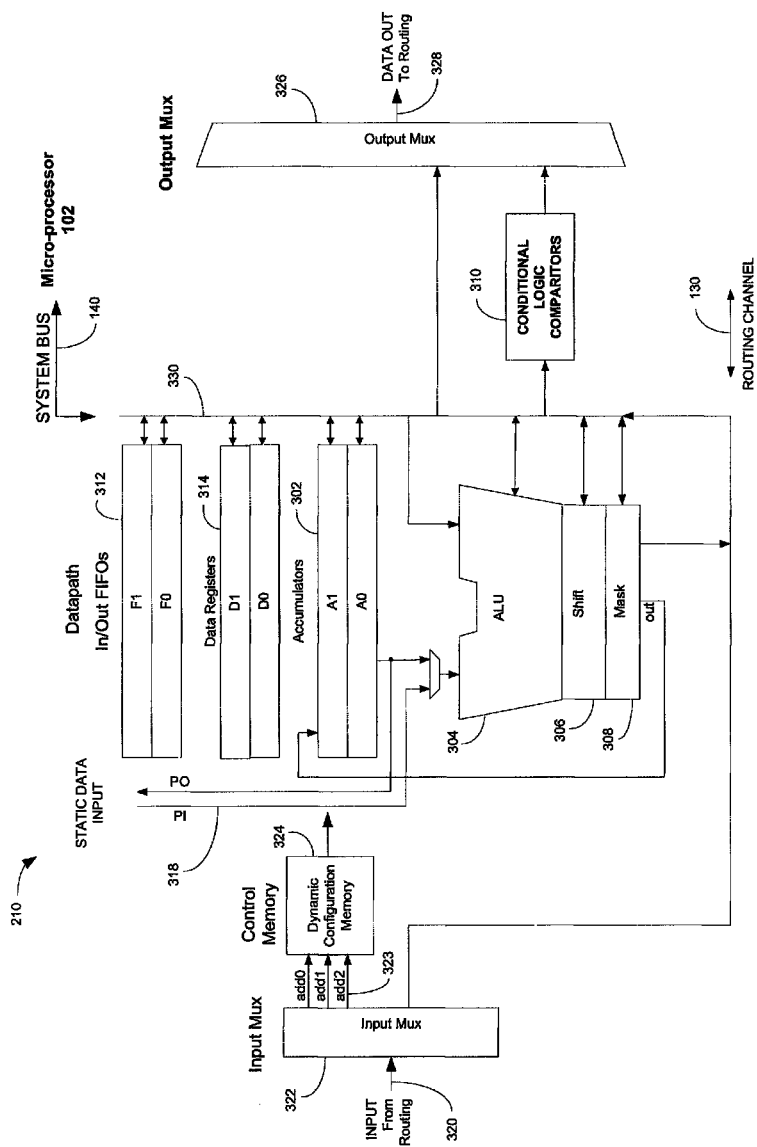
FIG. 4 is a schematic block diagram also showing a datapath block in FIG. 2 in more detail.

FIG. 4 shows one embodiment of the datapath 210 in more detail. The datapath 210 contains a single cycle ALU 304 and associated conditional logic comparators 310. The datapath 210 can be chained with neighboring datapaths to achieve single cycle functionality with additional bit widths. A RAM based control store 324 dynamically selects the operation and configuration performed in any given cycle.

The datapath 210 is optimized to implement typical embedded functions, such as timers, counters, Pulse Width Modulators (PVs), Pseudo Random Sequence (PRS) generators, Cyclic Redundancy Checks (CRC), shifters, dead band generators, etc. The addition of the add and subtract functions in ALU 304 also allow support for digital delta-sigma operations.

Internal connections 330 can be externally connected to either the system bus 140 and/or the routing channel 130. Different combinations of connections 330 are interconnected between different datapath components according to their related functions. Connections 330 are shown as a single bus in FIG. 4 for illustrative purposes only and there may or may not be certain connections that are shared by multiple different datapath components.

Dynamic configuration is the ability to change the datapath function and interconnect configuration on a cycle-by-cycle basis. This is implemented using the information in configuration RAM 324. The address 323 input to RAM 324 can be routed from any functional element connected to the routing channel 130, and most typically include the PLDs 200 (FIG. 2), I/O pins 104 (FIG. 1), micro-controller 102 (FIG. 6), or PLDs or datapaths from other UDBs 120.

The ALU 304 can perform different general-purpose functions such as increment, decrement, add, subtract, logical AND, OR, XOR, or PASS. In addition to these functions, hardware structures and connections are provided to implement a single cycle CRC operation. In addition to the ALU 304, an independent shifter 306 provides left, right, nibble swap operations. Another independent masking function 308 masks selectable bits output from the ALU 304.

Each datapath 210 includes conditional logic comparators 310 which can be configured to receive a variety of different datapath register inputs. The comparators 310 check for conditions such as zero detect, all one's detect, and overflow. These conditions produce datapath outputs that are selectively routed back through the same datapath 210 or routed through output multiplexer 326 and the routing channel 130 to other UDBs or peripheral components.

Each datapath 210 contains multiple FIFOs 312 that can be individually configured to operate as input buffers or output buffers. When operating as input buffers, the system bus 140 can write to the FIFOs 312 and datapath internal logic elements can read from the FIFOs 312. When operating as output buffers, datapath internal logic elements write to the FIFO 312 and the system bus 140 reads from the FIFO 312. The FIFOs 312 generate status that can be routed to interact with sequencers, interrupt, or DMA requests.

As described above in FIG. 2, the datapath 210 can be configured to chain conditions and signals with neighboring datapaths. The shift, carry, capture, and other conditional signals can also be chained to form higher precision arithmetic, shift, and CRC/PRS functions. For example, 16-bit functions in an 8-bit datapath can be provided by interconnecting two datapaths together, or CRC generation can be implemented between two datapaths 210 using data shifting.

In applications that are oversampled, or don't need the highest clock rates, the ALU block 304 can be efficiently shared with two sets of registers and condition generators. Selected outputs from the ALU 304 and shifter 306 are registered and can be used as inputs in subsequent cycles.

The datapath 210 receives configuration inputs, control inputs, and data inputs. At least some configuration data can be received over input 320 and used for selecting the current address 323 for configuration RAM 324. Input 320 can come from either to the system bus 140 and/or to the routing channel 130. Control inputs can come over the system bus 140 or the routing channel 130 and are used to load the data registers 314 and capture outputs from accumulators 302. Data inputs can also come from the system bus 140 and/or the routing channel 130 and can include shift in and carry in signals received over input multiplexer 322. Other data inputs include parallel data input and output ports 318 that can be programmably connected through the routing channel 130 to the ALU 304.

There are multiple conditional, data, and status signals that can be selectively output via output multiplexer 326. For maximum routing flexibility, any of the status or data output signals connected to output mux 326 can be programmably connected to the routing channel 130.

The datapath 210 has multiple working registers. These registers are readable and writable by the micro-controller 102 and DMA 108 in FIG. 1. The accumulators 302 can be a source for the ALU 304 and a destination of the ALU output. The accumulators 302 can also be loaded from an associated data register 314 or FIFO 312. The accumulators 302 contain the current value of the ALU function, for example, the count, CRC or shift.

Clock Driven Datapath Chaining

Figure 5:
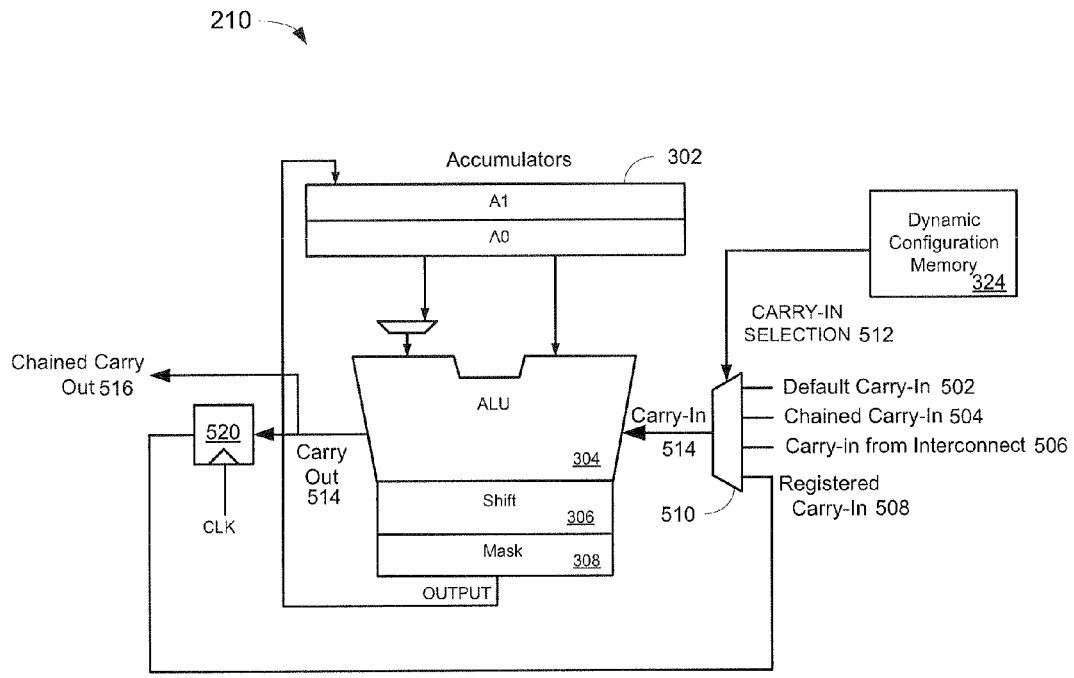
FIG. 5 is a schematic block diagram illustrating example embodiments of the datapath block with chaining.

FIG. 5 is a schematic block diagram illustrating example embodiments of the datapath block 210 chaining. Referring to FIG. 5, the datapath 210 includes a carry-in selection circuit or multiplexor 510 to determine a carry-in value 514 to provide to the ALU 304. In some embodiments, the carry-in selection circuit 510 can select between a default carry-in value 502, a chained carry-in value 504, a carry-in value 506 routed from an interconnect 130, or a registered carry-in 508.

The chained carry-in 504 can be from a neighboring datapath 210. By selecting the chained carry-in value 504, the datapath is dynamically linked or chained to the neighboring datapath 210, for example, to perform higher precision functions or processing tasks, such as arithmetic, shift, and CRC/PRS functions. For example, 16-bit functions can be provided by interconnecting two 8-bit datapaths together, or 16-bit CRC generation can be implemented between two 8-bit datapaths 210 using data shifting.

The carry-in selection circuit 510 can determine which carry-in value 502-508 to supply to the ALU 304 as the carry-in value 514 responsive to a carry-in selection 512 from the dynamic configuration memory 324. The dynamic configuration memory 324 can provide the carry-in selection 512 to the carry-in selection circuit 510 dynamically in a given clock cycle. Thus, the carry-in selection 512 and the chaining of the datapath 210 to one or more neighboring datapaths is clock driven and can be dynamically performed.

The ALU 304 provides a carry-out 514 to a buffer or register 520 to store the carry-out for possible future processing. The carry-out 514 can be provided to a neighboring datapath as a chained carry-out 516 for use by the neighboring datapath as a chained carry-in value. The register 520 can provide the buffered carry-out to the carry-in selection circuit 510 as the registered carry-in value 508. In some embodiments, the register 520 can provide the buffered carry-out to the carry-in selection circuit 510 responsive to a clock signal, which can have the same or different cycle as the clock driving the carry-in selection 512. This allows the 8-bit datapath to compute the first 8-bits of a function in a given clock cycle with a default carry input, and then compute the next 8-bit of a function is the following clock cycle with the registered carry. This allows at 16-bit function to be computed in a single 8-bit datapath.

Another selection of the multiplexer allows the input of carry in values from routing array. This setting can be dynamically selected when the function calls for a special user generated, or computed carry in.

Dynamic clock driven datapath chaining grants system designers the flexibility to selectively chain any number of datapaths to perform higher resolution functions without having to incorporate larger arithmetic circuits, such as statically chained datapaths, into their designs. As described above, in applications that are oversampled, or don't need the highest clock rates, the ALU block 304 can be efficiently shared with two sets of registers and condition generators. This can enable a time-division multiplexing of the clock signal by the datapath 210 and an interleaving of the chained functions with various other functions on successive clock cycles. In other words, the datapath 210 can share ALU 304 operations on alternate clock cycles with varying precision. An example implementation of this time-division multiplexing will be described below corresponding to FIG. 7 in greater detail.

Figure 6:
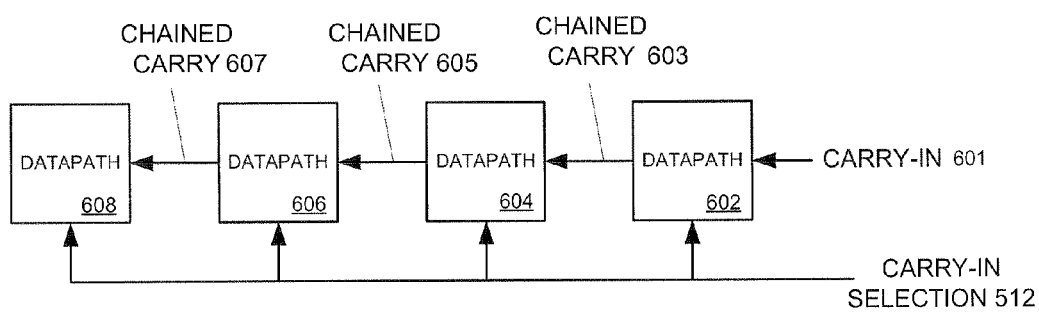
FIG. 6 is a block diagram illustrating example embodiments of datapath chaining with the datapath block shown in FIG. 5.

FIG. 6 is a block diagram illustrating example embodiments of datapath chaining with the datapath block 210 shown in FIG. 5. Referring to FIG. 6, multiple datapaths 602-608 are chained together to perform higher precision functions or processing tasks, such as arithmetic, shift, and CRC/PRS functions. In some embodiments, each datapath 602-608 can process 8-bits of data, and thus the chaining of four datapaths 602-608 together allows for up to 32-bit processing capability. Although FIG. 6 shows four datapaths 602-608 chained together, any number of datapaths can be reconfigurably and dynamically chained together depending on the specific processing requirement.

A datapath 602 can receive a carry-in 601, which can be selected according to the carry-in chain 512. This carry-in 601 can be from any source, and can be a default carry-in 502, chained carry-in 504, interconnect carry-in 506, or a registered carry-in 508. The other datapaths 604-608 receive a chained carry 603-607 from a neighboring datapath 602-606, and select the chained carry 603-607 according to the carry-in selection 512. For instance, datapath 604 can receive chained carry 603 from datapath 602. The chained carry 603 can be a carry-out of datapath 602 and a carry-in of datapath 604 when selected according to the carry-in selection 512. Datapath 604 provides a carry-out to datapath 606 as a chained carry 605, where the datapath 606 can utilize the chained carry 605 as a carry-in according to the carry-in selection 512.

In some embodiments, a datapath 210 can chain to any other datapath 210 present in the system, i.e., the arrangement of a datapath chain can be programmable. In other embodiments, the datapaths 210 have a pre-specified chaining order by chaining with other adjacent datapaths 210. For instance, in some embodiments, a datapath 210 can provide its carry-out 514 to specified datapath(s) capable of chaining with the datapath 210, and receive a chained carry-in from one or more specified datapaths.

Figure 7:
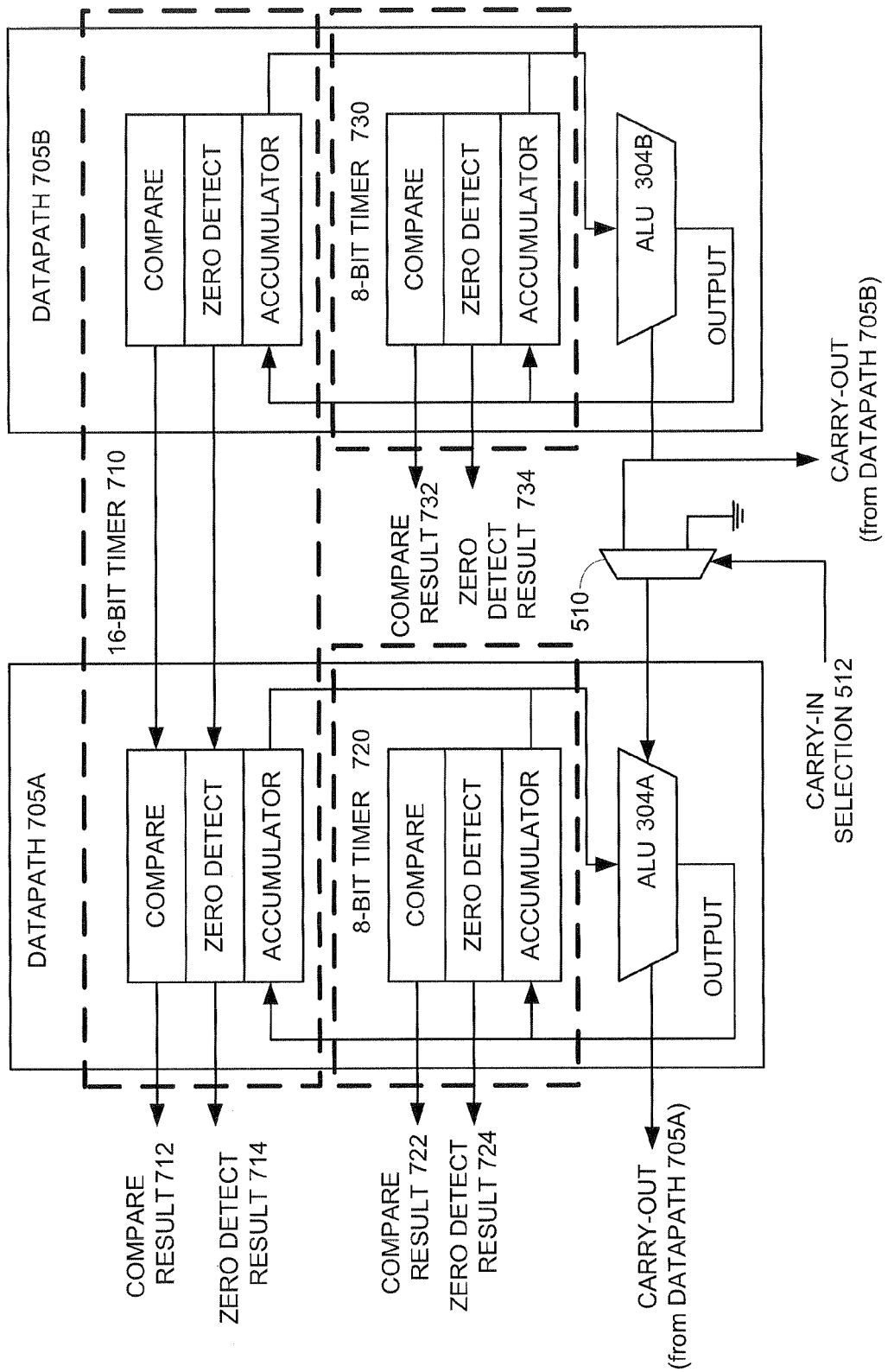
FIG. 7 is a schematic block diagram showing a multiple timer implementation utilizing datapath block chaining shown in FIG. 5-FIG. 6.

FIG. 7 is a schematic block diagram showing a multiple timer implementation utilizing datapath block chaining shown in FIG. 5-FIG. 6. Referring to FIG. 7, a pair of 8-bit datapaths 705A and 705B are chained together to implement a 16-bit timer 710. A carry-in selection circuit 510 receives a carry-out from the datapath 705B and provides it to the datapath 705A as a carry-in when implementing the 16-bit timer 710. The carry-in selection circuit 510 can provide the chained carry-in to the datapath 705A according to a carry-in selection 512. The 16-bit timer 710 outputs a compare result 712 and a zero detect result 714 from datapath 705A to indicate a state of the 16-bit timer 710.

The carry-in selection 512 is clock driven, enabling the carry-in selection circuit 510 to provide the chained carry-in to the datapath 705A according to the cycle of the clock. In some embodiments, the datapaths 705A and 705B can be time-division multiplexed, interleaving additional functions between the clock cycles implementing the chained 16-bit timer 710. For instance, both datapaths 705A and 705B can implement 8-bit timers 720 and 730, respectively, in between operational functions for the 16-bit timer 710. The datapath 705A implementing the 8-bit timer 720 outputs a compare result 722 and a zero detect result 724 to indicate a state of the 8-bit timer 720. The datapath 705B implementing the 8-bit timer 730 outputs a compare result 732 and a zero detect result 734 to indicate a state of the 8-bit timer 730. The dynamic clock driven chaining allows datapaths 705A and 705B to be chained according to the carry-in selection 512 in one clock cycle, and then in the next clock cycle operate unchained according to the carry-in selection 512.

Figure 8:
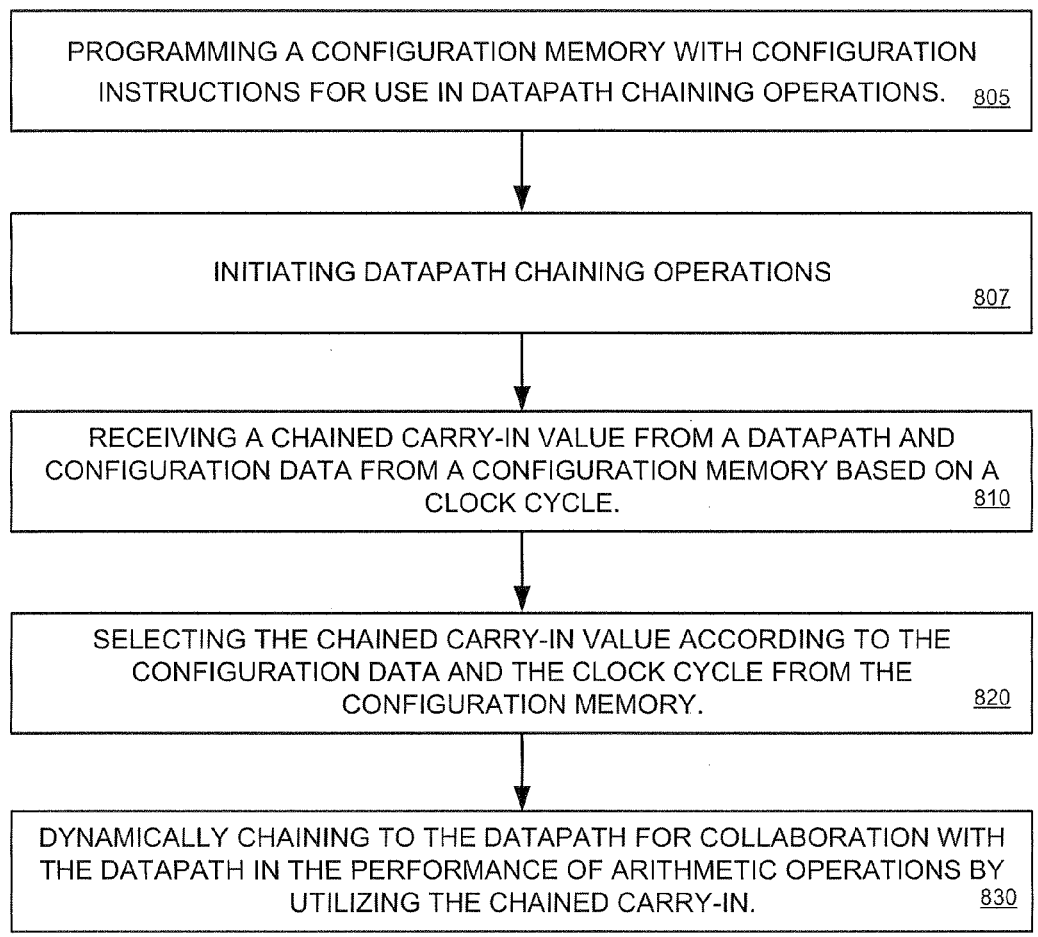
FIG. 8 is a flow diagram showing how a micro-controller or other Central Processing Unit (CPU) programs the UDBs.

FIG. 8 is a flow diagram showing how a micro-controller or other Central Processing Unit (CPU) programs the UDBs and how subsequent datapath processing operates. Referring to FIG. 8, the flow diagram begins at a block 805 where a microcontroller programs the configuration memory. Some of the configuration is static and some is dynamic which, when processing starts, is based on the datapath inputs in a given clock cycle. This configuration includes instructions provided to the multiplexor regarding the selection for dynamic carry in chaining.

In a block 807, the microcontroller initiates datapath chain in operations. In some embodiments, the microprocessor enables a configured function, or the function automatically starts in response to a global enable signal. Once enabled, block 810 receives a chained carry-in value from a datapath and configuration data from a configuration memory based on a clock cycle. In some embodiments, the chained carry-in value can be a carry-out from the datapath.

The flow diagram continues to block 820 and selects the chained carry-in value according to the configuration data and the clock cycle from the configuration memory. In some embodiments, a multiplexor selects the chained carry-in value according to the configuration data from the configuration memory. The multiplexor can also receive multiple other input values to select from, including a default carry-in value, a interconnect carry-in value, or a registered carry-in value.

The flow diagram continues to block 830 and dynamically chains to the datapath for collaboration with the datapath in the performance of arithmetic operations by utilizing the chained carry-in value. In some embodiments, the dynamic datapath chaining can allow multiple datapaths to collaborate to perform high precision functions. For instance, when each datapath can perform 8-bit arithmetic operations, chaining three datapaths together allows for performance of operations up to 24-bits. Furthermore, since the chaining (and unchaining) is performed relative to a clock, or is clock driven, datapaths can be dynamically reconfigured to perform chained and unchained operations on a clock cycle-by-cycle basis. Thus, the above described configuration can utilize time-division multiplexing for increased processing utilization and power.

The system described above can use dedicated processor systems, micro controllers, programmable logic devices, or microprocessors that perform some or all of the operations. Some of the operations described above can be implemented in software and other operations can be implemented in hardware.

For the sake of convenience, the operations are described as various interconnected functional blocks or distinct software modules. This is not necessary, however, and there can be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

Having described and illustrated the principles of the invention in a preferred embodiment thereof, it should be apparent that the invention can be modified in arrangement and detail without departing from such principles. Claim is made to all modifications and variation coming within the spirit and scope of the following claims.

The invention claimed is:

1. An apparatus, comprising:
    a plurality of datapaths, each having structural arithmetic elements to perform various arithmetic operations based, at least in part, on configuration data; and
    a configuration memory coupled to the datapaths, the configuration memory to provide the configuration data to the datapaths, which causes the datapaths to collaborate when performing the arithmetic operations, where the datapaths receive the configuration data based on a clock cycle, and the datapaths are dynamically chained to collaborate on the arithmetic operations according to configuration data and the clock cycle.

2. The apparatus according to claim 1, where a first datapath receives a chained carry-in value from a second datapath for utilization in the arithmetic operations.

3. The apparatus according to claim 2, where the first datapath includes a multiplexor to at least receive a chained carry-in value from the second datapath, the multiplexor to provide the first datapath the chained carry-in value according to the configuration data from the configuration memory.

4. The apparatus according to claim 3, where the multiplexor is operable to receive the chained carry-in value and one or more of a default carry-in value, a registered carry-in value, a carry-in value received from an interconnect routing.

5. The apparatus according to claim 2, where the chained carry-in value received by the first datapath is a carry-out value of the second datapath.

6. The apparatus according to claim 1, where the datapaths are operable to perform time-division multiplexed arithmetic operations according to the configuration data, where the datapaths are dynamically chained to collaborate on the arithmetic operations during a first clock cycle and unchained to perform independent arithmetic operations during a second clock cycle.

7. A method comprising:
    receiving a chained carry-in value from a datapath and receiving configuration data from a configuration memory based on a clock cycle;
    selecting the chained carry-in value according to the configuration data from the configuration memory; and
    dynamically chaining to the datapath according to the configuration data and the clock cycle to collaborate with the datapath in the performance of arithmetic operations by utilizing the chained carry-in selected according to the configuration data when performing arithmetic operations.

8. The method according to claim 7, includes multiplexing multiple input values according to the configuration data, where at least one of the input values is the chained carry-in value received from the datapath.

9. The method according to claim 8, where the input values include one or more of a default carry-in value, a registered carry-in value, a carry-in value received from an interconnect routing.

10. The method according to claim 7, where the chained carry-in value is a carry-out value of the datapath.

11. The method according to claim 7, includes:
    dynamically chaining to the datapath for collaborate on the arithmetic operations during a first clock cycle; and
    dynamically unchaining to perform independent arithmetic operations during a second clock cycle.

12. A device comprising:
    a structural arithmetic circuit to perform various arithmetic operations based, at least in part, on configuration data; and
    a selection circuit to receive a chained carry-in value from a datapath, and select the chained carry-in value according to the configuration data, where the structural arithmetic circuit to perform arithmetic operations by utilizing the chained carry-in selected, where the selection circuit is operable to receive the configuration data based on a clock cycle, and the structural arithmetic circuit to dynamically chain to the datapath for collaboration on the arithmetic operations according to configuration data and the clock cycle.

13. The device according to claim 12, where the selection circuit is operable to multiplex multiple input values according to the configuration data, where at least one of the input values is the chained carry-in value received from the datapath.

14. The device according to claim 13, where the input values include one or more of a default carry-in value, a registered carry-in value, a carry-in value received from an interconnect routing.

15. The device according to claim 12, where the chained carry-in value is a carry-out value of the datapath.

16. The device according to claim 12, where the structural arithmetic circuit is operable to dynamically chain to the datapath for collaborate on the arithmetic operations during a first clock cycle, and then dynamically unchaining to perform independent arithmetic operations during a second clock cycle.

17. The device according to claim 12, where the structural arithmetic circuit is operable to dynamically chain and unchain to the datapath on alternate clock cycles to time-division multiplex performance of arithmetic operations.

* * * * *